(12) United States Patent
Dai et al.

(10) Patent No.: US 7,695,981 B2
(45) Date of Patent: Apr. 13, 2010

(54) SEED LAYERS, CAP LAYERS, AND THIN FILMS AND METHODS OF MAKING THEREOF

(75) Inventors: Haixia Dai, Mountain View, CA (US); Khashayar Pakbaz, Hayward, CA (US); Michael Spaid, Mountain View, CA (US); Theo Nikiforov, Carlsbad, CA (US)

(73) Assignee: Siluria Technologies, Inc., San Francisco, CA (US)

( * ) Notice: Subject to any disclaimer, the term of this patent is extended or adjusted under 35 U.S.C. 154(b) by 52 days.

(21) Appl. No.: 11/433,824

(22) Filed: May 15, 2006

(65) Prior Publication Data
US 2006/0254503 A1    Nov. 16, 2006

Related U.S. Application Data

(60) Provisional application No. 60/680,491, filed on May 13, 2005, provisional application No. 60/752,019, filed on Dec. 21, 2005.

(51) Int. Cl.
*H01L 21/00* (2006.01)

(52) U.S. Cl. .................. 438/1; 257/E21.579; 257/751; 257/775; 257/762; 257/E23.116; 438/780; 438/781; 438/790; 438/658; 438/675; 438/687; 438/765; 438/770; 438/775; 438/758

(58) Field of Classification Search ........... 438/1
See application file for complete search history.

(56) References Cited

U.S. PATENT DOCUMENTS

| | | | |
|---|---|---|---|
| 5,695,810 A | 12/1997 | Dubin et al. | |
| 5,830,805 A | 11/1998 | Shacham-Diamand et al. | |
| 5,891,513 A | 4/1999 | Dubin et al. | |
| 6,017,696 A * | 1/2000 | Heller | 435/6 |
| 6,174,812 B1 * | 1/2001 | Hsiung et al. | 438/687 |
| 6,207,392 B1 | 3/2001 | Weiss et al. | |
| 6,235,540 B1 | 5/2001 | Siiman et al. | |
| 6,277,740 B1 | 8/2001 | Goldstein | |
| 6,413,792 B1 * | 7/2002 | Sauer et al. | 438/49 |
| 6,417,340 B1 | 7/2002 | Mirkin et al. | |
| 6,482,639 B2 * | 11/2002 | Snow et al. | 435/287.2 |
| 6,605,424 B1 | 8/2003 | Lefkowitz et al. | |
| 6,638,564 B2 | 10/2003 | Degawa et al. | |
| 6,646,345 B2 | 11/2003 | Sambucetti et al. | |

(Continued)

FOREIGN PATENT DOCUMENTS

JP        2001-118805 A    4/2001

OTHER PUBLICATIONS

Metal recognition by repeating polypeptides(Nature 1997).*

(Continued)

*Primary Examiner*—Fernando L Toledo
*Assistant Examiner*—Ankush K Singal
(74) *Attorney, Agent, or Firm*—Foley & Lardner LLP

(57) ABSTRACT

A seed layer is formed on a substrate using a first biological agent. The seed layer may comprise densified nanoparticles which are bound to the biological agent. The seed layer is then used for a deposition of a metal layer, such as a barrier layer, an interconnect layer, a cap layer and/or a bus line for a solid state device.

34 Claims, 31 Drawing Sheets

U.S. PATENT DOCUMENTS

| | | | |
|---|---|---|---|
| 6,709,379 B1* | 3/2004 | Brandau et al. | 600/3 |
| 6,774,036 B2 | 8/2004 | Goldstein | |
| 6,780,765 B2 | 8/2004 | Goldstein | |
| 6,797,312 B2 | 9/2004 | Kong et al. | |
| 6,805,904 B2 | 10/2004 | Anders et al. | |
| 6,821,324 B2 | 11/2004 | Shacham-Diamand et al. | |
| 6,887,297 B2 | 5/2005 | Winter et al. | |
| 6,887,776 B2 | 5/2005 | Shang et al. | |
| 6,897,151 B2 | 5/2005 | Winter et al. | |
| 6,902,605 B2 | 6/2005 | Kolics et al. | |
| 6,927,113 B1* | 8/2005 | Sahota et al. | 438/200 |
| 7,005,752 B2 | 2/2006 | Bojkov et al. | |
| 7,358,113 B2* | 4/2008 | Shrivastava et al. | 438/99 |
| 7,410,899 B2 | 8/2008 | Chen et al. | |
| 2002/0006468 A1* | 1/2002 | Paranjpe et al. | 427/96 |
| 2002/0006723 A1* | 1/2002 | Goldstein | 438/660 |
| 2003/0068900 A1 | 4/2003 | Belcher et al. | |
| 2003/0073104 A1 | 4/2003 | Belcher et al. | |
| 2003/0113714 A1 | 6/2003 | Belcher et al. | |
| 2003/0136813 A1 | 7/2003 | Magerlein et al. | |
| 2003/0148380 A1 | 8/2003 | Belcher et al. | |
| 2004/0096866 A1* | 5/2004 | Hofmann et al. | 435/6 |
| 2004/0108217 A1* | 6/2004 | Dubin | 205/291 |
| 2004/0127640 A1 | 7/2004 | Belcher et al. | |
| 2004/0171139 A1 | 9/2004 | Belcher et al. | |
| 2004/0207093 A1* | 10/2004 | Sun et al. | 257/765 |
| 2004/0238214 A1 | 12/2004 | Liu | |
| 2005/0064508 A1 | 3/2005 | Belcher et al. | |
| 2005/0074968 A1 | 4/2005 | Chen et al. | |
| 2005/0136193 A1 | 6/2005 | Weidman et al. | |
| 2005/0153547 A1* | 7/2005 | Barns | 438/677 |
| 2005/0164371 A1* | 7/2005 | Arinaga | 435/287.1 |
| 2005/0170336 A1 | 8/2005 | Belcher et al. | |
| 2005/0180992 A1 | 8/2005 | Belcher et al. | |
| 2005/0221083 A1 | 10/2005 | Belcher et al. | |
| 2005/0245059 A1 | 11/2005 | Yuan et al. | |
| 2005/0266698 A1* | 12/2005 | Cooney et al. | 438/765 |
| 2006/0003387 A1 | 1/2006 | Peelle et al. | |
| 2006/0083850 A1 | 4/2006 | Valverde et al. | |
| 2006/0211236 A1* | 9/2006 | Bureau et al. | 438/628 |
| 2006/0254504 A1 | 11/2006 | Dai et al. | |
| 2006/0280860 A1 | 12/2006 | Paneccasio et al. | |
| 2008/0067679 A1 | 3/2008 | Takagi et al. | |
| 2008/0254205 A1 | 10/2008 | Petrov et al. | |

OTHER PUBLICATIONS

U.S. Appl. No. 60/571,532, filed May 17, 2004, Evelyn Hu.

Banerjee et. al, PNAS, Dec. 9, 2003, 14678-14682, vol. 100, No. 25.

Bindra et al., Fundamentals of Electroless Copper Plating, Bindra & White, Chapter 12, Fundamental Aspects of Electroless Copper Plating, pp. 289-329, 1990.

Brown, S., "Metal Recognition by Repeating Polypeptides," *Nature Biotechnol.*, 15, 269-272 (Mar. 1997).

Flynn et al., "Synthesis and Organization of Nanoscale II-VI semiconductor materials using evolved peptide specificity and viral capsid assembly," *J. Mater. Sci.*, 2003, 13, 2414-2421.

Healey, J., "Current Technical Trends: Dual Damascene & Low-k Dielectrics," 2002, www.icknowledge.com/threshold_simonton/techtrends01.pdf, 6 pages.

Hu et al., Reliability Physics Symposium Proceedings, $42^{nd}$ Annual (2004 IEEE International), "Effects of Overlayers on Electromigration Reliability Improvement for Cu/Low K Interconnects," pp. 222-228.

Jagannathan et al., "Electroless plating of copper at a low pH level," *IBM J. Res. Develop.*, Vol. 37, No. 2, Mar. 1993, pp. 117-123.

Kato et al., "Substrate (Ni)-Catalyzed Electroless Gold Deposition from a Noncyanide Bath Containing Thiosulfate and Sulfite," J. Electrochem. Soc., 149, C164-C167 (2002).

Kohn et al., "Characterization of electroless deposited Co(W,P) thin films for encapsulation of copper metallization," Mater. Sci. Eng. A302 (2001) 18-25.

Kohn et al., "Evaluation of electroless deposited Co(W,P) thin films as diffusion barriers for copper metallization," Microelectron. Eng. 55, (2001) 297-303.

Kohn et al., "Improved diffusion barriers for copper metallization obtained by passivation of grain boundaries in electroless deposited cobalt-based films," Journal of Applied Physics 92(9):5508-5511, Nov. 1, 2002.

Levy et al., "Rational and Combinatorial Design of Peptide Capping Ligands for Gold Nanoparticles," *J. Amer. Chem. Soc.*, 126, No. 32, pp. 10076-10084, 2004.

Madou, *Fundamentals of Microfabrication, The Science of Miniaturization*, $2^{nd}$ Ed., CRC Press, 2002, pp. 344-357, Metal Deposition.

Mao et al., "Virus-Based Toolkit for the Directed Synthesis of Magnetic and Semiconducting Nanowires," Science, vol. 303, Jan. 9, 2004, pp. 213-217.

Mao, et al., "Viral Assembly of Oriented Quantum Dot Nanowires," *PNAS*, Jun. 10, 2003, vol. 100, No. 12, 6946-6951.

Naik et al., "Biomimetic synthesis and patterning of silver nanoparticles," Nature Materials, vol. 1, Nov. 2002, 169-172.

Naik et al., "Silica-Precipitating Peptides Isolated from a Combinatorial Phage Display Peptide Library," J. Nanosci. Nanotech. 2002, vol. 2, No. 1, pp. 95-100.

Narasimhan et al., "Inline Process Control of Advanced Thin Films at 65 nm and Beyond", Summer 2004, Yield Management Solutions, www.kla-tencore.com/magazine, pp. 1-16.

Okinaka, Chapter 15, "Electroless Plating of Gold and Gold Alloys," pp. 401-420 (from Electroless Plating—Fundamentals and Applications, Ed. Mallory, Glenn O.; Hajdu, Jun. 1990, William Andrew).

Pinto et al., "Electroless deposition of thin metallic films on polymer fibers prepared via electrospinning," *Polymer Preprints*, 2003, 44(2), 138-139.

Pique (Ed.), *Direct-Write Technologies for Rapid Prototyping Applications*, 2002, Academic Press, Chapter 18, Nagel, David J., "Technologies for Micrometer and Nanometer Pattern and material Transfer," pp. 557-701, 2002.

Reiss et al., "Biological Routes to Metal Alloy Ferromagnetic Nanostructures," *Nanoletters*, 2004, vol. 4, No. 6, 1127-1132.

Ryu et al, "Electromigration of Submicron Damascene Copper Interconnects" (1988 Symposium on VLSI Technology, Jun. 8-11, 1998), 2 pages.

Smekalin et al., "Tuning the Process Flow to Optimize Copper CMP," Solid State Technology Wafer News, Microlithography World, Sep. 2001, pp. 107-112.

Wong et al., "Barrier/Seed Layer Requirements for Copper Interconnects" 1998 International Interconnect Technology Conference (San Francisco, CA), Jun. 3, 1998, 3 pages.

\* cited by examiner

Seed Layer, Gold NP Stabilized With Peptide 2 25 nm z scale

Film After EP #1 100 nm z scale

Film After EP #2 100 nm z scale

100x100 μm Scan  Gold Film Thickness: 130.5 nm

Copper Film
Scale = 50 nm/div, $R_A$ = 4.0nm

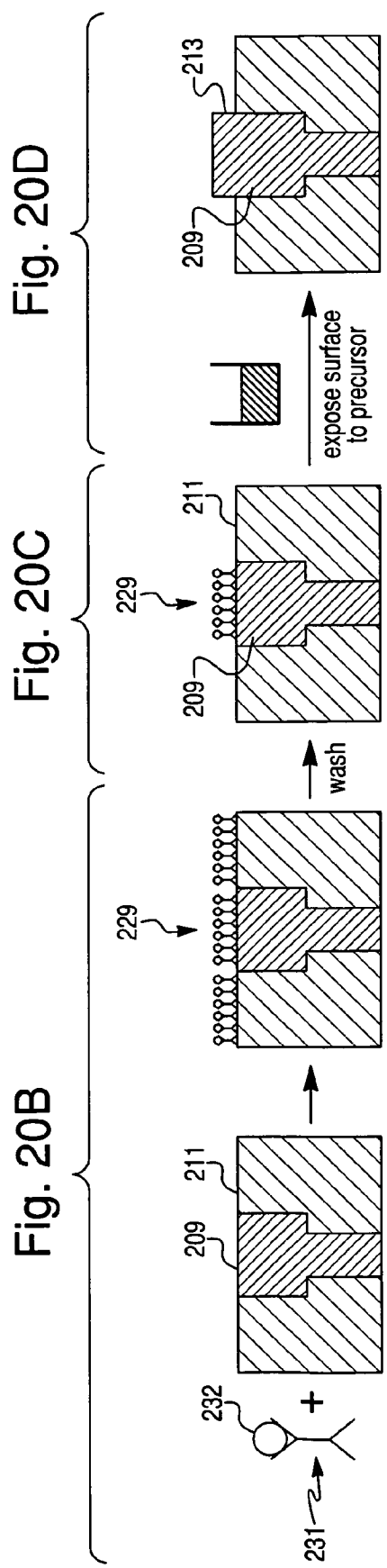
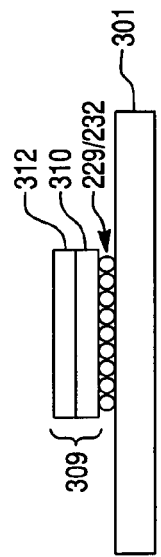
Fig. 22
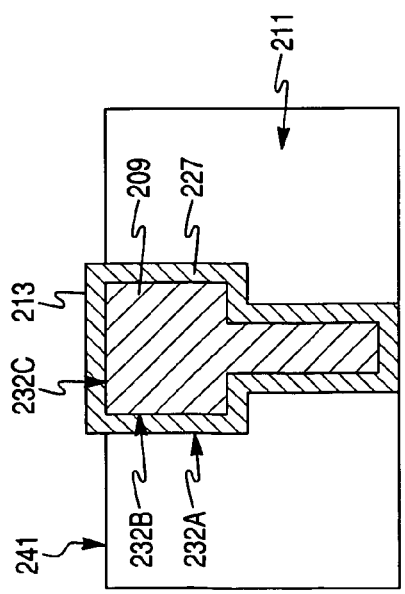

Fig. 23
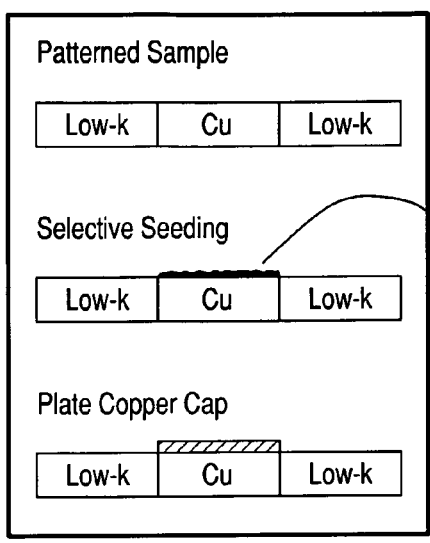
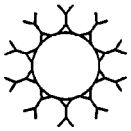
Function 1
Binds to seed material
(Pd, Co, Pd++)
Doesn't bind to low-k
Function 2
Binds to copper
Doesn't bind to low-k
Option 1:
Capped nanocrystal "smart" seed
(e.g. Co or Pd nanocrystals, size: 1-3 nm)
Option 2:
 Ion binding peptide: $Pd^{**} \rightarrow Pd^{\circ}$ In the plating bath
Fig. 24
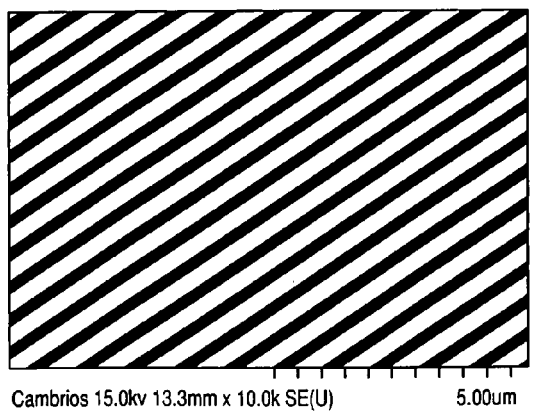
Cambrios 15.0kv 13.3mm x 10.0k SE(U)    5.00um

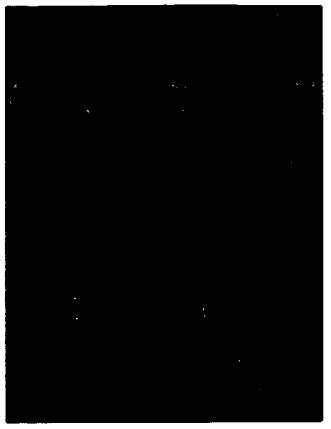
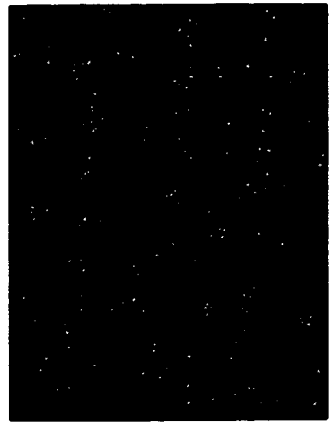
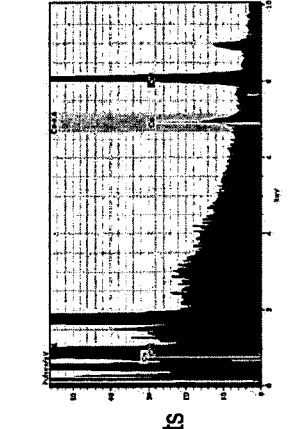
Fig. 25A
Cu map
Co map
Integrated EDX results
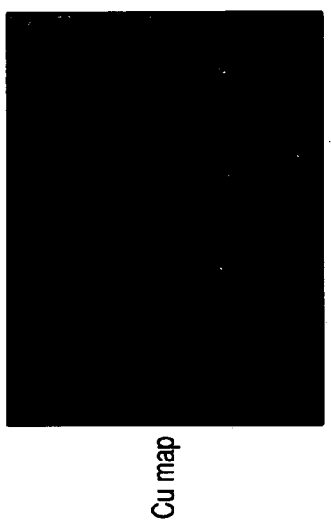
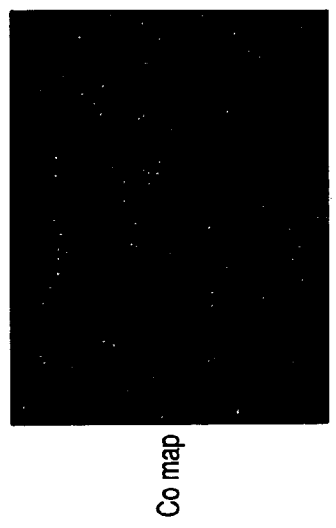
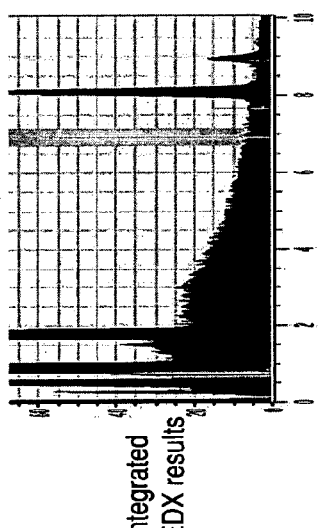
Fig. 25B
Cu map
Co map
Integrated EDX results
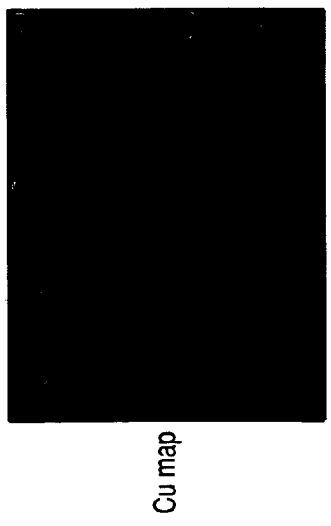
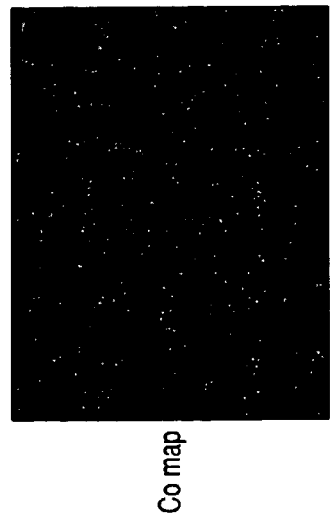
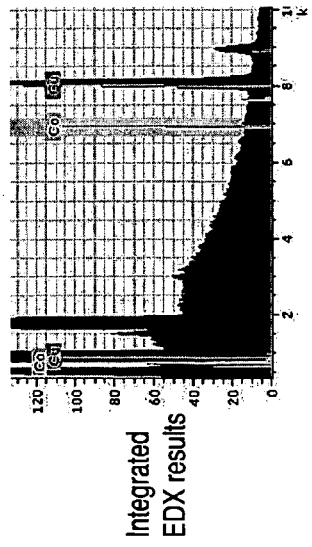
Fig. 25C
Cu map
Co map
Integrated EDX results

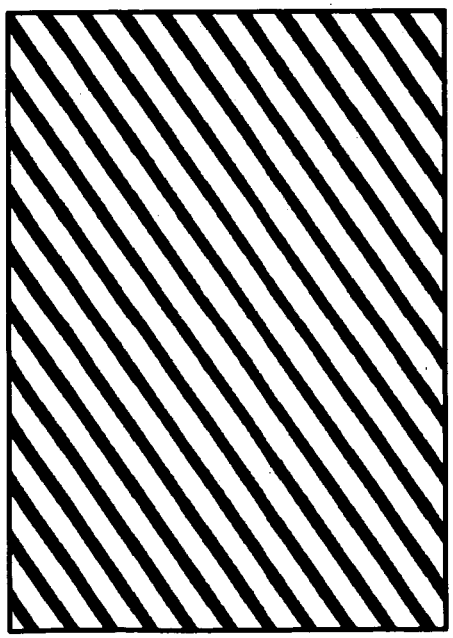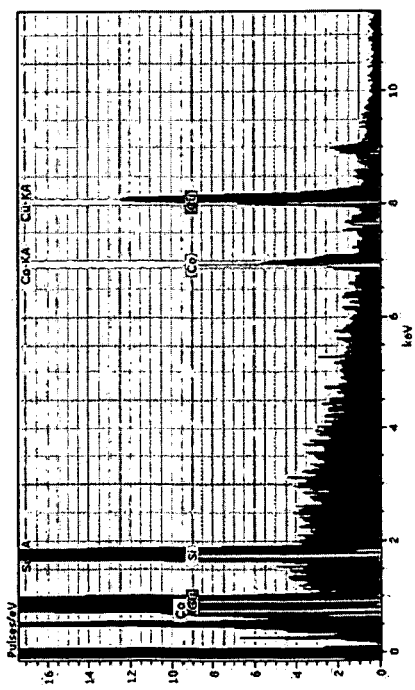
Fig. 28A
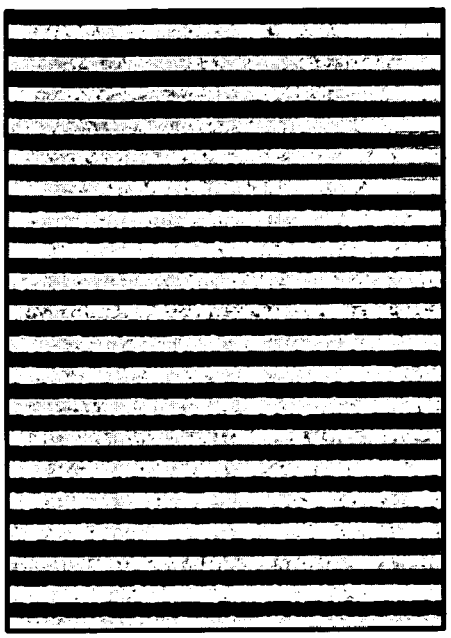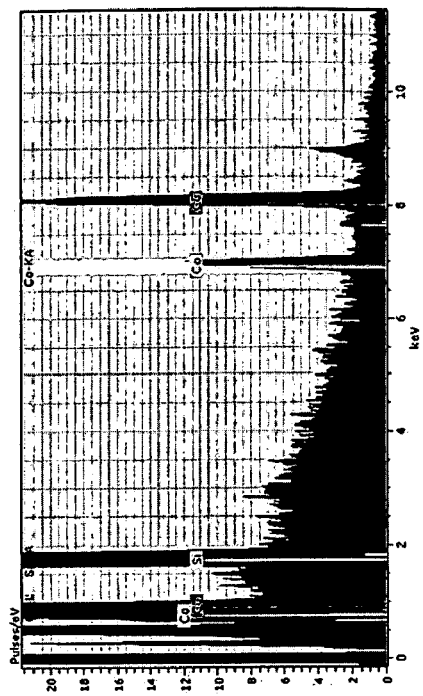
Fig. 28B

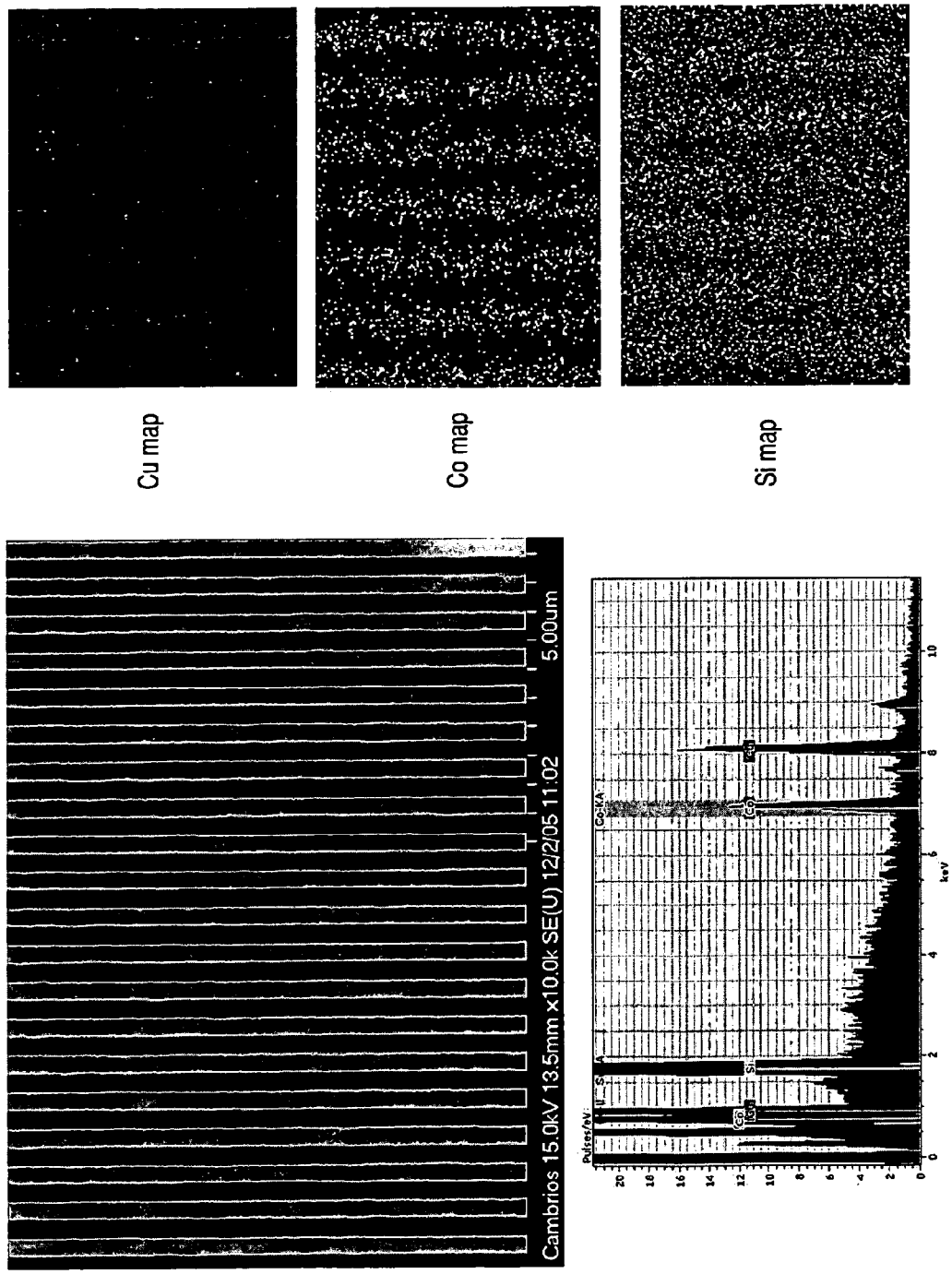

SEQUENCE LISTING

```
<160> NUMBER OF SEQ ID NOS: 39

<210> SEQ ID NO 1
<211> LENGTH: 5
<212> TYPE: PRT
<213> ORGANISM: Artificial Sequence
<220> FEATURE:
<223> OTHER INFORMATION: Description of Artificial Sequence: Synthetic
      peptide

<400> SEQUENCE: 1

Cys Ala Leu Asn Asn
 1               5

<210> SEQ ID NO 2
<211> LENGTH: 8
<212> TYPE: PRT
<213> ORGANISM: Artificial Sequence
<220> FEATURE:
<223> OTHER INFORMATION: Description of Artificial Sequence: Synthetic
      peptide

<400> SEQUENCE: 2

Val Ser Gly Ser Ser Pro Asp Ser
 1               5

<210> SEQ ID NO 3
<211> LENGTH: 11
<212> TYPE: PRT
<213> ORGANISM: Artificial Sequence
<220> FEATURE:
<223> OTHER INFORMATION: Description of Artificial Sequence: Synthetic
      peptide

<400> SEQUENCE: 3

Leu Lys Ala His Leu Pro Pro Ser Arg Leu Pro
 1               5                   10

<210> SEQ ID NO 4
<211> LENGTH: 14
```

```
<212> TYPE: PRT
<213> ORGANISM: Artificial Sequence
<220> FEATURE:
<223> OTHER INFORMATION: Description of Artificial Sequence: Synthetic
      peptide

<400> SEQUENCE: 4

Met His Gly Lys Thr Gln Ala Thr Ser Gly Thr Ile Gln Ser
 1               5                  10

<210> SEQ ID NO 5
<211> LENGTH: 14
<212> TYPE: PRT
<213> ORGANISM: Artificial Sequence
<220> FEATURE:
<223> OTHER INFORMATION: Description of Artificial Sequence: Synthetic
      peptide

<400> SEQUENCE: 5

Cys Arg Asp Gln Ala Gly Leu Lys Val Ser Gly Ala Pro Cys
 1               5                  10

<210> SEQ ID NO 6
<211> LENGTH: 14
<212> TYPE: PRT
<213> ORGANISM: Artificial Sequence
<220> FEATURE:
<223> OTHER INFORMATION: Description of Artificial Sequence: Synthetic
      peptide

<400> SEQUENCE: 6

Cys His Ala Gly Asn Ser Tyr Asp Asp Ala Glu Arg His Cys
 1               5                  10

<210> SEQ ID NO 7
<211> LENGTH: 14
<212> TYPE: PRT
<213> ORGANISM: Artificial Sequence
<220> FEATURE:
<223> OTHER INFORMATION: Description of Artificial Sequence: Synthetic
      peptide

<400> SEQUENCE: 7

Cys Arg Arg Ser Glu Glu Leu Gly Ala Ile Cys Ser Ser Cys
 1               5                  10

<210> SEQ ID NO 8
<211> LENGTH: 14
<212> TYPE: PRT
<213> ORGANISM: Artificial Sequence
<220> FEATURE:
<223> OTHER INFORMATION: Description of Artificial Sequence: Synthetic
      peptide

<400> SEQUENCE: 8

Cys Lys Ile Glu Thr Ser Ser Pro Asn His Ala Pro Ala Cys
 1               5                  10

<210> SEQ ID NO 9
<211> LENGTH: 14
<212> TYPE: PRT
<213> ORGANISM: Artificial Sequence
<220> FEATURE:
<223> OTHER INFORMATION: Description of Artificial Sequence: Synthetic
      peptide

<400> SEQUENCE: 9

Cys Arg Asp Phe Cys Val Arg Lys Pro Gly Ile Glu Asp Cys
```

<210> SEQ ID NO 10
<211> LENGTH: 14
<212> TYPE: PRT
<213> ORGANISM: Artificial Sequence
<220> FEATURE:
<223> OTHER INFORMATION: Description of Artificial Sequence: Synthetic
      peptide

<400> SEQUENCE: 10

Cys Thr Asp Val Ala Gly Ala Ser Glu Ala Ala Thr Asn Cys
  1               5                  10

<210> SEQ ID NO 11
<211> LENGTH: 14
<212> TYPE: PRT
<213> ORGANISM: Artificial Sequence
<220> FEATURE:
<223> OTHER INFORMATION: Description of Artificial Sequence: Synthetic
      peptide

<400> SEQUENCE: 11

Cys Gly Phe Gly His Pro Phe Glu Ala Glu Gly Ser Ser Cys
  1               5                  10

<210> SEQ ID NO 12
<211> LENGTH: 14
<212> TYPE: PRT
<213> ORGANISM: Artificial Sequence
<220> FEATURE:
<223> OTHER INFORMATION: Description of Artificial Sequence: Synthetic
      peptide

<400> SEQUENCE: 12

Cys Gly Val Ala Ser Asn Thr Thr Val Ser Met Gly Arg Cys
  1               5                  10

<210> SEQ ID NO 13
<211> LENGTH: 14
<212> TYPE: PRT
<213> ORGANISM: Artificial Sequence
<220> FEATURE:
<223> OTHER INFORMATION: Description of Artificial Sequence: Synthetic
      peptide

<400> SEQUENCE: 13

Cys Glu Gly Gly Val Val Trp Gln Trp Glu Gly Ile Val Cys
  1               5                  10

<210> SEQ ID NO 14
<211> LENGTH: 12
<212> TYPE: PRT
<213> ORGANISM: Artificial Sequence
<220> FEATURE:
<223> OTHER INFORMATION: Description of Artificial Sequence: Synthetic
      peptide

<400> SEQUENCE: 14

Ser Asp Pro Lys Pro His Ser Ser Pro Tyr Phe Gly
  1               5                  10

<210> SEQ ID NO 15
<211> LENGTH: 12
<212> TYPE: PRT
<213> ORGANISM: Artificial Sequence
<220> FEATURE:
<223> OTHER INFORMATION: Description of Artificial Sequence: Synthetic peptide

<400> SEQUENCE: 15

Phe Asp Ser Glu Lys His Pro Thr Phe Arg Thr Arg
 1               5                  10

<210> SEQ ID NO 16
<211> LENGTH: 12
<212> TYPE: PRT
<213> ORGANISM: Artificial Sequence
<220> FEATURE:
<223> OTHER INFORMATION: Description of Artificial Sequence: Synthetic
      peptide

<400> SEQUENCE: 16

Tyr Gln His Pro Thr Thr Ala His Gln Leu Pro Ile
 1               5                  10

<210> SEQ ID NO 17
<211> LENGTH: 12
<212> TYPE: PRT
<213> ORGANISM: Artificial Sequence
<220> FEATURE:
<223> OTHER INFORMATION: Description of Artificial Sequence: Synthetic
      peptide

<400> SEQUENCE: 17

Ile Gln Pro Asn Ala Ala His Ala Gln Ala Val Arg
 1               5                  10

<210> SEQ ID NO 18
<211> LENGTH: 12
<212> TYPE: PRT
<213> ORGANISM: Artificial Sequence
<220> FEATURE:
<223> OTHER INFORMATION: Description of Artificial Sequence: Synthetic
      peptide

<400> SEQUENCE: 18

Ser His Gln Thr Ser Asn Tyr Lys Pro Ile Val Leu
 1               5                  10

<210> SEQ ID NO 19
<211> LENGTH: 12
<212> TYPE: PRT
<213> ORGANISM: Artificial Sequence
<220> FEATURE:
<223> OTHER INFORMATION: Description of Artificial Sequence: Synthetic
      peptide

<400> SEQUENCE: 19

Asn Ser Arg His Pro Asp Tyr Asp Ala Val Ser Met
 1               5                  10

<210> SEQ ID NO 20
<211> LENGTH: 12
<212> TYPE: PRT
<213> ORGANISM: Artificial Sequence
<220> FEATURE:
<223> OTHER INFORMATION: Description of Artificial Sequence: Synthetic
      peptide

<400> SEQUENCE: 20

Ser Val Ser Val Gly Met Lys Pro Ser Pro Arg Pro
 1               5                  10

<210> SEQ ID NO 21

```
<211> LENGTH: 12
<212> TYPE: PRT
<213> ORGANISM: Artificial Sequence
<220> FEATURE:
<223> OTHER INFORMATION: Description of Artificial Sequence: Synthetic
      peptide

<400> SEQUENCE: 21

Asn Tyr Ser Ala Tyr Thr Pro Arg Gln Ala Leu Val
 1               5                  10

<210> SEQ ID NO 22
<211> LENGTH: 12
<212> TYPE: PRT
<213> ORGANISM: Artificial Sequence
<220> FEATURE:
<223> OTHER INFORMATION: Description of Artificial Sequence: Synthetic
      peptide

<400> SEQUENCE: 22

Ala Ala Met His Gln His Trp Gln Arg Ser Leu Leu
 1               5                  10

<210> SEQ ID NO 23
<211> LENGTH: 9
<212> TYPE: PRT
<213> ORGANISM: Artificial Sequence
<220> FEATURE:
<223> OTHER INFORMATION: Description of Artificial Sequence: Synthetic
      peptide

<400> SEQUENCE: 23

Cys Thr Gln Leu Ser Lys His Gln Cys
 1               5

<210> SEQ ID NO 24
<211> LENGTH: 9
<212> TYPE: PRT
<213> ORGANISM: Artificial Sequence
<220> FEATURE:
<223> OTHER INFORMATION: Description of Artificial Sequence: Synthetic
      peptide

<400> SEQUENCE: 24

Cys Pro Asn Thr Lys Thr Asn His Cys
 1               5

<210> SEQ ID NO 25
<211> LENGTH: 9
<212> TYPE: PRT
<213> ORGANISM: Artificial Sequence
<220> FEATURE:
<223> OTHER INFORMATION: Description of Artificial Sequence: Synthetic
      peptide

<400> SEQUENCE: 25

Cys His Glu Asn Ser Pro Arg Glu Cys
 1               5

<210> SEQ ID NO 26
<211> LENGTH: 9
<212> TYPE: PRT
<213> ORGANISM: Artificial Sequence
<220> FEATURE:
<223> OTHER INFORMATION: Description of Artificial Sequence: Synthetic
      peptide

<400> SEQUENCE: 26
```

```
Cys Leu Ser Val Pro Gly Arg Ala Cys
 1               5

<210> SEQ ID NO 27
<211> LENGTH: 9
<212> TYPE: PRT
<213> ORGANISM: Artificial Sequence
<220> FEATURE:
<223> OTHER INFORMATION: Description of Artificial Sequence: Synthetic
      peptide

<400> SEQUENCE: 27

Cys Met Lys Ser Gln Leu Thr Leu Cys
 1               5

<210> SEQ ID NO 28
<211> LENGTH: 9
<212> TYPE: PRT
<213> ORGANISM: Artificial Sequence
<220> FEATURE:
<223> OTHER INFORMATION: Description of Artificial Sequence: Synthetic
      peptide

<400> SEQUENCE: 28

Cys Phe Pro His Leu Lys Gly Tyr Cys
 1               5

<210> SEQ ID NO 29
<211> LENGTH: 9
<212> TYPE: PRT
<213> ORGANISM: Artificial Sequence
<220> FEATURE:
<223> OTHER INFORMATION: Description of Artificial Sequence: Synthetic
      peptide

<400> SEQUENCE: 29

Cys Pro Asn His Ser Ser Ser Lys Cys
 1               5

<210> SEQ ID NO 30
<211> LENGTH: 9
<212> TYPE: PRT
<213> ORGANISM: Artificial Sequence
<220> FEATURE:
<223> OTHER INFORMATION: Description of Artificial Sequence: Synthetic
      peptide

<400> SEQUENCE: 30

Cys Leu Pro Ile Thr Thr Lys Thr Cys
 1               5

<210> SEQ ID NO 31
<211> LENGTH: 9
<212> TYPE: PRT
<213> ORGANISM: Artificial Sequence
<220> FEATURE:
<223> OTHER INFORMATION: Description of Artificial Sequence: Synthetic
      peptide

<400> SEQUENCE: 31

Cys Thr Gln Asn Lys Thr Arg Asp Cys
 1               5

<210> SEQ ID NO 32
<211> LENGTH: 9
<212> TYPE: PRT
<213> ORGANISM: Artificial Sequence
<220> FEATURE:
```

```
<223> OTHER INFORMATION: Description of Artificial Sequence: Synthetic
      peptide

<400> SEQUENCE: 32

Cys Lys Gln Pro Met Tyr Asn Thr Cys
 1               5

<210> SEQ ID NO 33
<211> LENGTH: 9
<212> TYPE: PRT
<213> ORGANISM: Artificial Sequence
<220> FEATURE:
<223> OTHER INFORMATION: Description of Artificial Sequence: Synthetic
      peptide

<400> SEQUENCE: 33

Cys Thr Pro Lys Asn Thr His Thr Cys
 1               5

<210> SEQ ID NO 34
<211> LENGTH: 9
<212> TYPE: PRT
<213> ORGANISM: Artificial Sequence
<220> FEATURE:
<223> OTHER INFORMATION: Description of Artificial Sequence: Synthetic
      peptide

<400> SEQUENCE: 34

Cys Asn Thr Ser Met His Pro Leu Cys
 1               5

<210> SEQ ID NO 35
<211> LENGTH: 9
<212> TYPE: PRT
<213> ORGANISM: Artificial Sequence
<220> FEATURE:
<223> OTHER INFORMATION: Description of Artificial Sequence: Synthetic
      peptide

<400> SEQUENCE: 35

Cys Gly Ile Gln Gly Lys His Arg Cys
 1               5

<210> SEQ ID NO 36
<211> LENGTH: 14
<212> TYPE: PRT
<213> ORGANISM: Artificial Sequence
<220> FEATURE:
<223> OTHER INFORMATION: Description of Artificial Sequence: Synthetic
      peptide

<400> SEQUENCE: 36

Ala Cys Asn Ala Gly Asp His Ala Asn Cys Gly Gly Gly Ser
 1               5                   10

<210> SEQ ID NO 37
<211> LENGTH: 16
<212> TYPE: PRT
<213> ORGANISM: Artificial Sequence
<220> FEATURE:
<223> OTHER INFORMATION: Description of Artificial Sequence: Synthetic
      peptide

<400> SEQUENCE: 37

Lys Leu His Ser Ser Pro His Thr Pro Leu Val Gln Gly Gly Gly Ser
 1               5                   10                  15
```

-continued

```
<210> SEQ ID NO 38
<211> LENGTH: 16
<212> TYPE: PRT
<213> ORGANISM: Artificial Sequence
<220> FEATURE:
<223> OTHER INFORMATION: Description of Artificial Sequence: Synthetic
      peptide

<400> SEQUENCE: 38

His Tyr Pro Thr Leu Pro Leu Gly Ser Ser Thr Tyr Gly Gly Gly Ser
  1               5                  10                  15

<210> SEQ ID NO 39
<211> LENGTH: 9
<212> TYPE: PRT
<213> ORGANISM: Artificial Sequence
<220> FEATURE:
<223> OTHER INFORMATION: Description of Artificial Sequence: Synthetic
      peptide

<400> SEQUENCE: 39

Ala Glu Pro Gly His Asp Ala Val Pro
  1               5
```

US 7,695,981 B2

SEED LAYERS, CAP LAYERS, AND THIN FILMS AND METHODS OF MAKING THEREOF

CROSS-REFERENCE TO RELATED PATENT APPLICATIONS

This application also claims priority to U.S. Provisional Patent Application Ser. Nos. 60/680,491 filed on May 13, 2005 and 60/752,019 filed on Dec. 21, 2005. Both applications are incorporated herein by reference in their entirety.

BACKGROUND

The invention is generally directed to electronic devices and specifically to semiconductor and other solid state devices containing one or more layers deposited on a seed layer.

Much research and design focus has been to scale electronic devices to very small dimensions. However to ultimately take advantage of such small scaling, higher performance interconnects are required. To date, aluminum has been the metal used to create such interconnects and bus lines as in liquid crystal displays (LCDs). But with the scaling of interconnects, cross sectional area, line resistance and current density capacity are a limiting factor of total chip performance. Additionally for some applications like LCD bus lines, aluminum does not have adequate conductivity as displays get larger. To overcome these limitations, industry is moving away from Al towards use of copper, which has a resistivity of 1.72 μcm, approximately ⅔ of pure Al or almost half of Al/0.5% Cu. Copper also has an increased current density threshold, which ultimately may make use of copper as interconnects more reliable and able to handle higher currents.

Copper, however, is not compatible with the subtractive etch processes that are traditionally used in forming Al interconnects. Therefore, a process known as a dual damascene approach is used with both copper and aluminum, where a via is etched, followed or preceded by etching of a trench, allowing for creation of both trenches and vias in the same dielectric layer. Both structures are then filled with Cu, and then the resultant structure is polished using chemical mechanical polishing, resulting in an inlaid Cu interconnect.

However, the process of filling the trenches with copper is not a simple single step. Because copper readily migrates into the surrounding dielectric, such as $SiO_2$, barrier layers such as TaN are deposited before the addition of Cu. The Cu is then deposited on the barrier layer in a two step process, starting with a seed layer step followed by a subsequent enhancement step, either by electroplating or vapor deposition. This seed layer's characteristics play an important role in the overall structure of the resultant film. A strongly textured seed layer is important in forming an overall surface that is smooth and has large grains in the overall film. The texture, or orientation distribution of polycrystalline materials, can affect the physical properties of the metal film, and as such, the (111) texture in copper films is generally preferred over (200) texture due to increased electromigration times. With the proper barrier and seed layers, the grains of electroplated copper films in trenches are quite large and a near-bamboo structure can be obtained. This desirable microstructure enhances the reliability of damascene copper interconnects. Fine grain sizes often also degrade electromigration times, which typically occur with chemical vapor deposition processes of the film rather than electroplating process.

Despite their advantages, there are difficulties in implementing copper interconnects. For example, the copper interconnects are affected by electromigration, i.e., movement of copper under an electric potential gradient. Barrier layers in vias and trenches, underneath the copper layer, have been used to prevent copper electromigration and can also be used to improve copper adhesion to the dielectric material. More recently, a barrier layer deposited on top of the copper filled trench, referred to as a cap layer, is used to prevent copper migration at the interface between the top of the copper layer in a trench and the next dielectric layer. See Hu et al., RELIABILITY PHYSICS SYMPOSIUM PROCEEDINGS, 42 Annual (2004 IEEE International); Kohn et al., JOURNAL OF APPLIED PHYSICS 92(9):5508-5511 (2002). One approach to forming this capping layer is to deposit a thin layer of the appropriate cap material on the entire wafer followed by a patterning step to remove the cap material from the dielectric surface. Electroless plating has also been used to form cap layers.

Today, there is no cost effective means of depositing a lower resistance metal such as copper. In the semiconductor interconnect application, seed layers are created by atomic layer deposition which is expensive and has inadequate coverage of high aspect ratio vias.

In addition, there is currently no cost effective means of forming a cap layer using a deposition and patterning technique, and the use of electroless plating suffers from a number of shortcomings. For example, limited selectivity and instability of the electroless deposition bath make the use of electroless plating for forming cap layers less than ideal.

SUMMARY

An embodiment of the invention provides a device, comprising a substrate, a seed layer comprising a first biological agent residue located on the substrate, and a metal layer located on the seed layer.

BRIEF DESCRIPTION OF THE FIGURES

FIGS. 18A-18I, 19A-19I, 20A-20D, 21 and 22 show schematic side cross sectional views of steps of alternative methods of making a device according to the embodiments of the invention.

FIGS. 23-28G illustrate various aspects of the eighth example of the invention.

DETAILED DESCRIPTION

Introduction

Figure 1A:
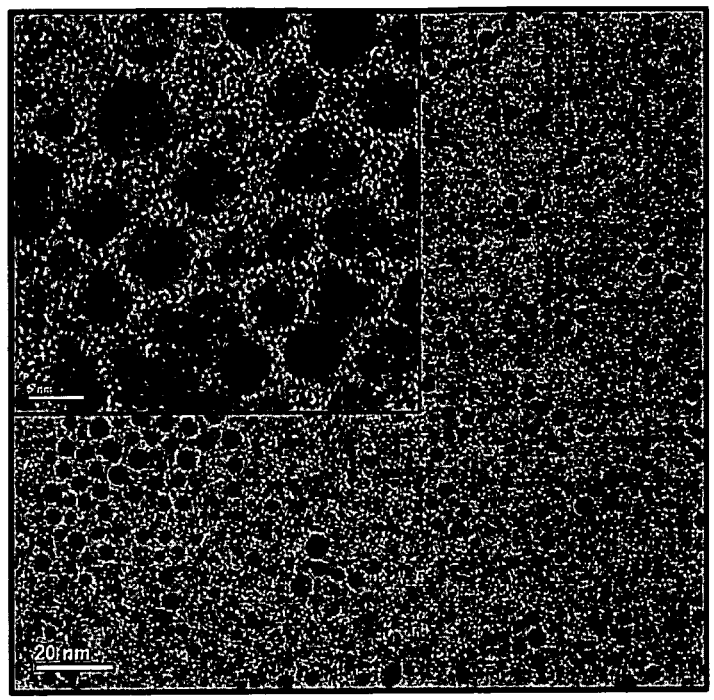
FIG. 1A is a TEM image of Au nanoparticles created by reduction of Au salt with $NaBH_4$ and subsequent ultra-filtration.

All references cited herein are incorporated by reference in their entirety. No admission is made that any of these references are prior art.

The embodiments of the present invention provide a method of forming a seed layer on a substrate using a biological agent. The seed layer may comprise densified nanoparticles or metal ions which are bound to the biological agent. The seed layer is then used for a deposition of a metal layer. For example, the metal layer may comprise a barrier layer, an interconnect layer, a cap layer for the interconnect layer or a bus line layer.

In the first five sections below, the biological agent, the substrate, suitable patterning methods, the seed layer and the enhancement layer are described in more detail. Then, in the subsequent three sections, a method of making a metal structure according to the first, the second and the third embodiments, respectively, are described. Then, the working examples are described.

Biological Agent

Any suitable biological agents, such as peptides, viruses, proteins, amino acids, nucleic acids, or lipids that possess a functionality described below may be used. The preferred biological agent is peptide, which may have an engineered functionality, and a wide variety of peptide structures comprising linked amino acids can be used. The composition comprising the peptide may also optionally comprise a liquid dispersion medium for the peptide and the seed layer nanoparticles, as will be described in more detail in the subsequent sections. The components for the liquid dispersion medium are not particularly limited and mixtures of components can be used. Water-based or organic-based components can be used. Examples include water, fluorocarbons, n-alkanes, alcohols, acetonitrile, methanol, ethanol, propanol, isopropanol, hexanes, dodecane, toluene, cyclohexanone, diethyl ether, tetrahydrofuran, dichloromethane, and acetone. Mixtures can be used including mixing in small amounts of organic solvent in water. The liquids should be able to volatilize as needed for the particular application. Factors to consider in solvent selection further include hydrophilicity of the substrate surface, solubility of the nanoparticles, vapor pressure, toxicity, purity, and the like. Surfactants, binders, dispersion agents, and other coating additives can be used as needed. Buffers can be used to control the pH. For example, the pH can be 7 or below, or 7 or above. The pH can be 7-10, 7-9, or 7-8. Stable colloid solutions can be formed and purified further as needed. For example, purification by gel filtration or ultrafiltration can be carried out. Other purification methods include filtration using a Nanosep 10K centrifugal filter.

The concentrations of the peptide and the nanoparticles can be controlled for particular applications. Concentrations can be, for example, 1 M or less, 0.5 M or less, 0.1 M or less, 0.05 M or less, 0.01 M or less, or 0.005 M or less (e.g., 5 mM or less). Concentration can be adjusted to provide the best balance of nanoparticle density in the seed layer and the quality of formation of nanoparticles when nanoparticles are formed in the presence of peptide. Reaction conditions can be varied to adjust the shape and size of nanoparticles, and concentration is one such reaction condition, along with temperature. In general, the nanoparticles can be well dispersed in the dispersion medium and can be stably dispersed over time.

A wide variety of peptides can be used of various molecular weights as the biological agent. The peptides can be natural peptides, nonnatural peptides, unnatural peptides, synthetic peptides, or peptide analogs. Peptides may also be found in nature, or modified from those found in nature, and the study of nature can be used to determine useful peptide sequences. Phage display and other combinatorial or library methods can be used to determine suitable peptides. The peptides can be oligopeptides or polypeptides. A wide variety of amino acids can be used including those found in nature. The peptide can comprise a first peptide binding domain for binding to the nanoparticle. The peptide can further comprise a second binding domain for binding to the substrate.

The peptide can be a low molecular weight peptide (e.g., 100 amino acid units or less, or 50 amino acid units or less, or about 10 to about 30 amino acids) or can be part of a larger protein or support complex. The peptide can be a bifunctional peptide. The two active peptide binding domains can be directly linked to each other or can be linked to each other through an intermediate spacer unit. The intermediate spacer unit itself can be a peptide linkage. The peptide can be represented by the symbol A-B-C, wherein A is a first binding peptide moiety for binding to the seed layer nanoparticles (or metal ions if the ions are used instead of nanoparticles), B is an optional intermediate non-binder linker, and C is a second binding peptide moiety for binding to a surface. For example, B may be a protein scaffold, such as Thioredoxin, as will be described below. When B is not present, the symbol collapses to A-C. Alternatively, a single amino acid or fusion protein may be used instead of the peptide as the biological agent. If a single amino acid is used, then the amino acid may be a bifunctional amino acid, such as cysteine. The protein may comprise a bifunctional protein comprising a scaffold connecting substrate and seed layer specific binding regions.

The peptides can be also used in the synthesis of nanoparticles, where they can act as capping ligands to control nanoparticle shape, size, and crystal morphology. Peptides can also passivate the nanoparticle, improving long term stability. Peptides can be localized onto the substrate surface via affinity, streptavidin/biotin interaction, or through direct adsorption/placement.

Additionally, commercially available nanoparticles can be used as a seed layer. These commercial nanoparticles come with ligands encapsulating them. At times, these nanoparticles can be used with the ligands as supplied, for example, with linkages such as streptavidin or biotin, or with counter ions. Primarily, commercial nanoparticles can be used where the nanoparticles are stabilized by counter ions, such as acetate. Because these counter ion stabilized nanoparticles are typically not stable when salt is added to a solution containing them, ligand exchange can be performed, where a peptide of interest is exchanged with the original counter ion to functionalize the nanoparticles with molecules that make them stable in salt solutions/change their solubility, and/or can act as a hook to cause directed placement for immobilization on the surface.

Figure 2:
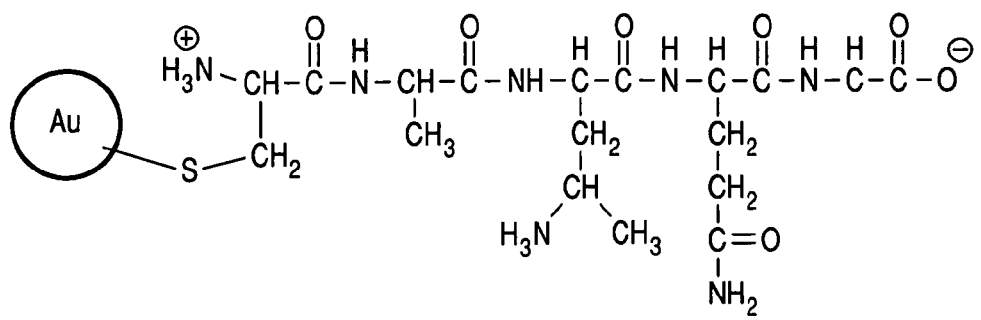
FIG. 2 is a schematic of an Au nanoparticle stabilized by CALNN (SEQ ID NO: 1) peptide.

Specific biological complexes or binding pairs known in the art such as, for example, biotin and streptavidin can be used to promote bonding between the peptide and the surface. Other examples include glutathione-S-transferase/glutathione; 6× Histidine Tag/Ni-NTA; S-protein/S-peptide; or biotin/avidin. Peptides can be, for example, biotinylated and can be synthesized through commercial peptide synthesis vendors. For example, peptide 3222, with a sequence of CALNN (SEQ ID NO: 1), a known covalent Au binder found in the literature (Levy et al., *J. Amer. Chem. Soc.*, 126, No. 32, pp. 10076-10084, 2004, which is herein incorporated by reference in its entirety), was made synthetically (Peptide 3222A) as well as synthesized with a biotin added on the N terminus (Peptide 3222B). This peptide can be designed to stabilize Au nanoparticles by forming a dense, self-assembled monolayer (FIG. 2). Stabilized nanoparticles produced using this peptide can be purified and handled like stable proteins (e.g., by size exclusion chromatography, ultrafiltration, electrophoresis, lyophilization, and the like).

Au nanoparticles can be prepared with this peptide either by reduction of a precursor or by ligand exchange. A biotinylated version of that peptide was prepared and found to also give stable Au colloids.

Thus, in general, any suitable metal and other nanoparticles may be used with the peptides. The nanoparticles may comprise pre-made nanoparticles which are subsequently bound to the peptides. Alternatively, the nanoparticles may be nucleated and grown on the peptides from a metal containing solution. For example, metal nanoparticles may be nucleated from a metal ion containing solution by using a reducing agent, such as $NaBH_4$ or dimethylamine borane. The metal nanoparticles may also be nucleated without a reducing agent when the peptide contains a reducing component. For example, a peptide may comprise a cysteine component which contains a free thiol group that assists in nucleation of a metal nanoparticle from a metal salt solution.

The peptide itself or the peptide's other binding site such as, for example, the peptide's biotin functionality can be exploited for specific localization onto a surface or a substrate. Alternatively, the peptide can be directly adsorbed to a surface or substrate or can be interacted with the substrate in a patterned way, so that the subsequent films grown follow the shape of the peptide pattern. Also, bifunctional peptides can be used, where one end of the peptide or virus is engineered to bind to a seed material, while the other end of the peptide has engineered specificity to bind to a substrate or surface.

Generally, non-covalent binding is desired between the peptide and the nanoparticle, and between the peptide and the substrate surface. However, covalent bonding may also be used in some circumstances. For example, if an amino acid instead of a peptide is used, then the amino acid may be covalently bonded to the substrate and/or to the nanoparticle. Furthermore, peptide covalent bonding may also be used, such as peptides that have cysteine at one end that could participate in covalent binding via the thiol. Also, cyclic peptides that are constrained by a disulfide bond could be exposed to reducing condition which would open the ring and allow the freed thiols to participate in covalent binding to metals.

Other peptides include phage display discovered peptides screened against Au (Peptide 1: VSGSSPDS (SEQ ID NO: 2); Peptide 2: LKAHLPPSRLP (SEQ ID NO: 3)) as well as peptides obtained from the literature that are known to interact with Au (Peptide 3: MHGKTQATSGTIQS (SEQ ID NO: 4), see for example Brown, S., "Metal Recognition by Repeating Polypeptides," *Nature Biotechnol.*, 15, 269-272 (1997), which is hereby incorporated by reference in its entirety). Peptides can be synthesized with biotin on their N-termini and HPLC purified to >90% purity. Peptides can also be synthesized with biotin on their C-termini through an additional Lys (Lysine) or Ser (Serine). If desired, purification can be carried out so that purity is, for example, greater than 95%, or greater than 99%. However, it is possible that a purity below 90% may also be sufficient. These Au peptides can also be used to grow other nanoparticles, including Pd nanoparticles, in addition to Au nanoparticles. Some peptides can have a high affinity for multiple materials. For example, peptide 2, in addition to being able to bind to or grow gold, also has a high affinity for glass, plastic, oxide and nitride surfaces, such as Corning 1737 glass, soda lime glass, Kapton®, $SiO_2$, $TiO_2$ and tantalum nitride, for example. Peptides with multiple affinities, therefore, can be used.

In addition, one skilled in the art, if needed, can refer to the following patent literature for selection of binding peptides using virus, genetic engineering methods, and for materials to be used with genetically engineered viruses. Phage display, yeast display or cell surface display systems can be used for panning peptides. Phage display libraries and experimental methods for using them in biopanning are further described, for example, in the following U.S. patent publications to Belcher et al.: (1) "Biological Control of Nanoparticle Nucleation, Shape, and Crystal Phase"; 2003/0068900 published Apr. 10, 2003; (2) "Nanoscale Ordering of Hybrid Materials Using Genetically Engineered Mesoscale Virus"; 2003/0073104 published Apr. 17, 2003; (3) "Biological Control of Nanoparticles"; 2003/0113714 published Jun. 19, 2003; and (4) "Molecular Recognition of Materials"; 2003/0148380 published Aug. 7, 2003, which are each hereby incorporated by reference in their entirety. Additional patent applications useful for one skilled in the art describe viral and peptide recognition studies with use of genetically engineered viruses for materials synthesis and applications including, for example, (1) U.S. Ser. No. 10/654,623 filed Sep. 4, 2003 to Belcher et al. ("Compositions, Methods, and Use of Bi-Functional BioMaterials"), published 2004/0127640; (2) U.S. Ser. No. 10/665,721 filed Sep. 22, 2003 to Belcher et al. ("Peptide Mediated Synthesis of Metallic and Magnetic Materials"), published 2005/0064508; (3) U.S. Ser. No. 10/668,600 filed Sep. 24, 2003 to Belcher et al. ("Fabricated BioFilm Storage Device"), published 2004/0171139; (4) U.S. Ser. No. 10/965,665, filed Oct. 15, 2004 to Belcher et al. ("Viral Fibers"); (5) U.S. Ser. No. 10/965,227 filed Oct. 15, 2004 to Belcher et al. ("Multifunctional Biomaterials . . . "); and (6) U.S. Ser. No.

10/976,179, filed Oct. 29, 2004 to Belcher et al. ("Inorganic Nanowires") each of which is hereby incorporated by reference. These references describe a variety of specific binding modifications which can be carried out for binding to conjugate structures, as well as forming the conjugate structures in the presence of the material modified for specific binding. Semiconductor applications of bifunctional peptides are described in, for example, U.S. provisional application 60/571,532 filed May 17, 2004, which is hereby incorporated by reference in its entirety. Yeast display peptide systems are described in, for example, U.S. application Ser. No. 11/051,481 filed Feb. 7, 2005, which is hereby incorporated by reference in its entirety.

Reiss et al., "Biological Routes to Metal Alloy Ferromagnetic Nanostructures," *Nanoletters,* 2004, Vol. 4, No. 6, 1127-1132 describes peptides for binding to metals, including mediating nanoparticle synthesis, and is hereby incorporated by reference in its entirety. Flynn, Mao, et al., "Synthesis and Organization of Nanoscale II-VI semiconductor materials using evolved peptide specificity and viral capsid assembly," *J. Mater. Sci.,* 2003, 13, 2414-2421, describes peptides for binding to and nucleation of semiconductor nanoparticles, and is hereby incorporated by reference in its entirety. Mao, Flynn et al., "Viral Assembly of Oriented Quantum Dot Nanowires," *PNAS,* Jun. 10, 2003, vol. 100, no. 12, 6946-6951 further describes peptides for binding to and nucleation of semiconductor nanoparticles, and is hereby incorporated by reference in its entirety.

The biological materials, and in particular the peptides, once placement of a seed layer is successfully completed, can be generally volatilized and removed so that, preferably, they cannot be detected in the final film. However, some residue may remain in a final product reflecting the source of the intermediate product comprising the peptides. This substantial removal can be described in terms of weight percentage remaining. For example, the amount of remaining biological materials with respect to the total amount of film including biologicals can be less than 1 wt. %, more preferably, less than 0.5 wt. %, and more preferably, less than 0.1 wt. %. Embodiments include both intermediate products which comprise the peptides and final products which comprise only peptide residue or substantially no peptide or peptide residue. Residues can be analyzed by, for example, carbon content including surface analysis such as XPS. In other patent applications, which are hereby incorporated by reference in its entirety, [U.S. Ser. No. 10/665,721 filed Sep. 22, 2003 to Belcher et al. ("Peptide Mediated Synthesis of Metallic and Magnetic Materials"), published 2005/0064508; and U.S. application Ser. No. 10/976,179, filed Oct. 29, 2004 to Belcher et al. ("Inorganic Nanowires")], (see also Mao et al., Science, vol. 303, Jan. 9, 2004, pages 213-217) additional description is provided for burning off and elimination of biologicals from materials to which the biologicals can selectively bind. For example, annealing temperatures of 500-1,000° C. are described for burning off the biologicals or peptides. Sintering methods can be used.

Heating to remove the peptide can also result in effects on the nanoparticle seed layer. For example, nanoparticles can coalesce with heating and form a more continuous or "fused" film. Heating can also enhance the film's adherence to the substrate.

Substrate

As used herein, the term "substrate" means any structure containing one or more layers upon which the biological agent is deposited. The term "supporting substrate" means the supporting member, such as a semiconductor wafer or a glass plate, upon which a solid state device is fabricated. Thus, a "substrate" may comprise either a bare "supporting substrate" or a "supporting substrate" covered by one or more layers and/or devices.

A variety of materials can be used for the substrate, presenting a surface for deposition of the seed layer, as will be described in more detail below. The substrate may include electrically conductive, semiconducting, or insulating materials. The substrate can include a multilayer substrate. The substrate can be, for example, insulating materials such as a low-k polymer dielectric, glass, quartz, oxide or nitride material, plastic or ceramic; semiconductor materials such as silicon, germanium, gallium arsenide and the like; and conductive materials such as metals, including aluminum, copper, stainless steel and the like; as well as composites of materials including metals and semiconductors, and multilayer coating of any of these materials.

The substrate typically comprises a surface where a metal film, such as a copper film, would be grown. Such substrates include, for example, barrier layer materials, such as Ta, TaN, Ti, TiN, TiW, Mo and/or Cr, and insulating materials, such as silicon oxide (including silicon dioxide), silicon nitride, and silicon oxynitride. Thus, the barrier layer materials comprise blocking materials which prevent copper diffusion. The substrate may also comprise a metal interconnect, such as a copper, nickel, or other conductive interconnect metal on which a cap layer is grown, as will be described in more detail below. The substrates may be cleaned, prepared, or coated with a oxide or other substance.

The substrate may be coated with streptavidin so that the affinity between the peptide and the substrate is a stable streptavidin-biotin interaction. Other substrate coatings to exploit for directed biological placement include poly-Lysine surfaces. Silane surface may also be used. The peptide may also be directly bound to the substrate without any coating on the substrate in order to direct the metal film directly on the desired layer.

The substrate can be a substrate useful for fabrication of semiconductor or other solid state electronic devices, such as transistor containing logic or memory devices. The substrate can comprise features used in small-scale semiconductor processing including damascene features. For example, the substrate can comprise trenches and/or vias with high aspect ratios including, for example, aspect ratios of 2 or greater, 4 or greater, 6 or greater, 8 or greater, or 10 or greater. The width can be, for example, 200 nm or greater, 400 nm or greater, 600 nm or greater, 800 nm or greater, or one micron or greater. The depth can be, for example, 600 nm or greater, 800 nm or greater, one micron or greater, two microns or greater, three microns or greater. Particular advantages can be gained when substrates are used which have features which are difficult to conformally coat such as high aspect ratio features. In general, the substrate can be a non-particulate substrate and presents non-particulate surfaces to the seed layer.

Substrates also can be selected for usefulness in displays including liquid crystal displays, plasma displays, LED displays and organic LED displays. Deposition of seed layers on glass substrates is described in U.S. Pat. No. 6,887,776, which is hereby incorporated by reference in its entirety. Glasses include undoped silica glass (USG), phosphorous doped glass (PSG), boron-phosphorous doped glass (BPSG), soda-lime glass, borosilicate glass, sodium borosilicate glass, alkali-metal borosilicate, aluminosilicate glass, aluminoborosilicate glass, alkaline earth aluminoborosilicate glass, alkaline earth-metal aluminoborosilicate glass, and combinations thereof.

Patterning

As will be described with respect to the methods of the first, second and third embodiments in the sections below, certain layers or materials are patterned. Any suitable patterning method may be used.

For example, photolithography may be used to pattern a layer by forming a resist or another radiation sensitive material over the layer and selectively exposing the resist to an energy beam. For example, photosensitive resists may be exposed to a UV or visible light beam through a mask. Electron beam sensitive resists may be exposed to a scanned electron beam. Then, either the exposed or non-exposed regions of the resist (depending if a positive or a negative resist is used) are removed. The remaining regions of the resist are then used as a mask for wet and/or dry etching of the underlying layer to pattern the underlying layer.

Alternatively, the patterning may comprise forming the layer over or through a mask. For example, the layer may be deposited through openings in a mask to form a layer pattern. Alternatively, the layer may be formed on a resist pattern. The resist pattern is then lifted-off to form the layer pattern by the lift-off method. Screen printing, flexoprinting, gravure printing, microcontact printing and ink jet printing or patterning can also be used to form layer patterns.

For example, metal lines can be patterned having line width of 250 microns or less, 100 microns or less, 10 microns or less, one micron or less, 500 microns or less, or 100 nm or less. The distances between patterned features can be, for example, 10 microns or less, one micron or less, or 500 nm or less. High resolution patterning is generally preferred. Optical or electron microscopy or scanning probe methods can be used to characterize the pattern.

General methods for patterning, lithography, and direct-write are known in the art as described in for example, (i) Pique (Ed.), *Direct-Write Technologies for Rapid Prototyping Applications,* 2002, Academic Press, including Chapter 18, and (ii) Madou, *Fundamentals of Microfabrication, The Science of Miniaturization,* 2nd Ed., CRC Press, 2002, pages 344-357, which are hereby incorporated by reference in their entirety.

Nanoparticles/Seed Layer

A seed layer can be disposed on the substrate. The seed layer provides a catalytic effect when later a metal, such as a copper interconnect, is further disposed on the seed layer. The seed layer may also influence the texture of a metal, such as copper, which is further disposed on the seed layer. For example, copper <111> texture can be enhanced to provide better electromigration performance, and higher orientation can be achieved. The seed layer step coverage, conformality, and texture can be adapted for particular applications.

The seed layer material may be selected to allow a selective metal deposition step, such as a copper interconnect deposition step, a barrier layer deposition step and/or a cap layer deposition step. For example, the seed layer material is selected to catalyze selective copper deposition from a copper solution (i.e., copper plating) on the seed layer. This metal deposition step is referred to herein as an "enhancement step" to form a continuous "enhancement" layer or film.

In the case of Cu enhancement, Au, Pd, Ru and Ni seed layers have been shown in the literature to form Cu films after electro/electroless Cu plating. Many other metals can be used as a seed layer that catalyze copper plating (see Chapter 12 "Fundamentals of Electroless Copper Plating", Bindra & White). Other examples include aluminum, silver, manganese, molybdenum, platinum, tin, zinc, tantalum, titanium, alloys, oxides, nitrides, and phosphides thereof.

The seed layer can comprise material, such as metal, which is the same material as the enhancement layer, or different material from the enhancement layer. For example, gold seed layers can be used for both gold and copper enhancement layers.

The seed layer material may have any suitable form, such as metal ions or nanoparticles. The nanoparticles do not generally require the presence of a surface coating to allow binding to the biological agent such as the peptide. Nanoparticles can be inorganic nanoparticles or metallic nanoparticles including alloys. In some embodiments, they can be semiconductor nanoparticles. Nanoparticles can be quantum dots. Examples of semiconductor nanoparticles include cadmium sulfide, cadmium selenide, silver sulfide, cadmium sulfide, zinc sulfide, zinc selenide, lead sulfide, gallium arsenide, silicon, tin oxide, iron oxide, and indium phosphide. Nanoparticles can be crystalline or amorphous. The nanoparticles also can be nanocrystals. The nanoparticles can be amorphous or crystalline, and if crystalline can show different crystalline phases. For copper interconnect deposition, the nanoparticles preferably comprise nanoparticles of a material, such as Cu, Au, Ru, Ni, Ag, Pt, Co, Pd, etc., which catalyze selective copper plating.

The nanoparticles can be characterized by particle sizes which can be, for example, about 100 nm or less, about 50 nm or less, about 25 nm or less, or about 10 nm or less. The particle size can be, for example, about 1 nm or more, or about 3 nm or more, or about 5 nm or more. The particle size can be, for example, about 1 nm to about 10 nm. The particle size can be determined by a linear dimension in any direction on the order of nanometers, e.g., 1 nm to 100 nm. Particle size distribution can be for example less than 30% of the average particle diameter for nanoparticles having an average diameter of 10 nm or less. The size of the nanoparticle can affect the melting temperature of the material, and the skilled artisan can adjust this parameter to achieve a desired melting performance for a specific application. If desired, the nanoparticles can be polydisperse or substantially monodisperse in size. For example, the particle size can have a standard deviation of 5% or less. Nanoparticles are not limited by a particular aspect ratio but generally will not be nanowires and generally can have aspect ratios of about 10:1 or less. Dimensions can be sufficiently small to provide for quantum confinement effects. Core-shell structures can also be used.

Solution phase reduction from a metal salt can be used to prepare the nanoparticles. Alternatively, nanoparticles can be prefabricated by other methods, without use of the biological agent such as peptide, and then bound to the biological agent such as peptide.

Growth of nanoparticles in the presence of biological agents, such as peptides is described in the aforementioned Belcher patent publications and technical literature including, for example:

Reiss et al., "Biological Routes to Metal Alloy Ferromagnetic Nanostructures," *Nanoletters,* 2004, Vol. 4, No. 6, 1127-1132 describes peptides for binding to metals, including mediating nanoparticle synthesis, and is hereby incorporated by reference in its entirety.

Flynn, Mao, et al., "Synthesis and Organization of Nanoscale II-VI semiconductor materials using evolved peptide specificity and viral capsid assembly," *J. Mater. Sci.,* 2003, 13, 2414-2421, describes peptides for binding to and nucleation of semiconductor nanoparticles, and is hereby incorporated by reference in its entirety.

Mao, Flynn et al., "Viral Assembly of Oriented Quantum Dot Nanowires," *PNAS,* Jun. 10, 2003, vol. 100, no. 12, 6946-

6951 further describes peptides for binding to and nucleation of semiconductor nanoparticles, and is hereby incorporated by reference in its entirety.

The following patents are incorporated by reference in their entirety: U.S. Pat. No. 6,207,392 to Weiss et al. describe semiconductor nanocrystals and linking agents; U.S. Pat. No. 6,235,540 describes semiconductor nanoparticles linked to ligands; and U.S. Pat. No. 6,417,340 describes nanoparticles.

Naik et al., Nature Materials, vol. 1, November 2002, 169-172 further describes synthesis and patterning of silver nanoparticles; and Naik et al., J. Nanosci. Nanotech. 2002, vol. 2, No. 1, pages 95-100.

An example of copper nanocrystal growth on peptides can be found in Banerjee et. al, PNAS, Dec. 9, 2003, 14678-14682, vol. 100, no. 25, which is hereby incorporated by reference in its entirety. Copper nanocrystals and seed layers are further described in U.S. Pat. No. 6,887,297 and US Patent Publication 2004/0091625 (Winter) as well as in U.S. Pat. Nos. 6,780,765; 6,774,036; and 6,277,740 (Goldstein), which are hereby incorporated by reference in their entirety.

The seed layer can be characterized by a coverage percentage. For example, coverage percentage can be 20% or greater, 40% or greater, 60% or greater, or 80% or greater. When the seed layer is disposed in a trench or via, the coverage can comprise both a coverage of the bottom and the coverage of the side wall. The coverage of the side wall can be higher than the coverage of the bottom. For example, the coverage of the side wall can be 40%, whereas the coverage of the bottom can be only 20%. The coverage can be affected by the concentration of the nanoparticles in the solution, and this concentration can be varied to facilitate control over the seed layer coverage and film thickness.

The seed layer can be also characterized by a film thickness. For example, film thickness can be for example 500 nm or less, or 250 nm or less, or 100 nm or less, such as 50 nm to 500 nm, or 50 nm to 250 nm, or 100 nm to 250 nm. U.S. Pat. No. 6,879,051 describes one method to determine seed layer thickness of trench side walls.

Technical literature related to seed layers include:

Biberger et al., http://www.novellus.com/damascus/tec/tec_0.5.asp, "Low Pressure Sputtering of Copper, and Related Barriers, for Seed Layers and Complete Planarization."

Healey, "Current Technical Trends: Dual Damascene & Low-k Dielectrics";

Ryu et al, "Electromigration of Submicron Damascene Copper Interconnects" (1988 Symposium on VLSI Technology, Jun. 8-11, 1998);

Wong et al., "Barrier/Seed Layer Requirements for Copper Interconnects" 1998 International Interconnect Technology Conference (San Francisco, Calif.), Jun. 3, 1998; and Marasimhan et al., "InLine Process Control of Advanced Thin Films at 65 nm and Beyond", Summer 2004, Yield Management Solutions, www.kla-tencore.com/magazine, pages 1-16.

The seed layer can be formed on the substrate by a variety of liquid deposition methods, including for example dip coating, spray coating, spin coating, and electrochemical deposition. Other deposition or patterning techniques for the seed layer include printing (inkjet, offset, contact, and the like), electrophoretic deposition, slot coating, drum coating, various ways of patterning molecules to capture the nanoparticle seed, and the like. Microcontact printing can also be used to place the seed layer in desired locations on the substrate. The peptides may be placed on a microcontact stamp and then stamped or printed onto desired portions of the substrate. As solvent evaporates, nanoparticles are selectively bound to the substrate by the biological agent. Specifically, the biological agent, such as a peptide, bound to the nanoparticles, has a specific binding affinity for a particular substrate material.

If desired, seed layer can be uniformly applied to the entire substrate. If desired, the seed layer may be patterned to remain only over selected substrate locations using photolithography or any other patterning method described above in the patterning section. A mask on the substrate can also be used to prevent deposition of the seed layer on top of the substrate areas covered by the mask and to allow deposition of the seed layer on the unmasked regions.

For example, the seed layer may be selectively deposited in a via and/or trench located in an interlayer insulating layer over a solid state device. Alternatively, the seed layer may be deposited over the entire interlayer insulating layer and then patterned to remain in the via and/or trench in the interlayer insulating layer. This allows a subsequent deposition of a barrier layer and/or a copper interconnect in the via and/or trench, as will be described in more detail below and with respect to the first and second embodiments.

If desired, the seed layer can be annealed with heat to increase density and improve subsequent enhancement steps. For example, annealing can be carried out for at least 5 minutes, at least 10 minutes, or at least 20 minutes. Annealing temperature can be for example at least 100° C., at least 150° C., or at least 200° C. AFM imaging can be carried out before and after annealing and surface area roughness measured. Surface area roughness before and after annealing can be for example 10 nm or less, or 5 nm or less, or 3 nm or less. Annealing can result in a reduction of surface area roughness of 5% to 30%, or 10% to 20%.

In many cases, conformal coatings of the seed layer are desired, and peptide binding and conditions are selected to achieve conformal coating. In many other cases, a selective deposition is desired wherein seed layer is formed in some areas but not others.

Enhancement Layer

After the seed layer is formed on the substrate, a metal layer (i.e., the "enhancement" layer) is selectively deposited on the seed layer, as will be described in more detail below. For example, the seed layer may be located in a via and/or in a trench and the metal film may comprise a barrier layer and/or an interconnect which is selectively deposited in the via and/or trench.

Thus, enhancement steps can be performed on the seed layers so that a metallic film is formed over the seed layer. These enhancement techniques include electro plating and electroless plating. Additional enhancement steps can be, for example, CVD or PVD/Fill. The enhancement step can be repeated until the desired amount of enhancement is achieved. The films can be characterized by scanning probe methods, including AFM, and optical microscopy. The nature of the enhancement can be measured with use of average grain size, linear dimensions, and grain size standard deviations. For example, a first enhancement step can be carried out and a first average grain size measured; then a second enhancement step can be carried out and a second average grain size measured; and so forth. Average grain sizes can be for example 2,500 $nm^2$ or less, or 1,500 $nm^2$ or less.

If desired, the metal of the seed layer can be the same as the metal of the enhancement step, or they can be different metals. For example, the seed layer can be copper, but is not necessarily copper, when copper is used in the enhancement step.

Film thickness of the enhanced film can be, for example, one micron or less, 500 nm or less, 400 nm or less, 300 nm or less, 200 nm or less, or 100 nm or less. Exemplary ranges include 50 nm to 500 nm, or 100 mm to 200 nm. For the enhancement layer, surface area roughness before and after annealing can be for example 10 nm or less, or 5 nm or less, or 3 nm or less. Annealing can result in a reduction of surface area roughness of 5% to 30%, or 10% to 20%.

The temperature of the enhancement step can be for example 100° C. or less, 80° C. or less, 60° C. or less, or 40° C. or less. Enhancement growth can be carried out with each step of for example one minute to 300 minutes, or two minutes to 100 minutes. Temperature and time can be adjusted as needed for a particular application.

The final film, including final copper films, can be tested for resistivity. Resistivity can be, for example, 100 μΩ-cm or less, 50 μΩ-cm or less, 10 μΩ-cm or less, or 1 μΩ-cm or less. Resistivity can be, for example, about 0.01 μΩ-cm or more, or about 0.1 μΩ-cm or more. In general, resistivity should be similar to bulk copper which is 1.7 μΩ-cm. Resistivity range can be, for example, about 1.5 to about 4, or about 1.7 to about 2.6 μΩ-cm.

Metal deposition processes, including electroless metal deposition, electrodeposition, and seed layers, are described in Madou, *Fundamentals of Microfabrication, The Science of Miniaturization*, $2^{nd}$ Ed., CRC Press, 2002, pages 344-357, which is hereby incorporated by reference in its entirety. Copper deposition is particularly described. Electroless deposition is described in, for example, U.S. Pat. Nos. 5,891,513 and 5,830,805, which are hereby incorporated by reference in their entirety. Furthermore, copper electroless plating compositions and methods are known. For example, formaldehyde-based EP copper bath can be used. Another example is amine borane reducing agents and ligands based on neutral tetradentate nitrogen donors. See, for example R. Jagannathan et al., *IBM J. Res. Develop.*, Vol. 37, No. 2, March 1993, pages 117-123, which is incorporated herein by reference in its entirety. An example of electroless gold deposition is Kato et al., J. Electrochem. Soc., 149, C164 (2002), which is hereby incorporated by reference in its entirety. Another example of electroless deposition of thin metallic films is Pinto et al., *Polymer Preprints*, 2003, 44(2), 138-139, which is hereby incorporated by reference in its entirety. Electroless plating of gold and gold alloys is described in Okinaka, Chapter 15, "Electroless Plating of Gold and Gold Alloys, pages 401-420 (from Electroless Plating-Fundamentals and Applications, Ed. Mallory, Glenn O.; Hajdu, June B, 1990, William Andrew), which is hereby incorporated by reference in its entirety.

The process can further comprise the step of planarizing the metal layer located in a trench to produce a planarized metal layer in the trench, such that the top surface of the metal layer and the top of the trench are co-planar. The planarizing step can be carried out by, for example, chemical mechanical polishing (CMP). See for example Smekalin et al., "Tuning the Process Flow to Optimize Copper CMP," Solid State Technology Wafer News, Microlithography World. Such planarization steps are conducted for metal interconnects made by the damascene and dual damascene processes, as will be described in more detail with respect to the first and second embodiments.

For all of the approaches, the biological peptide may be annealed after the seed layer formation step, but before the electroless plating, or after the electroless plating step, or not at all, depending on application and functional need. Annealing can improve conductivity or adhesion. The temperature of annealing can be, for example, about 400° C. or less, or about 300° C. or less, or about 200° C. or less. The annealing time can be for example at least about 15 minutes, or at least about 30 minutes, or at least about 60 minutes. This can, for example, improve resistivity. Furthermore, the anneal can volatilize the biological agent to remove it from the completed device. It is possible that some biological residue remains between the substrate and the seed layer.

First Embodiment—Seeded Barrier Layer Deposition

Figure 18A:
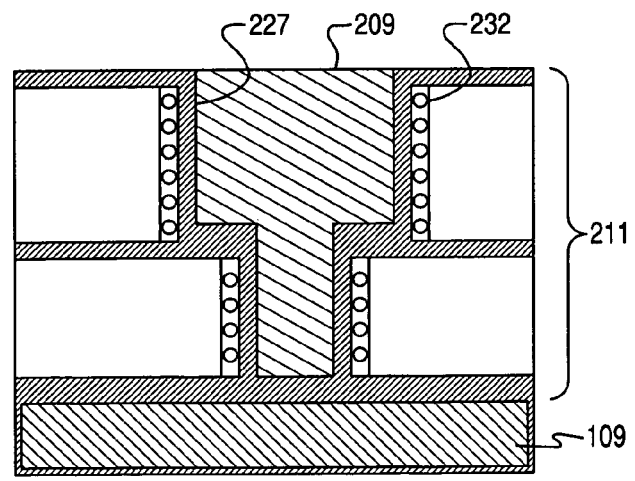

FIG. 18A shows the completed device of the first embodiment. In the device, the planarized copper interconnect 209 is located in electrical contact with an underlying barrier layer 227 which electrically contact metallization 109, such as a lower level copper interconnect. The barrier layer 227 and the copper interconnect 209 are located in a trench and/or a via in an interlayer insulating layer 211. The barrier layer 227 is selectively deposited on the nanoparticle based seed layer 232, which may comprise a continuous or a discontinuous metal layer. Optionally, peptide residue from the volatilized peptides may be located between the interlayer insulating layer 211 and the seed layer 232.

A method of forming a seeded barrier layer in a dual damascene process according to the first embodiment will be described. While a peptide is used as an example of a biological agent, it should be understood that the other biological agents may be used instead.

Figure 18B:
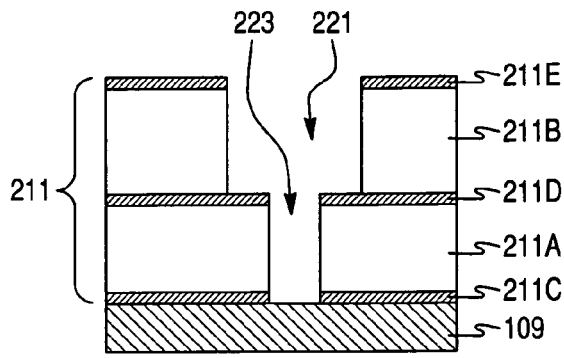

FIG. 18B shows an interlayer insulating layer 211. The interlayer insulating layer may comprise one or more inorganic and/or organic (i.e., high-k) insulating sublayers. The interlayer insulating layer 211 is provided to separate two interconnect metallization levels or to separate the lowest interconnect metallization level and the electrodes which contact the semiconductor device. The semiconductor device may be formed on (i.e., over and/or partially in) a silicon wafer or other supporting substrate (not shown in FIG. 18B). As shown in FIG. 18B, layer 211 is located over an underlying interconnect metallization level 109.

The interlayer insulating layer may comprise several organic high-k dielectric sublayers 211A, 211B, such as fluorinated or non-fluorinated organic polymer sublayers, separated by inorganic etch stop/hard mask sublayers 211C, 211D, 211E, such as silicon nitride sublayers. Sublayer 211C is a cap layer for the interconnect 109. Sublayer 211C material may also comprise a conductive cap layer, such as a cobalt alloy described with respect to the third embodiment if the underlying interconnect metallization level 109 comprises copper. Sublayer 211D is an etch stop sublayer and sublayer 211E is a hard mask sublayer.

The interlayer insulating layer contains a trench 221. One or more vias 223 are located in the trench. As shown in FIG. 18B, the via 223 is located in the bottom surface of the trench 221 and connects the trench 221 to the underlying metallization level 109, which may be an underlying interconnect metallization level or an electrode contacting a semiconductor device. The trench 221 may be formed first, followed by the formation of one or more vias 223 in the trench (i.e., a trench-first dual damascene process). Alternatively, one or more vias 223 may be formed first, followed by formation of a trench 221 which is connected to the via(s) (i.e., a via-first dual damascene process). The trench and via(s) may be formed by photolithography or other patterning methods known in the art.

Figure 18C:
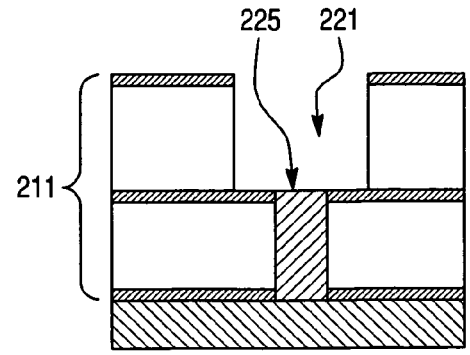

As shown in FIG. 18C, an optional metal plug 225, such as a tungsten plug, is then formed in the via 223 to fill the via. The plug contacts the underlying metallization 109 that was previously exposed in the via. The plug may be formed using any suitable metal deposition methods, such as PVD or CVD.

Figure 18D:
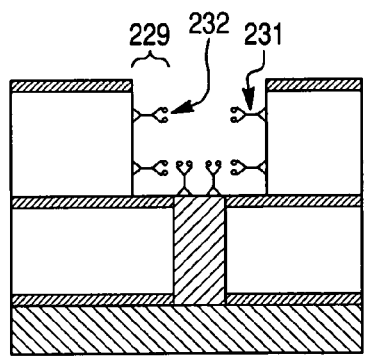
Figure 18E:
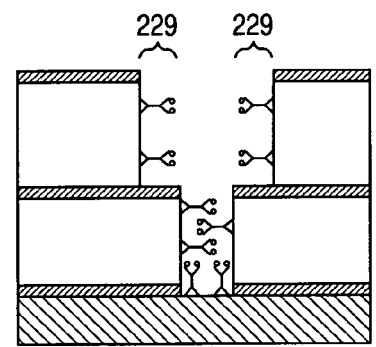

The seed sensitizer 229 is then formed in the trench 221. If the plug 225 has been formed in the via 223, then the seed sensitizer 229 is located in the trench over the plug 225, as shown in FIG. 18D. If the plug 225 has not been formed in the via 223, then the seed sensitizer 229 is also formed in the via, as shown in FIG. 18E.

The seed sensitizer 229 comprises a first biological agent 231, such as, for example, a peptide and a material which will subsequently form a seed layer, such as a nanoparticle 232 seed layer. In general, a seed sensitizer is a layer comprising a biological agent bound to a seed layer material. As described above, the first biological agent 231 may comprise a peptide which contains a first part 233 which is adapted to selectively bind to the substrate and a second part 235 which is adapted to bind to the nanoparticles 232. As described above, the biological agent 231 may be formed first followed by selectively attaching pre-made nanoparticles 232 to the biological agent or selectively nucleating new nanoparticles 232 on the biological agent. Alternatively, the nanoparticles 232 may already be attached to the biological agent 231 when the seed sensitizer 229 is formed.

For example, when the substrate comprises the interlayer insulating layer 211, then the first part 233 of the peptide 231 is adapted to selectively bind to the interlayer insulating layer material. In case of a low-k dual damascene process, if the interlayer insulating layer comprises a low-k organic dielectric covered with an inorganic dielectric hard mask, such as a low-k polymer dielectric covered with a silicon nitride hard mask, then the first part 233 of the peptide 231 may be adapted to selectively bind to the low-k polymer dielectric 211B which is exposed in the trench but not to the inorganic hard mask 211E which covers the remaining top surface of the interlayer insulating layer. This selectivity would allow selective formation of the seed sensitizer 229 in the trench 221 but not on the top surface of the interlayer insulating layer 211. If the via 223 is not filled with the plug 225, then it also allows the selective formation of the seed sensitizer 229 on the sidewalls of the via 223.

If desired, a contrast agent layer (also referred to as a non-stick, mask or inhibitor layer) may be formed on the top surface of the interlayer insulating layer 211. A contrast agent layer may be any biological, organic or inorganic material which prevents or reduces the binding of the seed sensitizer 229 and/or of the subsequent metal layers to the insulating layer 211. The contrast agent layer material may have a selective affinity for the interlayer insulating material over the metal layers. For example, the contrast agent layer may comprise a peptide, protein or amino acid layer.

Alternatively, the first part 233 of the peptide 231 is adapted to selectively bind to the entire interlayer insulating layer 211 and the seed sensitizer 229 may be patterned after formation, as described above.

Furthermore, an additional biological agent which can selectively bind to the underlying metallization level 109 (if the plug is not present) or to the plug 225 (if the plug is present) may also be added to provide a seed sensitizer on the bottom surface of the via 223 or on the plug 225, respectively.

The second part 235 of the peptide 231 may be adapted to selectively bind to nanoparticles 232 and to prevent nanoparticle aggregation. The nanoparticles 232 may be any nanoparticles which upon annealing form a seed layer for selective deposition of the metal layer, such as the barrier layer. For example, the nanoparticles may comprise Au, Pd, Ru or Ni nanoparticles. The first 233 and the second 235 parts of the peptide 231 may be joined to each other by a linker or the first and the second parts may be joined to each other directly. After the seed sensitizer comprising a plurality of peptides 231 and nanoparticles 232 is deposited on the substrate, the first parts of the peptides bind at least to the trench and/or via in the substrate (i.e., directly to the insulating trench wall material and/or to the exposed portion of the plug or underlying metallization), while the second parts 235 of the peptides 231 are bound to the nanoparticles 232. The structure is then annealed to increase the nanoparticle density to complete the seed sensitizer 229 bound to the substrate. Some or all of the peptides may be volatized during this annealing.

Figure 18F:
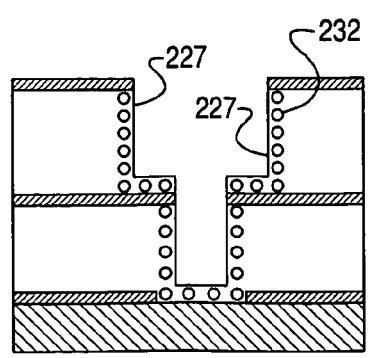
Figure 18G:
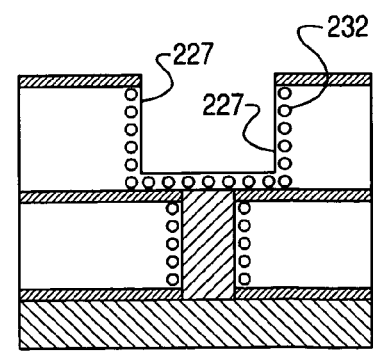

A metal barrier/liner layer 227 is then formed on the seed sensitizer in the trench 221 such that it covers the bottom surface and the sidewalls of the trench, as shown in FIG. 18F. The barrier layer 227 may be deposited from a solution using electroless plating techniques, as described above. If the plug 225 has not been formed in the via 223, then the barrier/liner layer 227 may also cover the bottom and side surfaces of the via, as shown in FIG. 18F. If the plug 225 has been formed in the via 223, then the barrier/liner layer 227 is formed over of the plug in the via, as shown in FIG. 18G. The barrier/liner layer 227 may comprise Ta, TiN, TiSiN, Ti/TiN, Ta/TaN, W/WN, Ta/TiN, Ti/W and/or Al. The peptides 231 may be volatilized by annealing before and/or after the formation of the barrier layer 227.

Figure 18H:
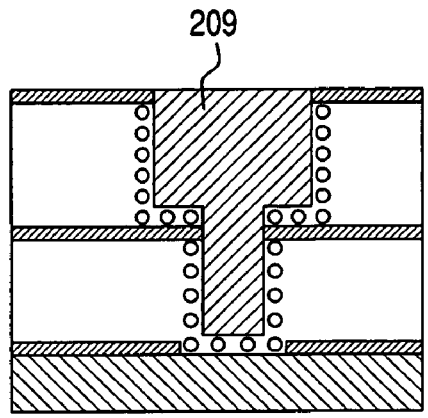
Figure 18I:
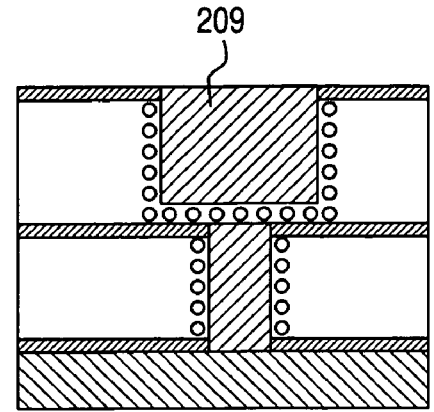

The interconnect layer 209, such as a copper interconnect layer, is then deposited on the substrate. The copper may be deposited from a solution using electroless plating techniques, as described above. The copper selectively binds to the barrier layer 227. If desired, a second seed sensitizer may be used to bind the interconnect layer 209 to the barrier layer 227, as will be described in more detail below. The copper layer 209 fills at least the trench. If the tungsten plug 225 is not formed in the via, then the copper layer 209 also fills the portions of the via 223 that are not filled by the barrier layer 227, as shown in FIG. 18H. If the tungsten plug 225 is formed in the via 223, then the copper layer 209 in the trench 223 is formed over the plug 225, as shown in FIG. 18I.

If the seed sensitizer 229 is formed non-selectively over the entire substrate (i.e., in the trench and over the top surface of the interlayer insulating layer), then the barrier layer 227 and the copper layer 209 cover the entire substrate. The barrier layer 227 and the copper layer 239 are then removed from the upper surface of the interlayer insulating layer 211 by polishing, such as by chemical-mechanical polishing. If the inorganic dielectric hard mask 211E, such as a silicon nitride mask, is present between the upper surface of the interlayer insulating layer 211 and the copper layer 209 and the barrier layer 227, then this hard mask acts as a polish stop. After the polishing step, the copper remains in the trench as the interconnect metallization, as shown in FIG. 18A. As noted above, the copper interconnect 209 either extends into the via 223 to electrically contact an underlying metallization level 109 or electrically contacts a plug 225 located in the via. This completes the dual damascene process.

Alternatively, if the seed sensitizer 229 is formed selectively in the trench but not on the upper surface of the interlayer insulating layer 211, then the barrier layer 227 is selectively formed on the seed sensitizer in the trench and/or in the via. In this case, the polishing step may be optionally conducted to planarize the resulting copper interconnect metallization such that the upper surface of the copper interconnect 209 is planar with the upper surface of the interlayer insulating layer. This completes the dual damascene process. As described above, the peptide portion 231 of the seed sensitizer 229 is volatilized during the process to leave the nanoparticle portion 232 as the seed layer in the final device. A residue of the peptide portion 231 may also remain in the final device. If desired, a seed layer may also be used to selectively deposit the plug 225 into the via 223.

Second Embodiment—Interconnect Deposition

Figure 19A:
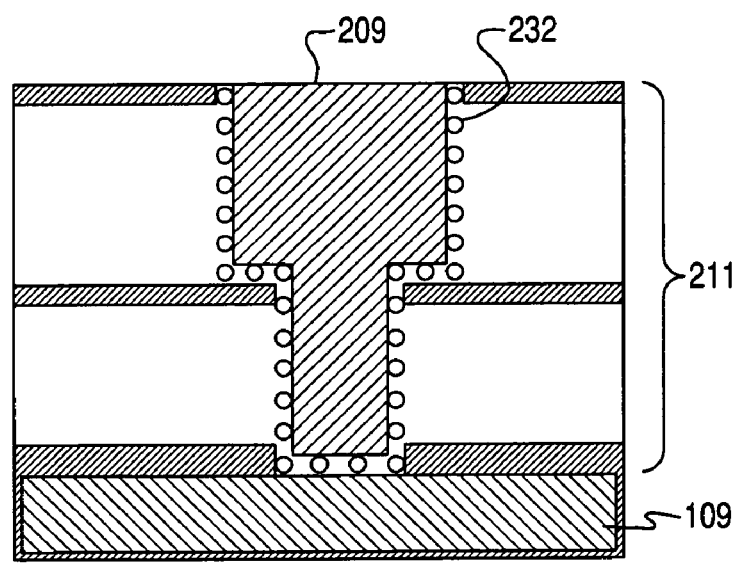

FIG. 19A shows the completed device of the second embodiment. In the device, the planarized copper interconnect 209 is located in electrical contact with an underlying metallization 109, such as a lower level copper interconnect. The copper interconnect 209 is located in a trench and/or a via in an interlayer insulating layer 211. The interconnect 209 is selectively deposited on the nanoparticle based seed layer 232, which may comprise a continuous or a discontinuous metal layer. Optionally, peptide residue from the volatilized peptides may be located between the interlayer insulating layer 211 and the seed layer 232. While a copper interconnect is illustrated, it should be understood that other metal layers, such as nickel or gold may be used instead.

A method of forming a seeded interconnect layer in a dual damascene process according to the second embodiment will be described. While a peptide is used as an example of a biological agent, it should be understood that the other biological agents may be used instead.

Figure 19B:
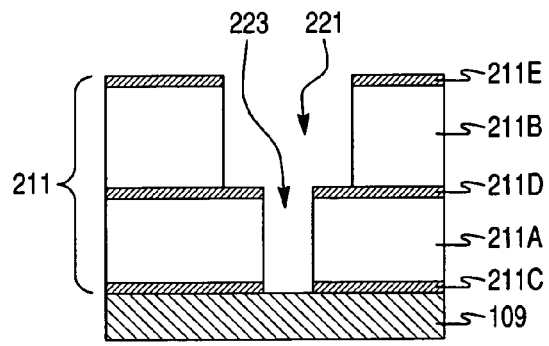
Figure 19C:
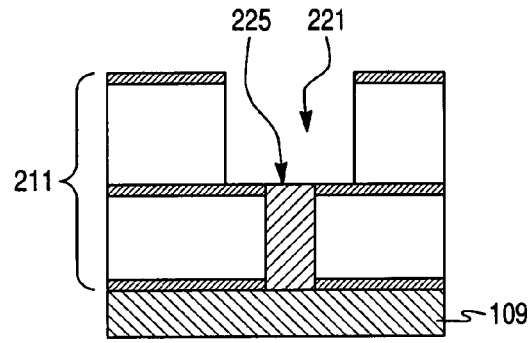

FIG. 19B shows an interlayer insulating layer 211, which is the same as layer 211 shown in FIG. 18B and described above with respect to the first embodiment. The interlayer insulating layer contains a trench 221. One or more vias 223 are located in the trench. As shown in FIG. 19C, an optional metal plug 225, such as a tungsten plug, is then formed in the via 223 to fill the via.

Figure 19D:
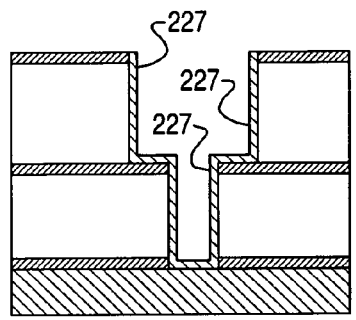
Figure 19E:
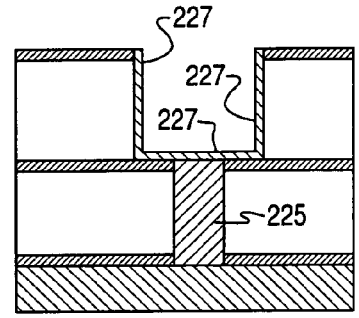

A metal barrier/liner layer 227 is then optionally formed in the trench 221 such that it covers the bottom surface and the sidewalls of the trench. If the plug has not been formed in the via 223, then the barrier/liner layer 227 may also cover the bottom and side surfaces of the via, as shown in FIG. 19D. If the plug 225 has been formed in the via 223, then the barrier/liner layer 227 covers the exposed upper portion of the plug in the via, as shown in FIG. 19E. The barrier/liner layer may comprise Ta, TiN, TiSiN, Ti/TiN, Ta/TaN, W/WN, Ta/TiN, Ti/W and/or Al. As discussed with respect to the first embodiment, the barrier layer 227 may be formed using a seed sensitizer which includes a peptide and nanoparticles. Alternatively, the barrier layer 227 may be formed using conventional semiconductor deposition methods, such as CVD, sputtering, plating, etc. If desired, the barrier layer 227 may be omitted.

Figure 19F:
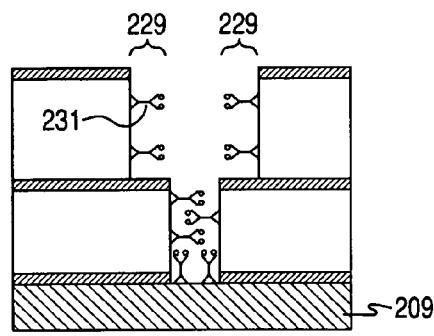
Figure 19G:
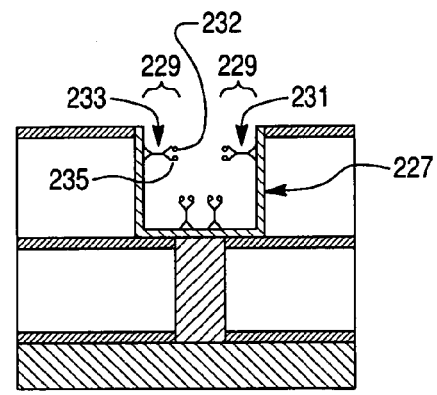

The seed sensitizer 229 is then formed in the trench 221. If the plug 225 has not been formed in the via 223, then the seed sensitizer 229 is also formed in the via, as shown in FIG. 19F (optional layer 227 is omitted for clarity from this figure). If the plug 225 has been formed in the via 223, then the seed sensitizer 229 is located in the trench over the plug 225, as shown in FIG. 19G. If the barrier/liner layer 227 is present, then the seed sensitizer 229 is formed over the barrier/liner layer 227.

The seed sensitizer 229 comprises a first biological agent 231, such as, for example, a peptide, and nanoparticles 232. As described above, the first biological agent 231 may comprise a peptide which contains a first part 233 which is adapted to selectively bind to the substrate and a second part 235 which is adapted to bind to the nanoparticles 232.

For example, when the substrate comprises the interlayer insulating layer 211 which does not contain the barrier/liner layer 227, as shown in FIG. 19F, then the first part 233 of the peptide 231 is adapted to selectively bind to the interlayer insulating layer material. In case of a low-k dual damascene process, if the interlayer insulating layer comprises a low-k organic dielectric covered with an inorganic dielectric hard mask, such as a low-k polymer dielectric covered with a silicon nitride hard mask, then the first part 233 of the peptide 231 may be adapted to selectively bind to the low-k polymer dielectric 211B which is exposed in the trench but not to the inorganic hard mask 211E which covers the remaining top surface of the interlayer insulating layer. This selectivity would allow selective formation of the seed sensitizer 229 in the trench 221 but not on the top surface of the interlayer insulating layer 211. If the via 223 is not filled with the plug 225, then it also allows the selective formation of the seed sensitizer 229 on the sidewalls of the via 223. Alternatively, the first part 233 of the peptide 231 is adapted to selectively bind to the entire interlayer insulating layer 211 and the seed sensitizer 229 may be patterned after formation, as described above. In the case where the barrier layer 227 is not included, an additional peptide which can selectively bind to the underlying metallization level 109 (if the plug is not present) or to the plug 225 (if the plug is present) may also be added to provide a seed sensitizer on the bottom surface of the via 223 or the plug 225, respectively.

If desired, a contrast agent layer described above may be formed on the top surface of the interlayer insulating layer 211. A contrast agent layer may be any biological, organic or inorganic material which prevents or reduces the binding of the seed sensitizer 229 and/or of the subsequent metal layers to the insulating layer 211.

In another example, if the substrate comprises the metal barrier/liner layer 227 located in the trench 221 and/or the via 223 in the interlayer insulating layer 211, as shown in FIG. 19G, then the first part 233 of the peptide 231 is adapted to selectively bind to the metal barrier/liner layer 227, but not to the interlayer insulating layer 211. This selectivity would allow selective formation of the seed sensitizer 229 on the metal barrier/liner layer 227 in the trench and/or via but not on the top surface of the interlayer insulating layer 211.

The second part 235 of the peptide 231 may be adapted to selectively bind to nanoparticles 232 and to prevent nanoparticle aggregation. The nanoparticles 232 may be any nanoparticles which upon annealing form a seed layer for selective deposition of the metal layer. For example, for Cu layer formation, the nanoparticles may comprise Cu, Au, Pd, Ru or Ni nanoparticles. The first 233 and the second 235 parts of the peptide 231 may be joined to each other by a linker or the first and the second parts may be joined to each other directly. After the seed sensitizer comprising a plurality of peptides 231 and nanoparticles 232 is deposited on the substrate, the first parts of the peptides bind at least to the trench and/or via in the substrate (i.e., directly to the insulating trench wall material and/or to the conductive barrier/liner material in the trench), while the second parts 235 of the peptides 231 are bound to the nanoparticles 232. The structure is then annealed to increase the nanoparticle density to complete the seed sensitizer 229 bound to the substrate. Some or all of the peptides may be volatized during this annealing.

Figure 19H:
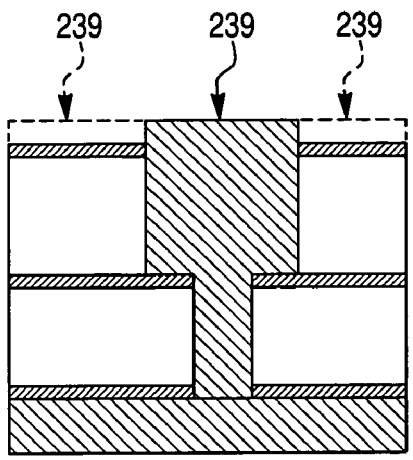
Figure 19I:
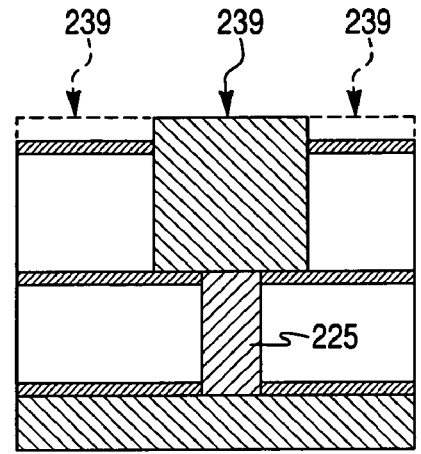

The copper interconnect layer 209 is then deposited on the substrate. The copper may be deposited from a solution using electroless plating techniques, as described above. The copper selectively binds to the seed sensitizer 229. In other words, the copper selectively binds to the metal nanoparticle 232 containing seed sensitizer 229. The peptides 231 may be volatilized by annealing before and/or after the formation of the copper layer 209. The copper layer fills at least the trench. If the tungsten plug 225 is not formed in the via, then the copper layer 209 also fills the via 223 in addition to the trench 221, as shown in FIG. 19H. If the tungsten plug 225 is formed in the via 223, then the copper layer 209 in the trench 223 electrically contacts the plug, as shown in FIG. 19I.

If the seed sensitizer 229 is formed non-selectively over the entire substrate (i.e., in the trench and over the top surface of the interlayer insulating layer), then the copper layer 209 covers the entire substrate. The copper layer 209 is then removed from the upper surface of the interlayer insulating layer by polishing, such as by chemical-mechanical polishing. If the inorganic dielectric hard mask 211E, such as a silicon nitride mask, is present between the upper surface of the interlayer insulating layer 211 and the copper layer 209, then this hard mask acts as a polish stop. After the polishing step, the copper remains in the trench as the interconnect metallization, as shown in FIG. 19A. As noted above, the copper interconnect 209 either extends into the via 223 to electrically contact an underlying metallization level 209 or electrically contacts a plug 225 located in the via. This completes the dual damascene process.

Alternatively, if the seed sensitizer 229 is formed selectively in the trench but not on the upper surface of the interlayer insulating layer 211, then the copper layer 209 is selectively formed on the seed sensitizer in the trench and/or in the via. In this case, the polishing step may be optionally conducted to planarize the resulting copper interconnect metallization such that the upper surface of the copper interconnect 209 is planar with the upper surface of the interlayer insulating layer. This completes the dual damascene process.

Third Embodiment—Cap Layer

In a third embodiment of the invention, a cap layer and a method of forming a cap layer are provided. The formation of the cap layer can be adapted depending on the particular application and application requirements. For example, the cap layer thickness and composition may be selected to reduce electromigration damage and to extend the electromigration lifetime of a conductive layer, such as a copper interconnect formed over a solid state device, such as a semiconductor device. Thus, the material, thickness and characteristics of the cap layer may be selected to provide optimal enhancement of electromigration lifetime of the underlying metal layer.

The cap layer can be made of any material effective in reducing electromigration damage in a metal layer, such as in a copper interconnect. The use of cap layers and effective cap layer materials are known in the art as evidenced by the following references, which are each incorporated by reference in their entirety: Hu et al., RELIABILITY PHYSICS SYMPOSIUM PROCEEDINGS, 42 Annual (2004 IEEE International); Kohn et al., JOURNAL OF APPLIED PHYSICS 92(9):5508-5511 (2002); and U.S. Pat. No. 6,605,424. Examples of materials known to be effective capping materials include silicon nitride ($SiN_x$), Ta/TaN, silicon carbides (including SiC and $SiC_xN_yH_z$), cobalt alloys and nickel alloys. Cobalt alloys include Co—P or Co—B alloys which may further contain one or more of W, Mo and/or Re (i.e., rare earth alloying element(s)). For example, the cobalt alloys include CoMoP, CoReP, CoP, CoWB and CoWP alloys, such as $Co_{0.9}W_{0.02}P_{0.08}$ and $Co_{0.9}P_{0.1}$. Nickel alloys include NiP or NiB alloys which may also contain one or more of Cu, Pd, Co, W, Mo and/or Re, such as NiCuP, NiPdP, NiCoP, NiWP, NiMoP or NiReP. More than one type of material can be used to form the cap layer. For example, one or more of Ta, Ru, Ti, W, titanium nitride and/or tantalum nitride can be used together with a cap layer material which is deposited by plating.

The cap layer is formed using a seed sensitizer comprising at least one biological agent, such as those described herein. For example, the biological agent can be a peptide or a bifunctional amino acid. Other types of biological agents described above may also be used. The biological agent has at least one binding site moiety or domain (i.e., a first part), which selectively binds to a conductive material, such as Cu. The biological agent may be selected so that it doesn't substantially bind to background material, such as the dielectric material of the interlayer insulating layer. For example, in some embodiments less than 5% of biological agent binds to background material, in some embodiments less than 2% of biological agent binds to background material, and in some embodiments less than 1% of biological agent binds to background material. Alternatively, the biological agent may be selectively deposited by stamping or it may be deposited on the entire substrate followed by pattering. In this case, the biological agent does not necessarily have to have a binding site moiety or domain which selectively binds to the underlying metal layer.

The biological agents can be produced by any method. Such methods of forming biological agents with material binding specificity and examples of specific biological agents are known in the art, as evinced by the references cited herein. For example, peptide libraries and biopanning can be used to select biological agents for use in forming the cap layer.

In addition to binding to the conductive material, the biological agent is also selected to direct the formation of the cap layer by directing the formation of a cap seed layer. Such a bifunctional biological agent can be referred to as a sensitizer. The cap material can then be selectively deposited on the cap seed layer. Accordingly, the nanoparticle seed layer material is selected to allow the selective formation of the cap layer on the cap seed layer. Examples of nanoparticles that can be used for the cap seed layer include Au, Pd, Ru, Ni, Fe, Rh, Co and their alloys, such as Co, CoP, CoWP, CoB, CoWB, CoPd, CoPt, etc. The nanoparticles can bind to the biological agent either before or after the biological agent is applied to the conductive material, such as the copper interconnect. For example, preformed nanoparticles may be placed in contact with the biological agent. Alternatively, the biological agent can also be selected to nucleate the nanoparticles from one or more precursor materials, as described above. The use of biological agents to form nanoparticles is known in the art, such as the references cited herein. The nanoparticle cap seed layer can be fused, such as by a thermal process, either before or after the deposition of the cap material.

Figure 20A:
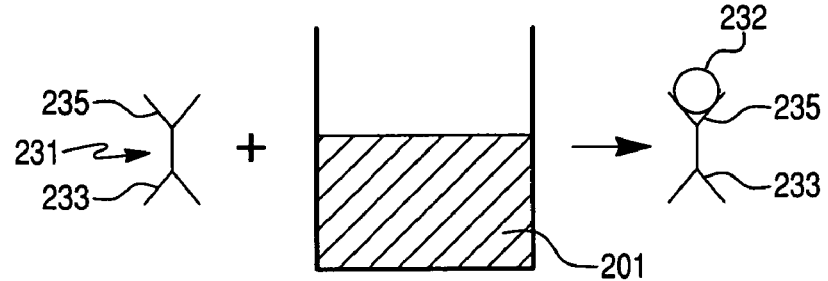

FIGS. 20A-20D illustrate a method of forming the cap layer on a metal layer according to the second aspect of the second embodiment. As shown in FIG. 20A, the biological agent 231, such as a peptide is formed from a first part or construct 233 having a binding affinity for copper or other interconnect metal and a second part or construct 235 having a binding affinity for nanoparticles 232 which can act as a nucleation seed for a cap layer. The parts 233 and 235 may be coupled directly to each other or by using a linker. The nanoparticles 232 may be coupled to part 235 (i.e., binding site 235) of agent 231 by combining the biological agent 231 with a nanoparticle precursor solution 201. Thus, a seed sensitizer comprising biological agent capped nanoparticles is formed in the solution. Alternatively, the biological agent can be pre-adsorbed and then used to "capture" ions or pre-formed nanoparticles (such as metal ions or nanoparticles) from solution.

As shown in FIG. 20B, the seed sensitizer 229 is deposited on a substrate. The substrate contains the copper interconnect 209 or another conductive layer at least in a trench in the interlayer insulating layer 211. For example, the seed sensitizer 229 can be provided from a solution and/or formed into a dispersion. The solution or dispersion can then be applied to the substrate, such as by spraying the dispersion onto the substrate.

As shown in FIG. 20C, the deposition of the seed sensitizer 229 is followed by a washing step to remove the seed sensitizer from the interlayer insulating layer 211 while leaving the seed sensitizer 229 mostly bound to the copper interconnect 209 due to the binding affinity of the part 233 of the seed sensitizer to copper. The washing can be performed using any solvent that is compatible with the substrate, that will not substantially disrupt the binding of the seed sensitizer 229 to the interconnect 209.

Alternatively, the seed sensitizer 229 may be formed by selective stamping and/or by coating following by patterning. If desired, a contrast agent layer described above may be formed on the top surface of the interlayer insulating layer 211. A contrast agent layer may be any biological, organic or inorganic material which prevents or reduces the binding of the seed sensitizer 229 and/or of the subsequent metal layers to the insulating layer 211.

As shown in FIG. 20D, the prepared surface of the substrate is exposed to a cap layer precursor solution, such as a cobalt alloy electroless plating solution. The cap layer precursor material may comprise an electroless plating solution, such as a Co—W—P or Co—P aqueous solution comprised of metallic ion complexes and a reducing agent, such as sodium hypophosphite, as described for example in Kohn et al., Microelectron. Eng. 55, (2001) 297 and Kohn et al., Mater. Sci. Eng. A302 (2001) 18, incorporated herein by reference.

The cap layer 213 is selectively formed on the copper interconnect 209 due to the binding affinity of the nanoparticles 232 of the seed sensitizer 229 to the cap layer material. The cap layer 213 formation may be followed by an annealing step to remove the biological agent 231 and to enhance the adhesion of the cap layer 213 to the interconnect 209. As described above with respect to the first and second embodiments, a residue of the biological agent, such as a peptide residue may remain in the device.

In another aspect of the third embodiment, the nanoparticles 232 of the seed sensitizer 229 comprise the whole cap layer 213 or a bottom portion of the cap layer. Thus, the nanoparticles are made of a material that can act as an effective cap layer. The nanoparticle cap layer can be further enhanced with an additional cap layer. The additional cap layer can be the same or different than the nanoparticle material. For example, the nanoparticles can be cobalt or cobalt alloy nanoparticles and the enhancement layer can be a cobalt alloy layer, such as CoWP. Together, the nanoparticles and the overlying enhancement layer form the cap layer. The cap layer can be placed on an upper surface of the copper interconnect and/or on any exposed side surface of the interconnect.

Seeded and Capped Dual Damascene Copper Interconnect

FIG. 21 shows a completed seeded and capped dual damascene copper interconnect structure. Reference numbers 232A, 232B and 232C show the possible location of the fused nanoparticles of the seed layers and the biological agent residue, such as a peptide residue, which are used to selectively deposit the metal layers. Thus, the fused nanoparticles and/or the peptide residue may be located in any one, two or all three locations. Furthermore, if a biological contrast agent is used, then contrast agent residue 241 may be located on top of the interlayer insulating layer.

Seeded Display Device Bus Line

While a dual damascene interconnect was used as an example of biologically seeded deposition, metal layers in other electronic devices may also be formed using the biologically seeded method. For example, FIG. 22 shows an example of a display device bus or conductor line which is formed using a biological seed layer. The bus line may be formed in any suitable display device, such as a liquid crystal display (LCD), plasma display, LED display or organic light emitting diode (OLED) display.

As shown in FIG. 22, the bus line 309 is formed over a substrate 301, such as a glass, plastic, quartz or other transparent or non-transparent substrate. The bus line 309 may connect devices, such as transistors in an active matrix configuration to driver circuits. In this case, the seed sensitizer 229 may be formed on the substrate 301 in a bus line pattern using stamping or patterning. The bus line 309 is then selectively formed on the seed sensitizer 229. For example, the bus line may comprise an electrolessly plated copper layer 310 selectively formed on the seed sensitizer and a nickel layer 312 selectively formed on the copper layer by electroless plating or other methods. Thus, photolithographic patterning of the metal layers of the bus line 309 is not required.

After annealing, the peptide portion of the seed sensitizer is volatilized. The completed display device includes the bus line 309 formed on a fused nanoparticle seed layer 232 portion of the seed sensitizer 229, as shown in FIG. 22. A peptide residue may be located between the substrate 301 and the fused nanoparticle layer 232.

The compositions and methods described herein can be used in dual damascene and other metal deposition processes. The metal layers described above may be used in various solid state devices, such as optically active films, OLEDs, active matrix liquid crystal displays (AMLCD) (as described in, for example, U.S. Pat. No. 6,887,776) and other displays, and semiconductor devices including memory devices, such as DRAM, PROM, EPROM and EEPROM, logic devices, such as ASICs and microprocessors, light emitting devices, such as LEDs and lasers and light receiving devices, such as photodetectors and solar cells. Furthermore, while formation of copper layers were specifically described, copper, nickel, gold, platinum, cobalt, silver, palladium, ruthenium, rhodium or alloys thereof can also be made.

Plating Bath Composition

Any suitable plating baths may be used. For example, a CoWP plating bath to plate a CoWP cap layer may have the following recipe:

0.03~0.15 M $Co(OH)_2$,
0.05~0.3 M $H_3PO_2$,
0.1~0.5 M $Na_3C_6H_5O_7$,
0.3~0.6 M $H_3BO_3$,
0.01~0.08 M $Na_2WO_4$,
$NH_4OH$ adjusting pH to 8.0~10.0, 65~85° C.

More generally, a plating bath having the following recipe can be used:

a cobalt salt ($Co^{2+}$) such as, without limitation, $CoSO_4$, $CoCl_2$ or $Co(OH)_2$, a reducing agent, such as a hypophosphite salt ($H_2PO_2^-$) such as, without limitation, $H_3PO_2$, $NaH_2PO_2$, $KH_2PO_2$ or $NH_4H_2PO_2$, a metal chelator, such as a citrate salt ($C_6H_5O_7^{3-}$) such as, without limitation, $H_3C_6H_5O_7$, $Na_3C_6H_5O_7$ or $K_3C_6H_5O_7$, a buffer, such as, without limitation, $H_3BO_3$, ethanolamine, TAPS, bicine, or CHES, and a tungstate salt ($WO_4^{2-}$) such as, without limitation, $Na_2WO_4$, $K_2WO_4$, or $(NH_4)_2WO_4$.

Preferably, the ratio of the molar concentrations of the cobalt salt to the reducing agent (hypophosphite salt) is from 1:3 to 1:5 and the ratio of the molar concentrations of the cobalt salt to the metal chalator (citrate salt) is from 1:2.5 to 1:3.5. If desired, a metal chelator other than the citrate salt may be used. Examples of other metal chelating agents are:
(ethylenedinitrilo)tetraacetic acid (EDTA),
butylenediaminetetraacetic acid,
(1,2-cyclohexylenedinitrilo)tetraacetic acid (CyDTA),
diethylenetriaminepentaacetic acid,
ethylenediaminetetrapropionic acid,
(hydroxyethyl)ethylenediaminetriacetic acid (HEDTA),
N,N,N',N' ethylenediaminetetra(methylenephosphonic)acid (EDTMP),
triethylenetetraminehexaacetic acid (TTHA),
1,3-diamino-2-hydroxypropane-N,N,N',N'-tetraacetic acid (DHPTA),
methyliminodiacetic acid, propylenediaminetetraacetic acid,
1,5,9-triazacyclododecane-N,N',N"-tris(methylenephosphonic acid) (DOTRP),
1,4,7,10-tetraazacyclododecane-N,N',N",N'"-tetrakis(methylenephosphonic acid)
(DOTP), nitrilotris(methylene)triphosphonic acid,
diethylenetriaminepenta(methylenephosphonic acid) (DETAP),
aminotri(methylenephosphonic acid),
1-hydroxyethylene-1,1-diphosphonic acid,
bis(hexamethylene)triamine phosphonic acid,
1,4,7-triazacyclononane-N,N',N"-tris(methylenephosphonic acid (NOTP),
2-phosphonobutane-1,2,4-tricarboxylic acid,
nitrolotriacetic acid (NTA), various salts and free acid of citric acid, tartaric acid, gluconic acid, saccharic acid, glyceric acid, oxalic acid, phthalic acid, maleic acid, mandelic acid, malonic acid, lactic acid, salicylic acid, 5-sulfosalicylic acid, catechol, and gallic acid propyl gallate, pyrogallol, 8-hydroxyquinoline, and cysteine.

Better selectivity was observed when coupling the cysteine $PdCl_2$ sensitization process with an electroless cobalt solution in which the hypophosphite to cobalt ratio was about 3 or greater. The selectivity was assessed by examining plated films using a scanning electron microscope to locate areas in which plating occurred in the spaces between copper lines, i.e. on the low-k dielectric. In addition, the deposited metal film morphology was smooth, continuous and nodule-free when the hypophosphite to cobalt ratio was about 3 or greater, whereas a more granular and discontinuous film with nodules was typical of films plated with lower hypophosphite to cobalt ratios.

In certain applications, it is advantageous to use an alkali free plating solutions since the alkali metal ions (potassium or sodium) present in the solution may act as main mobile ionic contaminants. In particular, the metallic ions can move inside the device, causing a device to fail, as is described in U.S. Pat. No. 6,797,312. Additionally, it is known in the art that halogens can have detrimental effects semiconductor fabrication, thus, it can be advantageous to use a halogen free plating solution.

The following composition ranges of alkali-free bath solution can be used:
0.03~0.15 M $Co(OH)_2$,
0.05~0.3 M $H_3PO_2$,
0.1~0.5 M $(NH_4)_3C_6H_5O_7$,
0.3~0.6 M $H_3BO_3$,
0.01~0.08 M $H_2WO_4$
$NH_4OH$ adjusting pH to 8.0~10.0 at 70~85° C.

One example of the alkali free bath solution is:
0.062 M $Co(OH)_2$,
0.25 M $H_3PO_2$,
0.5 M $(NH_4)_3C_6H_5O_7$,
0.4 M $H_3BO_3$,
0.03 M $H_2WO_4$,
$NH_4OH$ adjusting pH to 9.0~9.5 at 80~85° C.

Thus, the bath contains $NH^{4+}$ instead of $Na^+$ ions. One hour plating on copper surfaces shows a typical composition of Co(91%)W(2%)P(7%) and a good plating selectivity on a 300 nm copper line.

More generally, an alkali-free bath solution having the following composition may be used:
a cobalt salt ($Co^{2+}$) such as, without limitation, $CoSO_4$ or $Co(OH)_2$,
reducing agent, such as a hypophosphite salt ($H_2PO_2^-$) such as, without limitation, $H_3PO_2$ or $NH_4H_2PO_2$,
$(NH_4)_3C_6H_5O_7$,
a buffer, such as, without limitation, $H_3BO_3$, ethanolamine, TAPS, bicine, or CHES, and
a tungstate salt ($WO_4^{2-}$) such as, without limitation, $(NH_4)_2WO_4$.

Preferably, the ratio of the molar concentrations of the cobalt salt to the reducing agent (i.e., hypophosphite salt) is from 1:3 to 1:5 and the ratio of the molar concentrations of the cobalt salt to the $(NH_4)_3C_6H_5O_7$ is from 1:2.5 to 1:3.5. If desired, an alkali free metal chelator other than $(NH_4)_3C_6H_5O_7$ may be used. Alkaki free baths may also be used to place CoP, CoWB and other layers.

WORKING EXAMPLES

The invention is further illustrated with use of the following non-limiting working examples.

Example 1

Formation of Au Nanoparticles in the Presence of Peptides

Figure 1B:
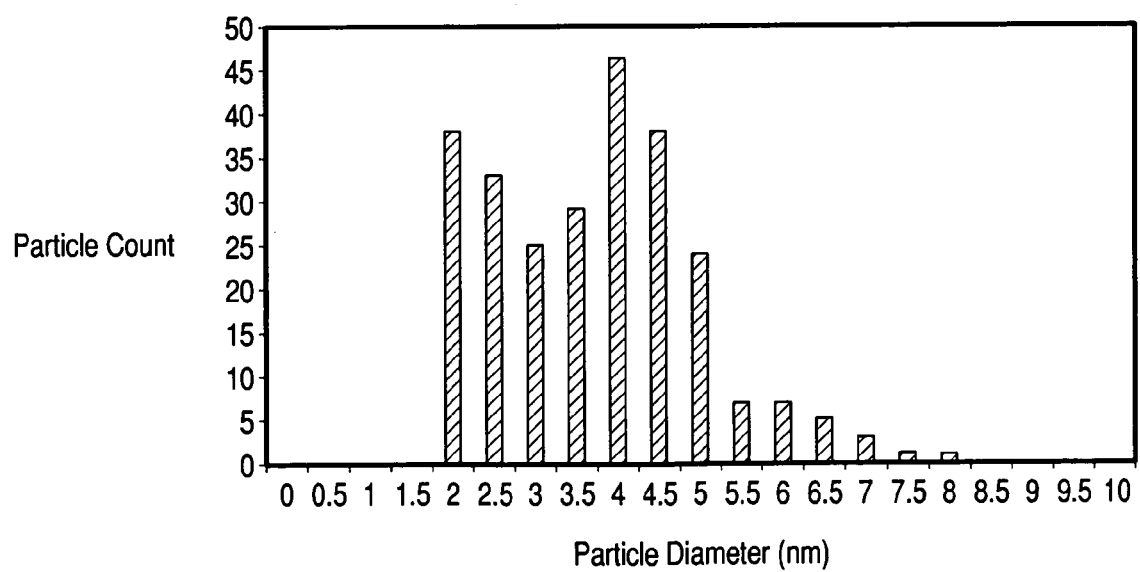
FIG. 1B is a plot of Au particle diameter distribution.

A gold precursor salt, $HAuCl_4$ (2 mM), was interacted with 100 µM of desired peptide in 100 mM Tris-acetate buffer at pH 7.5. $NaBH_4$ aliquots were added over 30-60 min, and spectral changes were measured to determine size of Au nanoparticles being formed. Peptides included peptides 1, 2, 3, and 3222A/B. FIGS. 1A and 1B provide TEM characterization of gold nanoparticles and plot of nanoparticle diameter distribution.

Example 2

Formation of Pd Nanoparticles in the Presence of Peptides

A palladium precursor salt, $K_2PdCl_4$ (which produces a Pd complex ion, $PdCl_4^{2-}$) was interacted with peptides in buffer solutions. $NaBH_4$ aliquots were added over 30-60 min. Stable colloidal solutions were obtained and were further processed by gel filtration. Peptides included peptides 1, 2, 3, and 3222A/B.

Example 3

Ligand Exchange of Gold Nanoparticles with Peptide

Peptides were diluted 1:50 into Au nanoparticle solution to form a 100 µM final concentration of peptide. The mixture was allowed to incubate at room temperature for 30 minutes. The solution was then concentrated by centrifugation at 14,000 r.p.m., and the supernatant was removed. The excess free peptide was then removed and buffers (or water) exchanged using NAP-5 size exclusion purification exchange columns as supplied.

Example 4

Using an Au Seed Layer to Form a Au Film

On a Corning 1737 glass substrate (6×6 mm) was adsorbed 5 µM Streptavidin in 100 mM Hepes (pH 7.5). The streptavidin was soaked with the glass chips in an Ependorff tube for 1 hour w/ gentle rocking. Each glass substrate was washed 2× with deionized water. A seed layer of nanoparticles was then added to the substrate through a streptavidin (surface)-biotin (peptide) interaction. A 1:5 dilution of size exclusion gel filtered nanoparticles in $H_2O$ (originally formed from 2 mM $HAuCl_4$, gold nanoparticles formed using biotinylated peptide 2 & peptide 3) was incubated for 30 minutes on the glass substrate to bind the Au nanoparticles forming the seed layer. The layer was rinsed with DI water. The seed layer on glass was then incubated for 5 minutes with an Electroless Plating (EP) solution (GoldEnhance), forming a metal film. The film was washed with DI water, then an optional second EP step was performed by pipetting 50 µl of solution onto the 1737 glass chips. The film was again rinsed with DI water, then imaged by AFM and optical microscopy.

Figure 3:
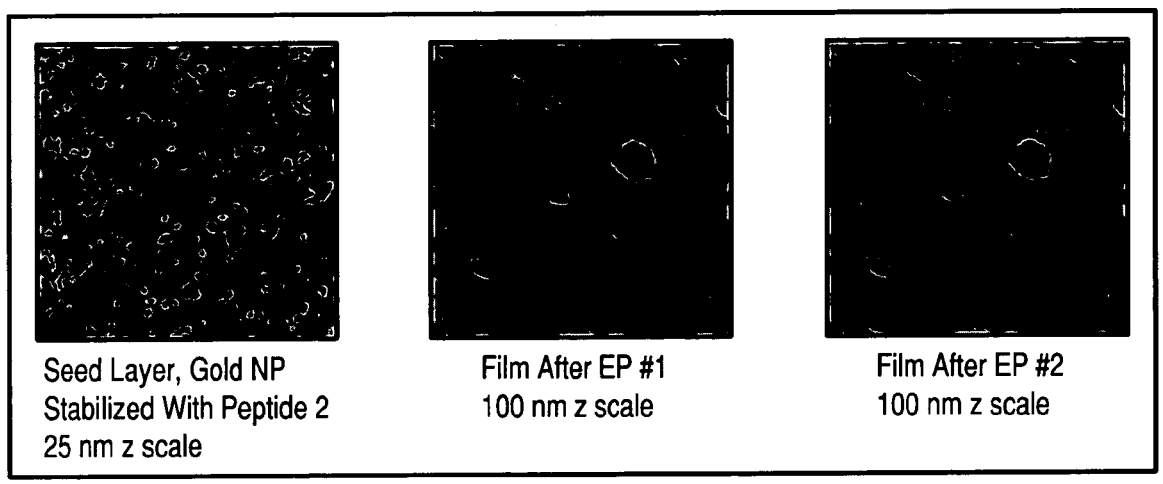
FIG. 3 shows AFM images of a biologically directed Au seed layer, followed by electroless plating (EP) enhancement. The left image shows the seed layer, the middle image shows the film after the first EP step and the right image shows the film after a second EP step.
Figure 4:
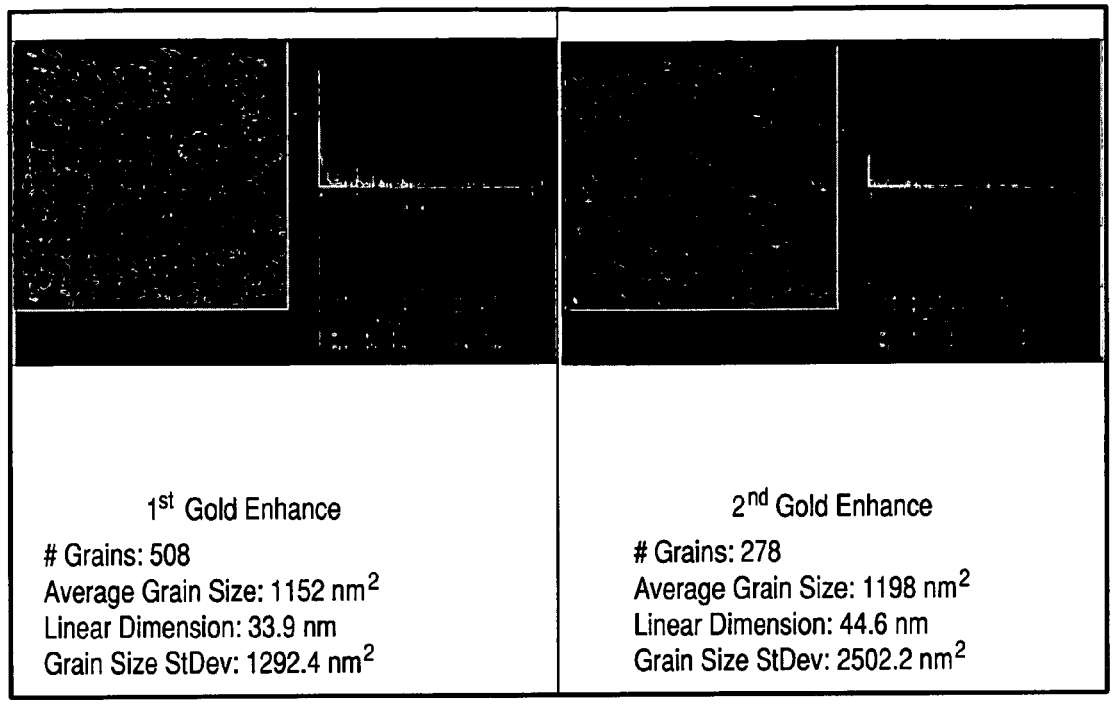
FIG. 4 is an AFM analysis of grain size of the metal film after the first (left image) versus the second (right image) EP step.

FIG. 3 shows images of the Au seed layer for the first EP step followed by a second. Grain size analysis of these images (shown in FIG. 4), reveal an increase in grain size after the second EP step. These images combined show a biologically directed Au thin film.

The film did not grow without the seed layer or the peptide.

Example 5

Patterning

Figure 5:
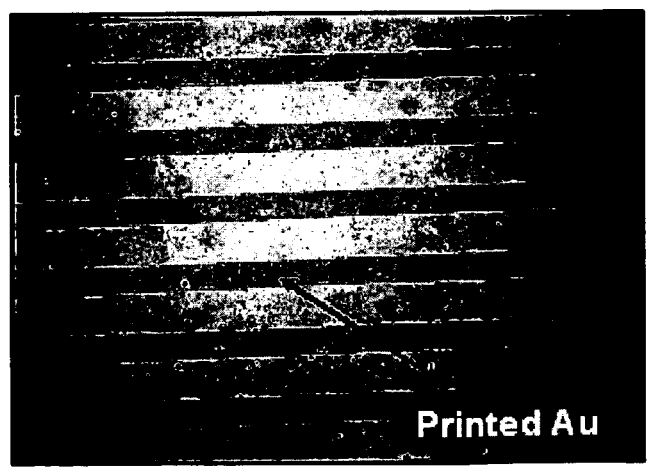
FIG. 5 is a 10× image of PDMS printed biological seed layer.

Additionally, placement of the peptide coated nanoparticles directly (without using streptavidin-biotin) on the glass substrate was performed using a microcontact printing approach. A polydimethylsiloxane (PDMS) stamp was purchased (Platypus Technologies) and prepared by incubation with gold nanoparticles synthesized with biotinylated Peptide 2 (1:5 dilution) for 1 hour (peptide 2 exhibits a high affinity toward glass). The stamp was then rinsed with water and dried with nitrogen. The Au nanoparticle laden stamp was then printed onto a glass microscope slide and imaged via optical microscopy. When the glass substrate was imaged with the printed seed layer, the pattern conveyed by the stamp was immediately apparent (FIG. 5).

Figure 6:
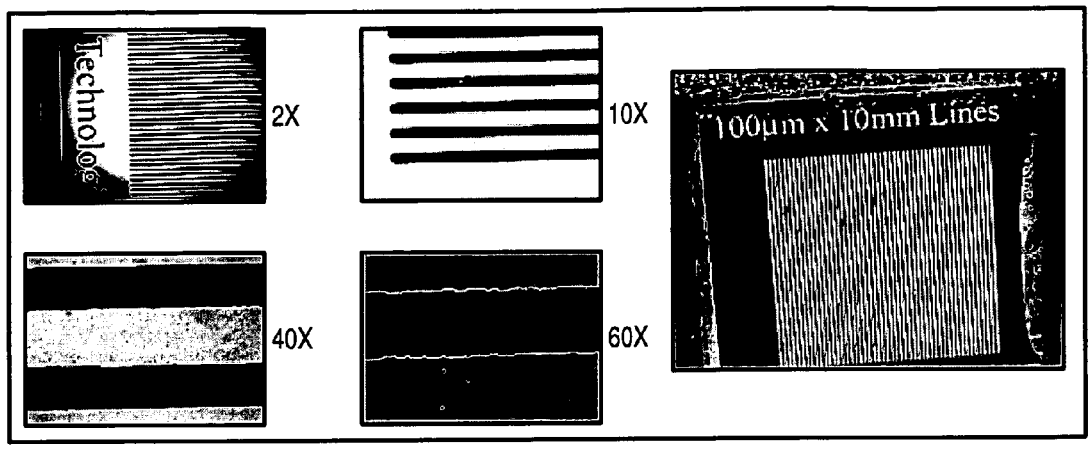
FIG. 6 shows images of peptide-gold nanoparticle seed layer pattern that was further enhanced by Au electroplating.
Figure 7:
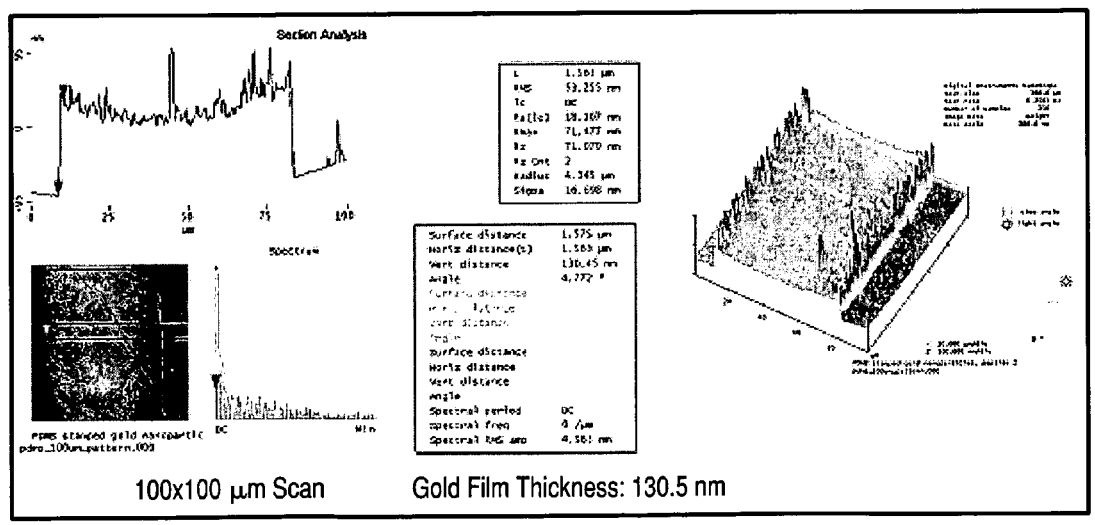
FIG. 7 shows AFM images of the EP Au film pattern.

The glass substrate with the printed substrate was further processed by one application (15 minutes) of the electroless plating solution (GoldEnhance). The gold film was immediately visible, as shown on the far right image in FIG. 6. Optical microscopy images of the electroless plated pattern (images left, FIG. 6) show clear resolution of the printed pattern. One interesting point is that the resolution of the seed was preserved in the subsequent plating experiments, at least to the degree to which the line widths could be measured. Further analysis of the patterned film by AFM revealed a gold film thickness of 130.5 nm (FIG. 7).

Figure 8:
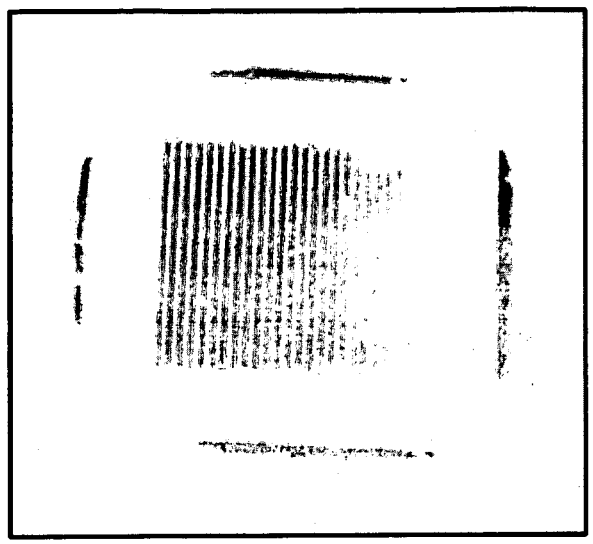
FIG. 8 shows an image of structure made by providing a peptide 2-Au nanoparticle seed layer microcontact printed onto a 1737 glass substrate and annealed, followed by forming a patterned copper film by EP.

The same printed Au-peptide 2 seed was also used to form a copper film by electroless plating (FIG. 8) using the Transene pH 13 solution.

Example 6

Using a Pd Seed Layer to Form a Cu Film

Palladium nanoparticles were synthesized in the presence of biotinylated CALNN peptide (SEQ ID NO: 1). The peptide coated nanoparticles were then interacted with glass substrates coated with Poly-lysine or with Streptavidin. After interaction with the glass, which deposited the Pd seed layer, two different Cu plating solutions were used to evaluate effectiveness of Cu film formation (Transene pH 13 solution and an IBM pH 9 solution). Other parameters were also varied during the electroless plating step, including time, temperature, agitation, glass substrate cleaning, and peptide used to mediate nanoparticle formation.

Figure 9:
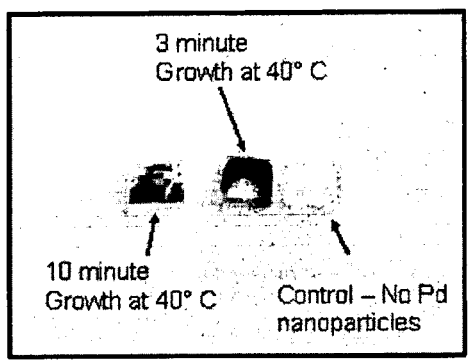
FIG. 9 shows images of CALNN (SEQ ID NO: 1) Pd nanoparticles from pH 13 solution on Streptavidin coated glass for 10 and 3 minute growth times at 40° C. (left and center images, respectively) and of a control sample which lacked Pd nanoparticles (right image).
Figure 10:
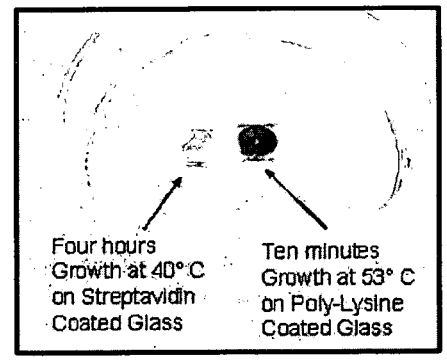
FIG. 10 shows images of CALNN (SEQ ID NO: 1) Pd nanoparticles from pH 9 solution with growth at 40° C. and 53° C. on Streptavidin and poly-lysine coated glass, respectively.
Figure 11:
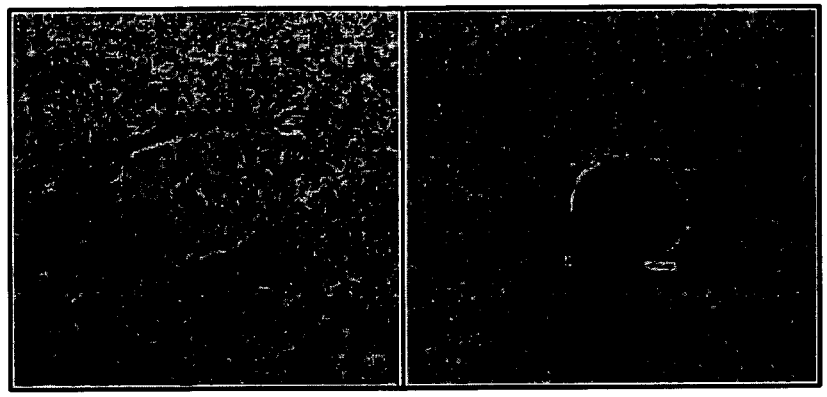
FIG. 11 shows images of CALNN (SEQ ID NO: 1) Pd nanoparticles from pH 9 Solution with twenty minutes growth at 53° C. on poly-lysine coated glass.

FIG. 9 shows images of Cu films grown on Pd seed layers on streptavidin coated glass substrate using a pH13 EP solution. Time and temperature did play a role in the thickness and adhesive properties of the film grown. When no Pd seed layer was present, no Cu film was formed. FIGS. 10 and 11 show resultant Cu films grown from pH9 EP solutions on Pd seeds on streptavidin or poly-lysine coated glass substrates.

Example 7

Using an Au Seed Layer and Enhancing with Electroless Plating to Form a Cu Film

Figure 12:
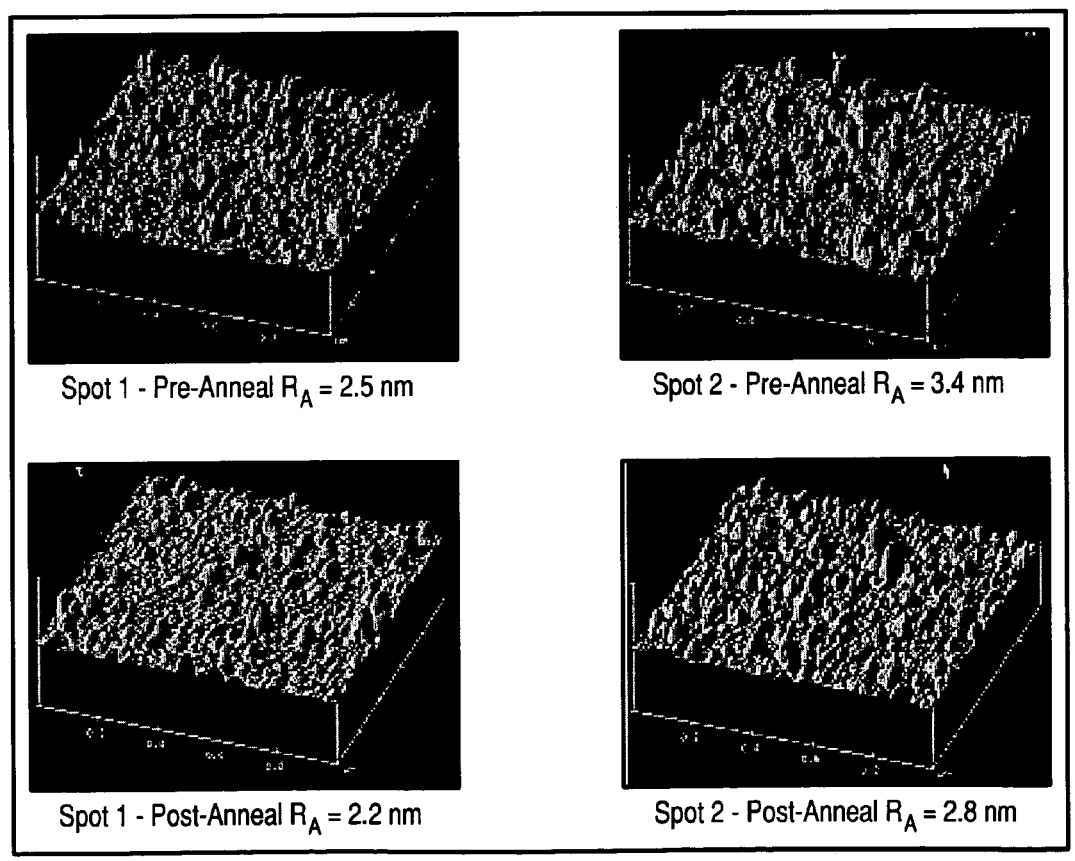
FIG. 12 shows AFM images of Au-Peptide 2 nanoparticle seed layers on 1737 glass.

Cu films were fabricated by incubating a Corning 1737 glass substrate with Au nanoparticle (Peptide 2 stabilized) solution for ten minutes forming a seed layer on the glass. The seed layer was then annealed for 20 minutes at 200 C. This process gives a very dense seed. This seed layer, both pre- and post-annealing step was studied by Atomic Force Microscopy. Analysis of surface area roughness (as shown in FIG. 12) shows that annealing does not change the structure of the seed layer, although the resultant Cu film grows better on an annealed seed layer, it is believed that annealing strengthens seed layer adherence to the substrate in preparation for the high pH electroless plating step.

Figure 13:
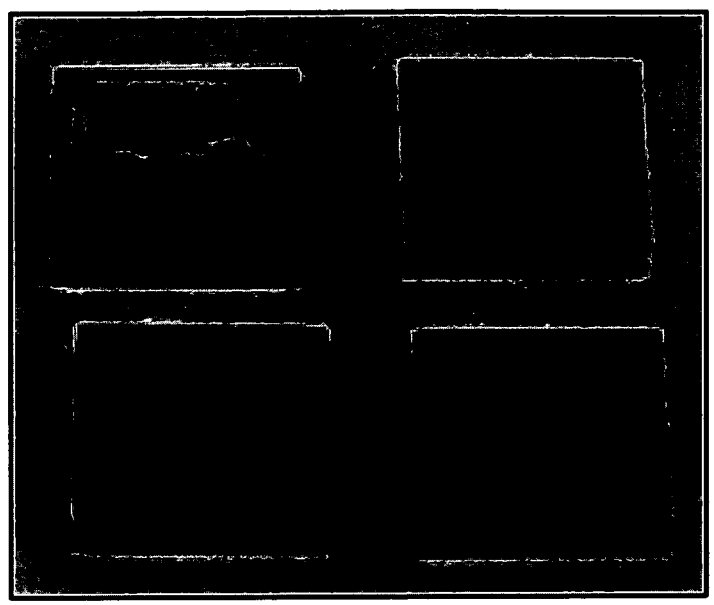
FIG. 13 shows images of growth of thin copper films on Corning 1737 glass using Au nanoparticle seed layers formed using peptide 2.

A Cu film was then grown on the annealed seed layer using a copper electroless plating solution (Transene) for 2.5-4 minutes. Cu films grown in this manner are shown in FIG. 13.

Film thickness and resistivity measurements were then measured by atomic force microscopy and a four point probe station. This AFM analysis is shown in FIG. 13. Thicknesses measured were 70 nm and 100 nm. Resistivity measurements taken were 14 µΩ-cm and 10 µΩ-cm. Note that since a four point probe station was used, the resultant measurements are overestimates of the resistivity of sample due to edge effects.

Figure 14:
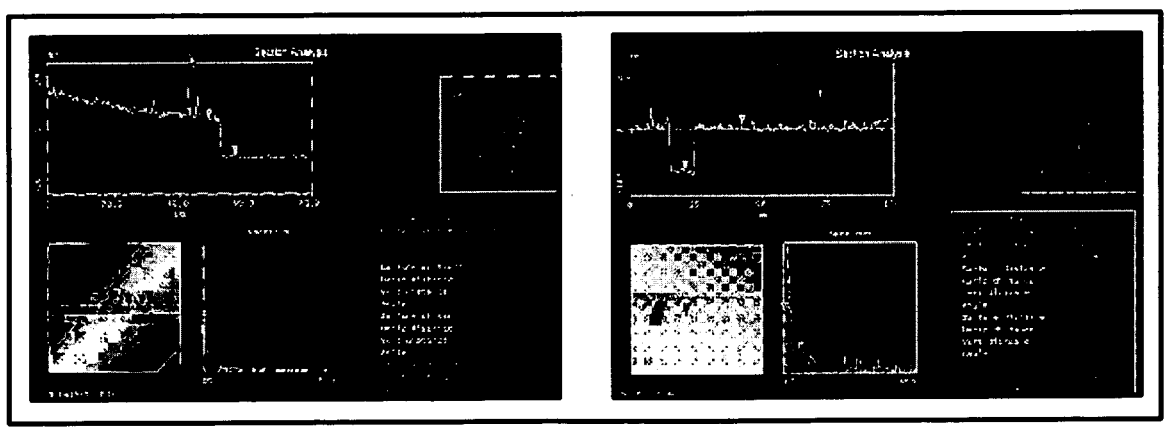
FIG. 14 shows AFM measurements of copper films on Corning 1737 glass.
Figure 15:
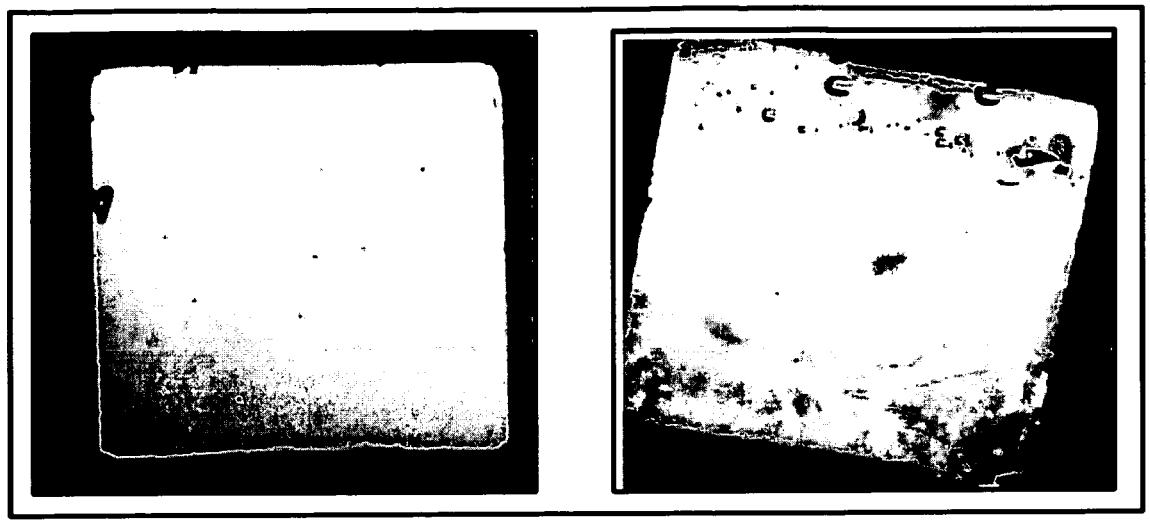
FIG. 15 shows additional copper films formed by using a gold nanoparticle seed layer. The seed layer solution was purified by ultra-filtration.

During these experiments, differing purification processes of the Au nanoparticles used were performed to see if the seed layer influenced the resultant Cu film that was ultimately grown. FIG. 14 shows that copper films were still formed when using Au nanoparticles that had been purified by ultrafiltration prior to introduction to the glass substrate.

Figure 16:
FIG. 16 shows Cu film growth on a tantalum nitride substrate using Au nanoparticles as a seed layer.

Additionally, this Cu film growth on a Au seed layer was tried on a tantalum nitride substrate. The TaN substrate was 100 nm thick and was deposited as a film on $SiO_2$ by sputtering at −50° C. Sputtering of TaN was done by reactive sputtering of Ta in nitrogen gas. It is believed that the substrate had an atomic ratio of Ta to N of about 1.5-2 to 1. The TaN was used as supplied and was incubated for 20 minutes with Au (Peptide 2) nanoparticle solution in 0.1×PBS. The resultant seed layer was then annealed at 200 degrees C. for 20 minutes. A Cu film (FIG. 16) was then grown on the seed layer using an electroless plating solution (Transene) for 3.5 minutes.

Figure 17:
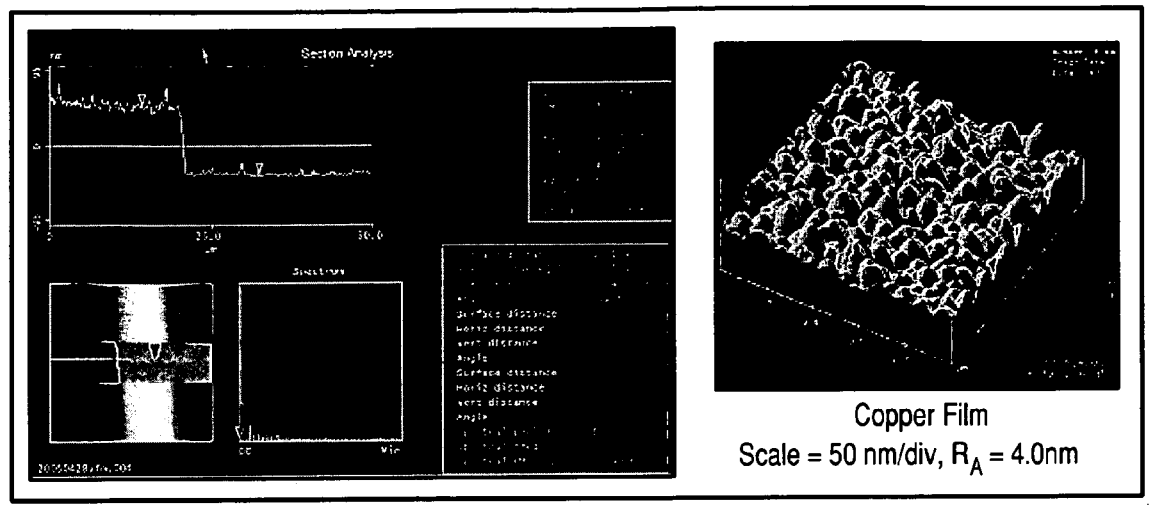
FIG. 17 is an AFM analysis of Cu film growth on tantalum nitride using the Au nanoparticle seed layer.

AFM analysis of the Cu film grown on TaN was performed. Section analysis (FIG. 17 left) of the film showed a thickness of 85 nm. Surface roughness analysis (FIG. 17 right) showed a roughness of 4 nm, similar to films grown on glass.

Example 8

Using a Small Bifunctional Molecule to Form a Cap Layer

While peptides were described above as one example of a biological agent, other materials may be used instead. For example, small bifunctional organic molecules may be used in the selective formation of the metal layer. The bifunctional organic molecules may comprise bifunctional amino acid molecules where one functionality interacts specifically with part of the patterned substrate while the second functionality interacts with a sensitizer agent (i.e., the material of the seed layer) for the plating chemistry. The term "bifunctional molecule" means a single molecule with two or more functional regions.

In the present example, the bifunctional amino acid molecule is a cysteine which is used to nucleate the cap layer for a copper interconnect, bus line or another electrode. As shown in FIG. 23, cysteine has a first functionality which selectively binds to the patterned copper layer but which does not selectively bind to the organic, low-k dielectric layer in which the copper layer is embedded. Cysteine also has a second functionality which binds to a plating sensitizer agent, such as metal ions from a solution (for example $Pd^{++}$ ions which form a Pd sensitizer) or metal nanoparticles from a solution or suspension (for example Pd or Co nanoparticles), as shown in FIG. 23.

It is believed that the use of small bifunctional molecules allows a significantly lower concentration of Pd sensitizer agent than a prior art plating method to selectively plate a cobalt alloy cap layer, such as a CoP, CoWP or CoWB (from a stored CoWB bath) cap layer over a copper pattern. Since the Pd sensitizer agent is expensive, this decreases the cost of the process. Also, selectivity is improved since lower concentrations of the Pd sensitizer lead to less non-specific adsorption of the Pd sensitizer agent and subsequently more selective plating of the Co alloy onto both the copper and the dielectric regions on the wafer. With the use of the small bifunctional molecules, the sensitizer agent concentration is reduced to levels that are believed to be generally insufficient to catalyze the plating reaction with the prior art methods. For example, cysteine allows the use of 10 ppm or less of $PdCl_2$ in 0.5 M $H_2SO_4$, such as 5 ppm or less, for selective CoP and CoWB (from a stored CoWB bath) plating over a copper pattern. In contrast, in the prior art methods, it is believed that a greater concentration of $PdCl_2$ in 0.5 M $H_2SO_4$ is required for selective CoP and CoWB (from a stored bath) deposition over a copper pattern. It should be noted that while the present example illustrates plating of CoWB and CoP on Pd sensitizer agent, other metals, such as cobalt alloys which can be selectively plated on a Pd sensitizer agent may also be used. Such cobalt alloys include CoWP. It should also be noted that the concentration of $PdCl_2$ described herein refers to a concentration of $PdCl_2$ in 0.5 M $H_2SO_4$. This $PdCl_2$ can be converted to concentration of Pd using the following formula: ppm Pd=0.6×ppm $PdCl_2$.

Furthermore, high sensitizer agent concentration in the prior art methods may lead to non-selective deposition of the sensitizer agent (i.e., the sensitizer agent is deposited on the entire substrate rather than just on an underlying metal pattern). This means that a subsequent metal plating step, such as a CoP cap layer plating step, is also not selective. Thus, the bifunctional molecules improve the selectivity of the deposition of the cap layer. Without wishing to be bound to a particular theory, it is believed that the enhanced selectivity may be due to the concentration dependence of standard adsorption isotherms. Lower Pd concentration may provide a more favorable placement of the $Pd^{++}$/low-k dielectric adsorption isotherm. Furthermore, if the cap layer is used as a seed for the selective deposition of overlying metallization, such as upper level barrier and/or copper interconnect metallization, then the selectivity of the deposition of the upper level metallization is also improved.

In the general method of the present example, the deposited copper layer is exposed to the sensitizer agent and localizes the deposition of the sensitizer agent. The cap layer is then selectively plated in the areas containing the sensitizer, as shown in FIG. 23.

Specifically, an exemplary process for CoWB plating includes the following steps:
1. Clean the Cu surface (1 min. in pH 10 NaOH, DI rinse, 1 min. in 2% $H_2SO_4$, DI rinse);
2. Cysteine adsorption (30 sec.-60 sec.): 10 mM cysteine in 0.5 M $H_2SO_4$;
3. DI rinse;
4. Pd activation (30 sec.-45 sec.): 25 ppm or 10 ppm $PdCl_2$ in 0.5 M $H_2SO_4$;
5. DI rinse;
6. Plate CoWB (1 min.): 0.1 M $CoSO_4$, 0.3 M $(NH_4)_3C_6H_5O_7$, 0.03 M $H_2WO_4$, 0.06 M DMAB, (bath stored for more than 12 hours);
7. DI rinse, $N_2$ drying;
8. Optional annealing (2 min.): 250° C. in $N_2$.

In the method described above, the cysteine is first provided onto the Cu surface followed by contacting the cysteine which is bound to the Cu surface with the Pd containing solution.

It should be noted that the solvents, concentrations and process step duration times are merely illustrative and are not considered limiting on the scope of the invention. It is believed that a fresh CoWB plating bath can plate directly on copper surfaces. However, if the bath is stored for more than 12 hours, it becomes less active and does not plate on copper surfaces without adding a Pd sensitizer agent (i.e., Pd plating catalyst) on the copper surface. Thus, if the CoWB plating bath and the semiconductor device are made by different companies, then the transport time of the CoWB bath between the bath manufacturer and the end user reduces the activity of the bath and requires the use of a sensitized copper surface for plating.

FIG. 24 shows an exemplary micrographs in which the use of a sensitizer agent comprising 10 ppm $PdCl_2$ in 0.5 M $H_2SO_4$ (which corresponds to 6 ppm Pd) together with cysteine resulted in the selective plating of a CoWB cap over a copper pattern using the above method. It can be seen from FIG. 24 that less than 10 ppm of $PdCl_2$ sensitizer agent is sufficient to selectively plate a CoWB cap layer over a copper pattern.

FIGS. 25A-25C further illustrate the effect of cysteine on CoWB cap layer formation. FIG. 25A shows Cu and Co maps and a corresponding integrated EDX results for a control wafer containing Cu patterns. No Co peak is observed in the EDX spectra. FIG. 25B shows the results of 10 ppm $PdCl_2$ sensitizer agent activation followed by CoWB plating without the use of cysteine according to a prior art method. No Co peak is observed in the EDX spectra indicating that CoWB did not plate. Thus, the prior art method which lacks cysteine does not allow selective CoWB plating from a CoWB bath stored for more than 12 hours at $PdCl_2$ concentration of 10 ppm or less.

FIG. 25C shows the selective formation of cysteine on the copper pattern followed by activation with 10 ppm $PdCl_2$ sensitizer agent followed by CoWB plating according to the method of the present example. In this case, a Co peak is observed in the EDX spectra indicating that CoWB did selectively plate onto the sensitizer agent on the copper pattern. This is confirmed in the Co map in FIG. 25C. Thus, the method of example 8 does allow CoWB plating at $PdCl_2$ concentration of 10 ppm or less.

Figure 26:
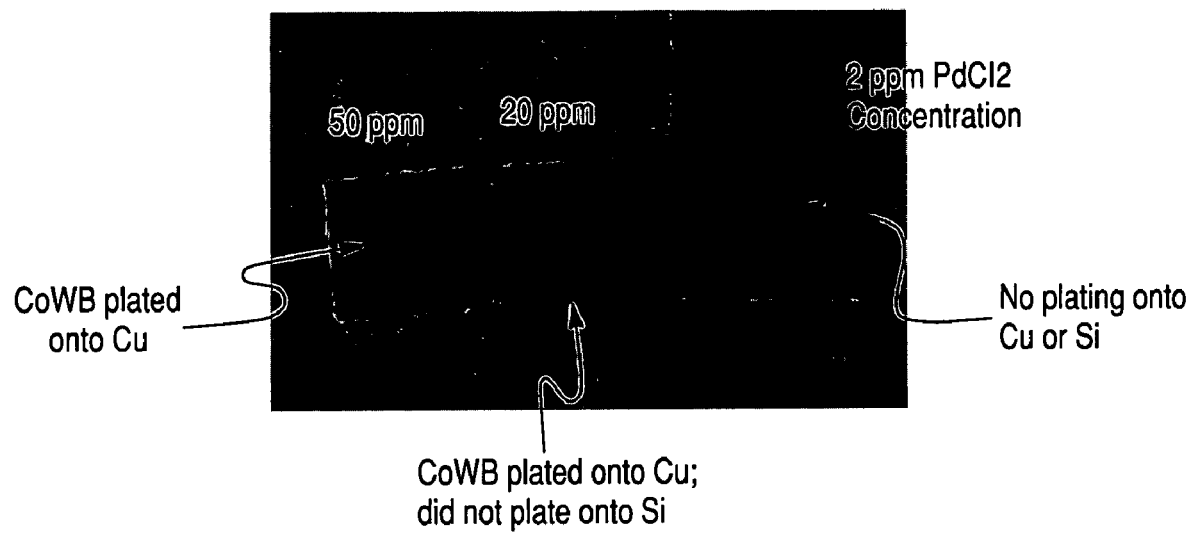

FIG. 26 shows that a higher amount of Pd sensitizer agent is required in the prior art method to selectively plate CoWB than the method of the present example. As shown in FIG. 26, CoWB from a stored bath was first selectively plated onto Cu when 20 to 50 ppm of the $PdCl_2$ sensitizer agent was provided on copper. The Pd sensitizer agent is provided by placing a copper substrate in 20 or 50 or 2 ppm of the $PdCl_2$ sensitizer agent solution such that a $Pd^{++}$ ion selectively reacts with copper and forms Pd on top of the copper surface. The CoWB did not deposit on silicon which was not sensitized with Pd. However, CoWB did not plate onto Cu or Si when 2 ppm of $PdCl_2$ sensitizer agent was provided on Cu. The prior art method includes the following steps:

1. Clean the Cu surface (1 min. in pH 10 NaOH, DI rinse; 1 min. in 2% $H_2SO_4$, DI rinse);
2. Pd activation (30-45 sec.): 50 ppm or 20 ppm $PdCl_2$ in 0.5 M $H_2SO_4$;
3. DI rinse;
4. Electroless CoWB plating (1 min.): 0.1 M $CoSO_4$, 0.3 M $(NH_4)_3C_6H_5O_7$, 0.03 M $H_2WO_4$, 0.06 M DMAB (bath stored for more than 12 hours);
5. DI rinse.

However, the prior art method lacks the cysteine deposition step. Thus, the method of example 8 allows the use of a lower amount of expensive Pd sensitizer agent, such as about 15 ppm or less, for example 5 to 10 ppm, of $PdCl_2$ to selectively plate CoWB from a bath that is stored more than 12 hours.

A different exemplary process for CoP plating according to example 8 includes the following steps:

1. Clean Cu surface (1 m in pH 10 NaOH, DI rinse; 1 min in 2% $H_2SO_4$, DI rinse);
2. Cysteine adsorption (30 s-60 s): 10 mM cysteine in 0.5 M $H_2SO_4$;
3. DI rinse;
4. Pd activation (30-45 s): 5 or 10 ppm $PdCl_2$ in 0.5 M $H_2SO_4$;
5. DI rinse;
6. Plate CoP (1 min): 0.062 M $Co(OH)_2$, 0.25 M $H_3PO_2$, 0.5 M $Na_3C_6H_5O_7$, 0.4 M $H_3BO_3$, $NH_4OH$ adjusting pH to 9.2~9.3, 80 C;
7. DI rinse, $N_2$ drying.

Figure 27A:
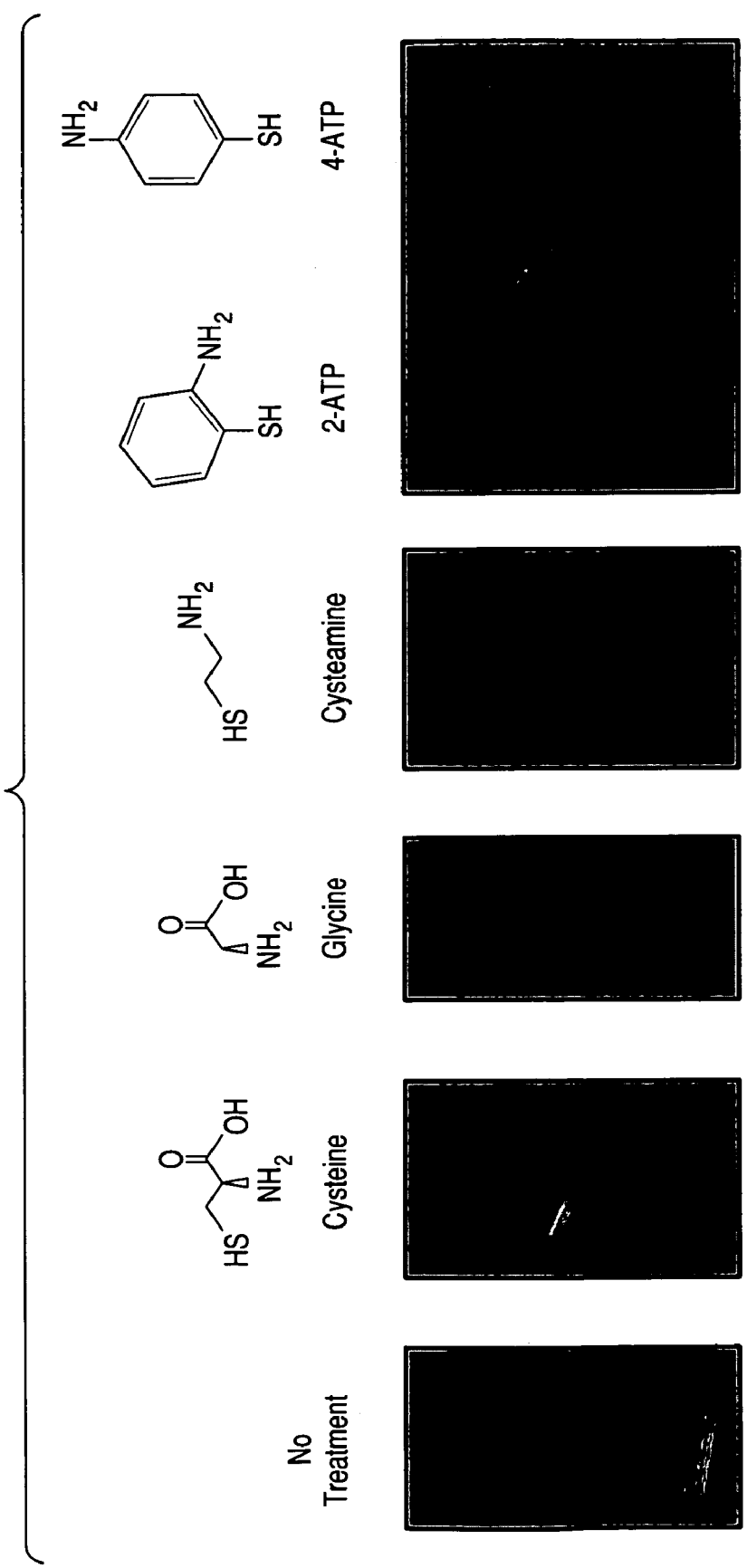
Figure 27B:
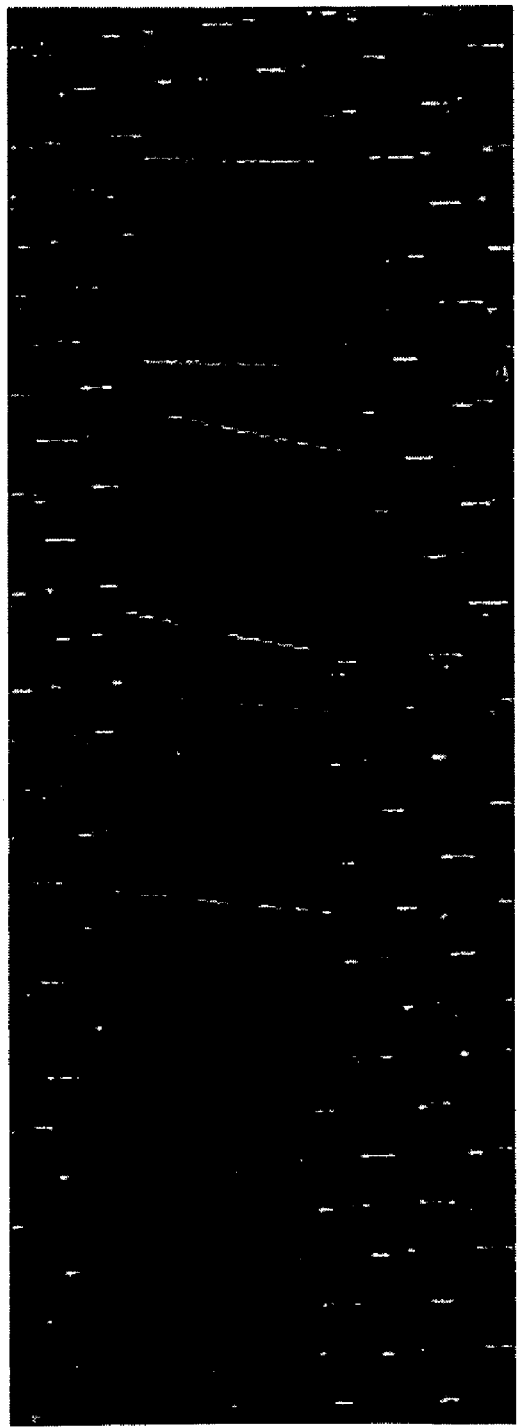

As shown in FIGS. 27A and 27B, only the use of a small organic molecule, such as cysteine, which has a first functionality which selectively binds to the patterned copper layer and a second functionality which binds to a plating sensitizer agent, resulted in consistent selective CoWB (FIG. 27A) and CoP (FIG. 27B) plating under conditions where the above described prior art method does not achieve selective plating. For example, as shown in FIG. 27A, only the copper which was sensitized with cysteine and a low concentration of $PdCl_2$ sensitizer agent (10 ppm or less) allowed consistent selective CoWB plating. The untreated copper and copper treated with glycine, cysteamine or 2-ATP followed by Pd sensitization did not result in consistent CoWB plating. 4-ATP and 3-mercaptopropionic acid also does not appear to allow consistent selective plating of CoWB at low Pd concentration. Thus, only cysteine enabled consistent plating of CoWB under conditions where the prior art process does not plate.

Likewise, as shown in FIG. 27B, only the copper which was sensitized with cysteine and a low concentration of $PdCl_2$ sensitizer agent (10 ppm or less) allowed consistent selective CoP plating. The untreated copper and copper treated with glycine, cysteamine or 3-mercaptopropionic acid does not appear to allow consistent selective plating of CoP at low Pd concentration. Thus, only cysteine enabled consistent plating of CoP under conditions where the prior art process does not plate.

Without wishing to be bound by a particular theory, the present inventors believe that the thiol moiety of cysteine is important to this process since glycine treatment does not enable CoWB or CoP plating. However, the thiol moiety alone is not sufficient since 2-ATP, 4-ATP, and cysteamine do not appear to plate CoWB and cysteamine does not appear to plate CoP at low Pd concentration. Thus, it is believed that cysteine's thiol group interacts with the underlying metal layer, such as Cu, and not the dielectric material to selectively localize cysteine molecules on the metal layer. Pd ions associate with cysteine's carbonyl and/or amine moieties and will initiate CoWB or CoP selective plating. However, since 3-mercaptopropionic acid and cysteamine also do not appear to plate CoWB or CoP at low Pd concentration, it is possible that Pd ions associate with both of cysteine's carbonyl and amine moieties or only with the non-terminal amine moiety. Of course it is also possible that the thiol moiety associates with the Pd ions rather than with the Cu surface. In summary, cysteine has three functional groups (thiol, amine, carboxylic acid). It appears that all three functional groups contribute to the above described process. However, cysteine can still be considered to be a bifunctional molecule having three functional groups, two of which may be cooperating to perform one of the two functions. The result is that cysteine enables consistent plating of CoWB and CoP under conditions where the standard process does not plate. Thus, it is the bifunctionality of the small molecule that apparently provides the ability to plate the metal at a lower sensitizer agent concentration than the prior art. It should be noted that the small organic molecule should not be considered to be limited to cysteine. Cysteine was used to show the advantage of bifunctional versus single functional small organic molecules. Other bifunctional molecules may be used for sensitizer agents other than Pd and for underlying metal layers other than Cu.

FIGS. 28A-D illustrate the effect of cysteine and Pd incubation time on the plating of CoWB. In FIGS. 28A-D, the Pd concentration is 25 ppm $PdCl_2$ in 0.5 M $H_2SO_4$, and cysteine concentration is 10 mM in 0.5 M $H_2SO_4$.

As shown in FIG. 28A, CoWB plated onto a cysteine and Pd sensitized copper pattern after a 2 minute cysteine and a 1 minute Pd incubation time. Likewise, as shown in FIG. 28B, CoWB plated onto a cysteine and Pd sensitized copper pattern after a 1 minute cysteine and a 2 minute Pd incubation time. Likewise, as shown in FIG. 28C, CoWB plated onto a cysteine and Pd sensitized copper pattern after a 1 minute cysteine and a 1 minute Pd incubation time.

The upper micrographs in FIGS. 28A-C show the CoWB deposition while the lower EDX spectra show Co peaks consistent with CoWB plating. The upper micrographs show that the longer Pd incubation time in FIG. 28B resulted in rougher plated CoWB lines. The Cu, Co and Si maps on the right side of FIG. 28C show that Co is selectively deposited over the Cu lines but not over Si substrate regions exposed between the Cu lines.

Figure 28D:
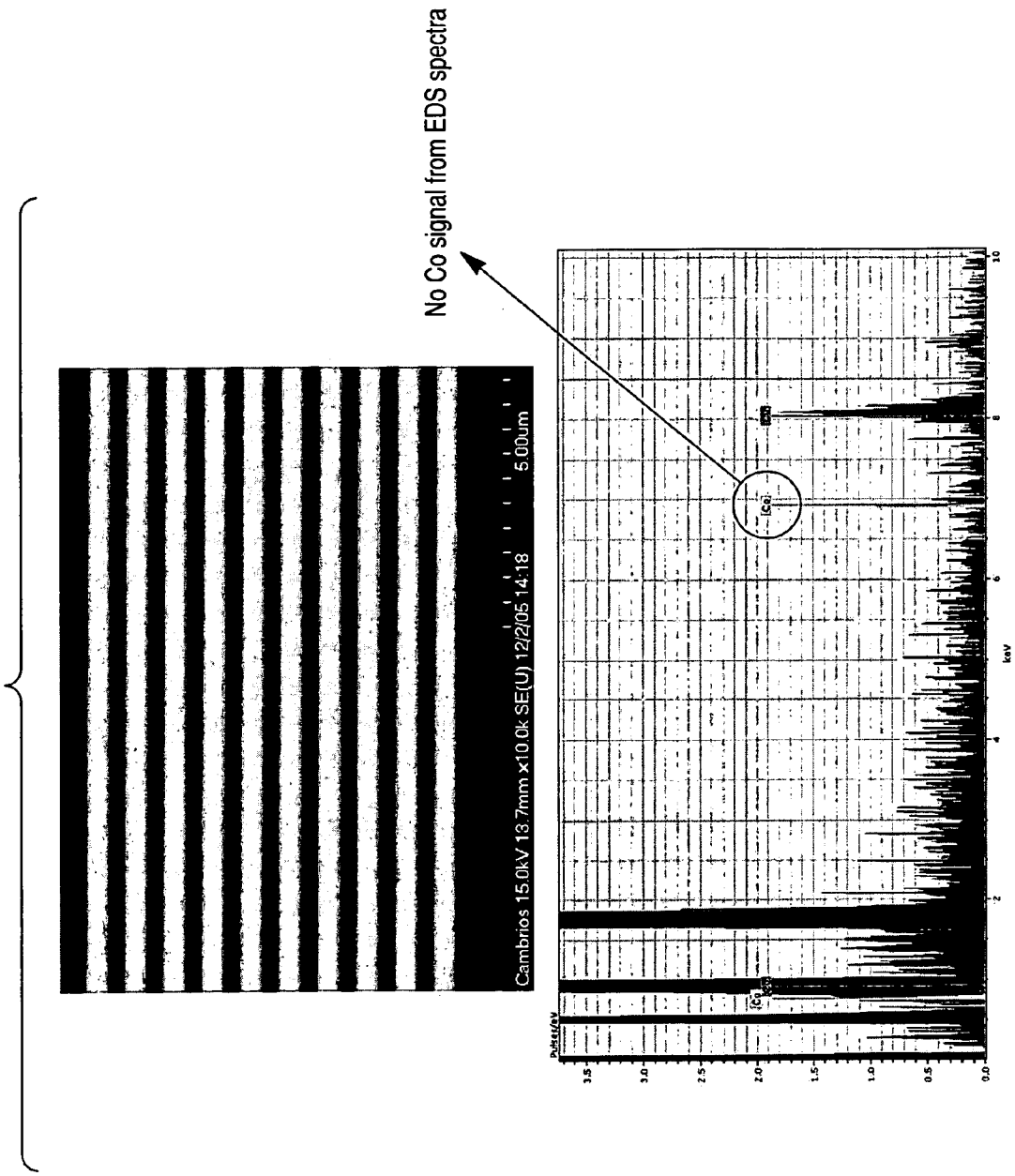

FIG. 28D shows that very short Pd incubation time leads to no selective CoWB plating. CoWB did not plate onto a cysteine and Pd sensitized copper pattern after a 1 minute cysteine and a 30 second Pd incubation time because the Co peak is absent in the EDX spectra in the lower portion of FIG. 28D.

Thus, without wishing to be bound by a particular theory, it is believed that FIGS. 28A-D show that cysteine incubation time does not appear to affect small Cu lines, but Pd incubation time has an effect on Co alloy plating. Longer incubation leads to rough Co alloy lines (FIG. 28B) and shorter incubation time results in no plating at all (FIG. 28D). However, the rough Co alloy lines may also be due to "islands" of Pd sensitization that plate spots of CoWB film on the Cu lines.

Figure 28E:
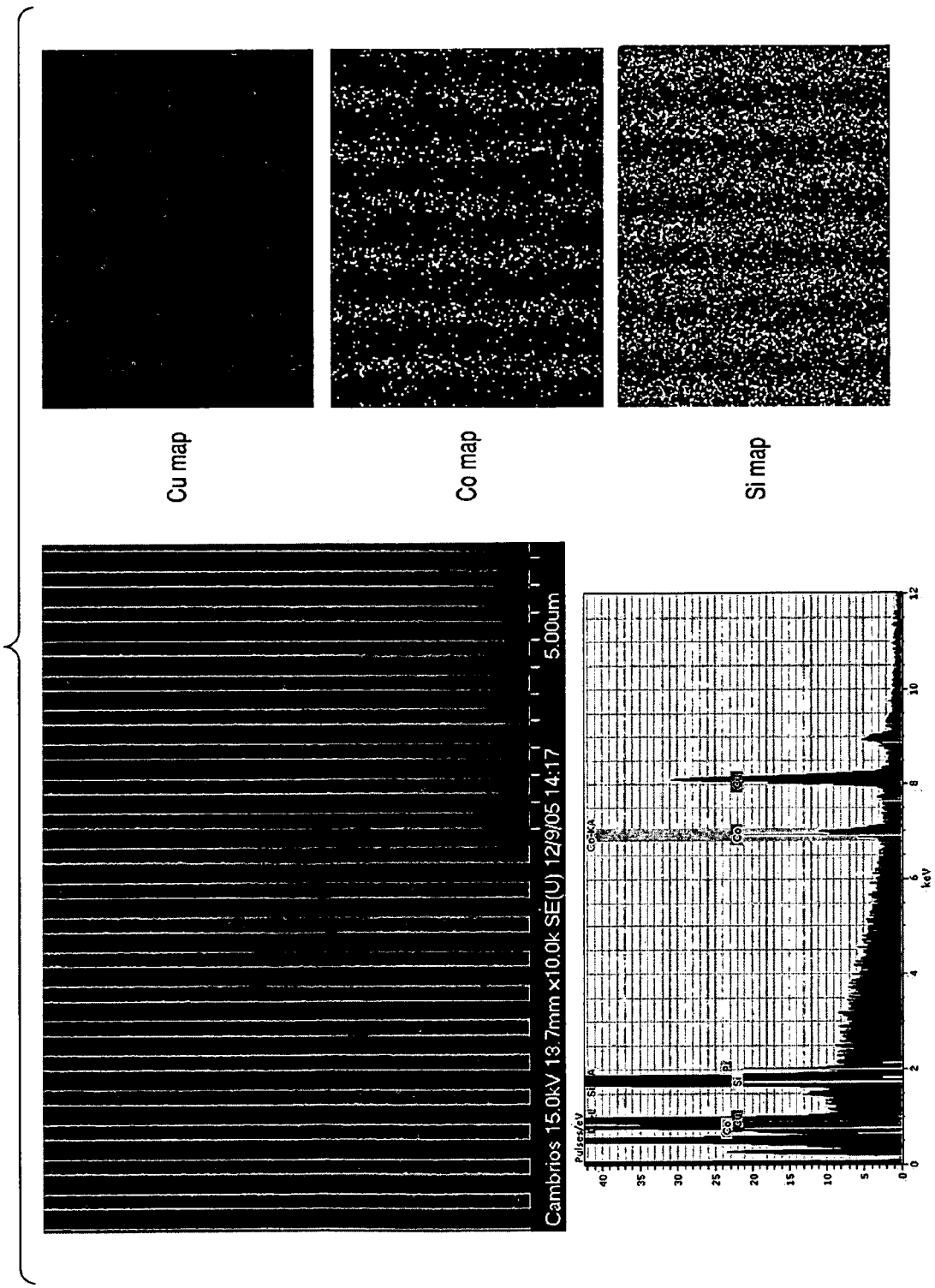
Figure 28G:
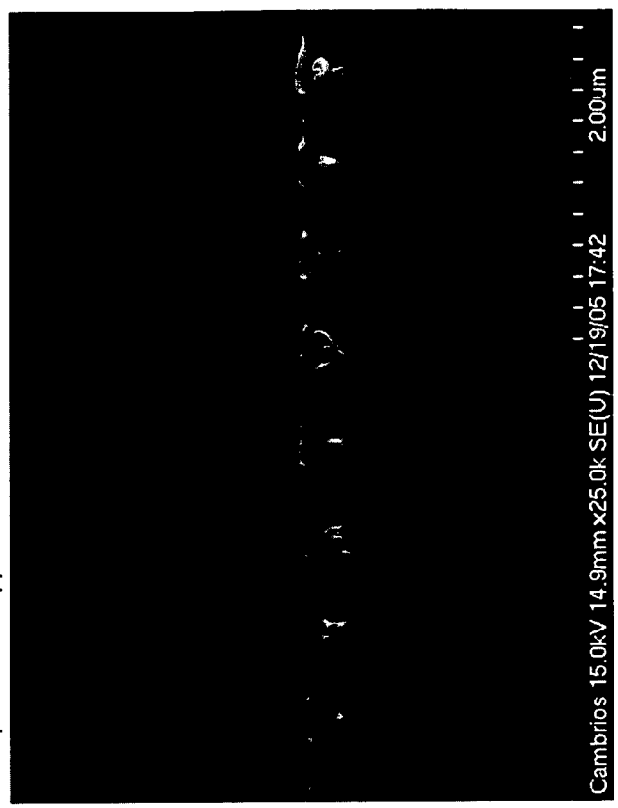
Figure 28F:

FIG. 28E illustrates CoP plating on cysteine and Pd sensitized copper lines. Specifically, CoP is plated on 300 nm copper pattern sensitized with 1 minute cysteine incubation and 1 minute, 5 ppm $PdCl_2$ activation. The upper left micrograph in FIG. 28E shows the CoP deposition while the lower EDX spectra shows a Co peak consistent with CoP plating. The Cu, Co and Si maps on the right side of FIG. 28E show that Co is selectively deposited over the Cu lines but not over Si substrate regions exposed between the Cu lines. FIG. 28F shows a micrograph of a cross sectional view of a diced Cu pattern. FIG. 28G shows a micrograph of a cross sectional view of the cysteine/Pd sensitized Cu pattern containing a selectively plated CoP cap. The CoP cap is about 100 nm thick and is plated in about 1 minute.

Example 9

Using a Protein Biological Agent to Form a Cap Layer

Figure 29:
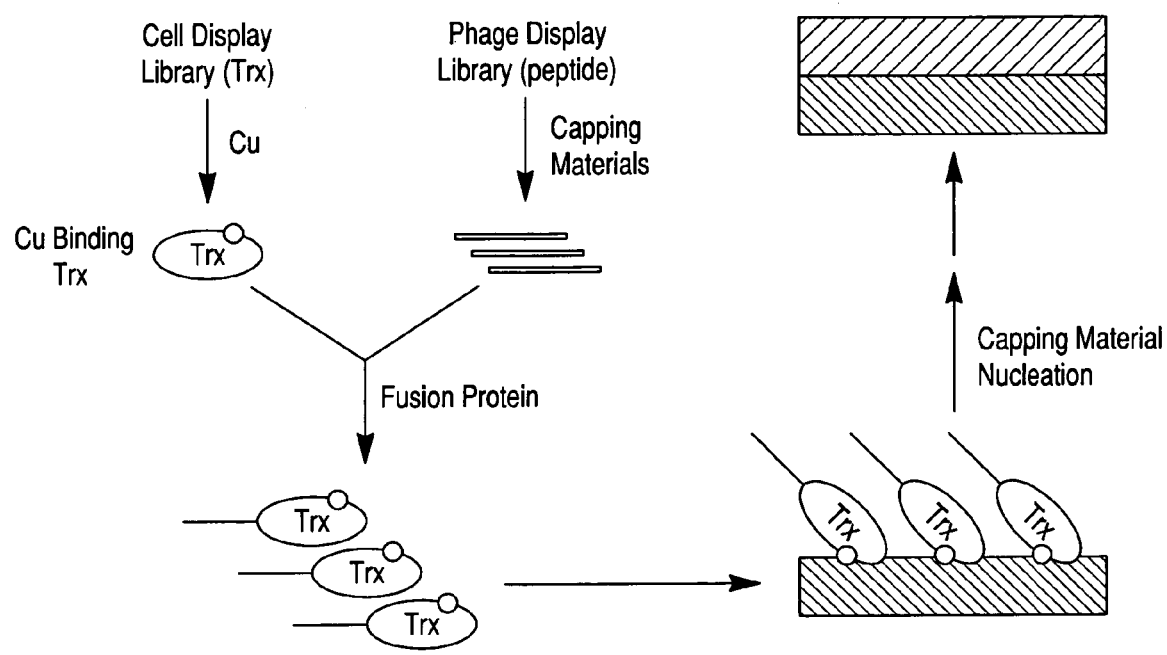
FIGS. 29-31b illustrate various aspects of the ninth example of the invention.

In example 9, a bifunctional protein biological agent is used in selective deposition of the cap layer over an underlying metal layer. For example, a fusion protein with thioredoxin ("Trx") as the scaffold may be used, as illustrated in FIG. 29. Two variable binding regions may be added into this scaffold, as shown on the left side of FIG. 29. The first region is a selective binding region for copper and its alloys (CuAl, CuSi, CuAlSi, etc.). The second region is a selective binding region for cobalt and its alloys (CoWB, CoWP, CoPt, CoPd, etc.). FIG. 29 also shows the use of cell display and phage display libraries to develop the copper and cobalt binding regions. The right side of FIG. 29 shows that the fusion protein is selectively deposited on copper metallization, such as a copper interconnect or electrode, and the cap layer material is then selectively plated onto the protein with the assistance of a sensitizer agent, such as Co, CoPt or Pd nanoparticles, for example.

The copper binding region may be a binding loop consisting of 14 amino acids. The variable part is the 12 central amino acids. The sequences for this region are shown in the table I below.

TABLE I (SEQ ID NOS: 5-13, respectively, in order of appearance)

| Clone # | Sequence |
|---|---|
| 7 | CRDQAGLKVSGAPC |
| 11 | CHAGNSYDDAERHC |

TABLE I-continued (SEQ ID NOS: 5-13, respectively, in order of appearance)

| Clone # | Sequence |
|---|---|
| 13 | CRRSEELGAICSSC |
| 14 | CKIETSSPNHAPAC |
| 23 | CRDFCVRKPGIEDC |
| 32 | CTDVAGASEAATNC |
| 35 | CGFGHPFEAEGSSC |
| 40 | CGVASNTTVSMGRC |
| 22 | CEGGVVWQWEGIVC |

The cobalt binding region sequences shown in the table II below can be either loop or linear sequences and be inserted at the end terminus of the fusion protein.

TABLE II (SEQ ID NOS: 14-39, respectively, in order of appearance)

| Sequence |
|---|
| SDPKPHSSPYFG |
| FDSEKHPTFRTR |
| YQHPTTAHQLPI |
| IQPNAAHAQAVR |
| SHQTSNYKPIVL |
| NSRHPDYDAVSM |
| SVSVGMKPSPRP |
| NYSAYTPRQALV |
| AAMHQHWQRSLL |
| CTQLSKHQC |
| CPNTKTNHC |
| CHENSPREC |
| CLSVPGRAC |
| CMKSQLTLC |
| CFPHLKGYC |
| CPNHSSSKC |
| CLPITTKTC |
| CTQNKTRDC |
| CKQPMYNTC |
| CTPKNTHTC |
| CNTSMHPLC |
| CGIQGKHRC |
| ACNAGDHANCGGGS-amide |
| KLHSSPHTPLVQGGGS-amide |

TABLE II-continued (SEQ ID NOS: 14-39, respectively, in order of appearance)

Sequence

HYPTLPLGSSTYGGGS-amide

AEPGHDAVP-amide

The first 22 sequences were discovered using phage display techniques and the last 4 sequences are from prior discoveries or from the literature. The bifunctional protein may have any combination of the copper and cobalt binding sites shown in the tables above. Furthermore, scaffolds other than thioredoxin may be used.

Figure 30A:
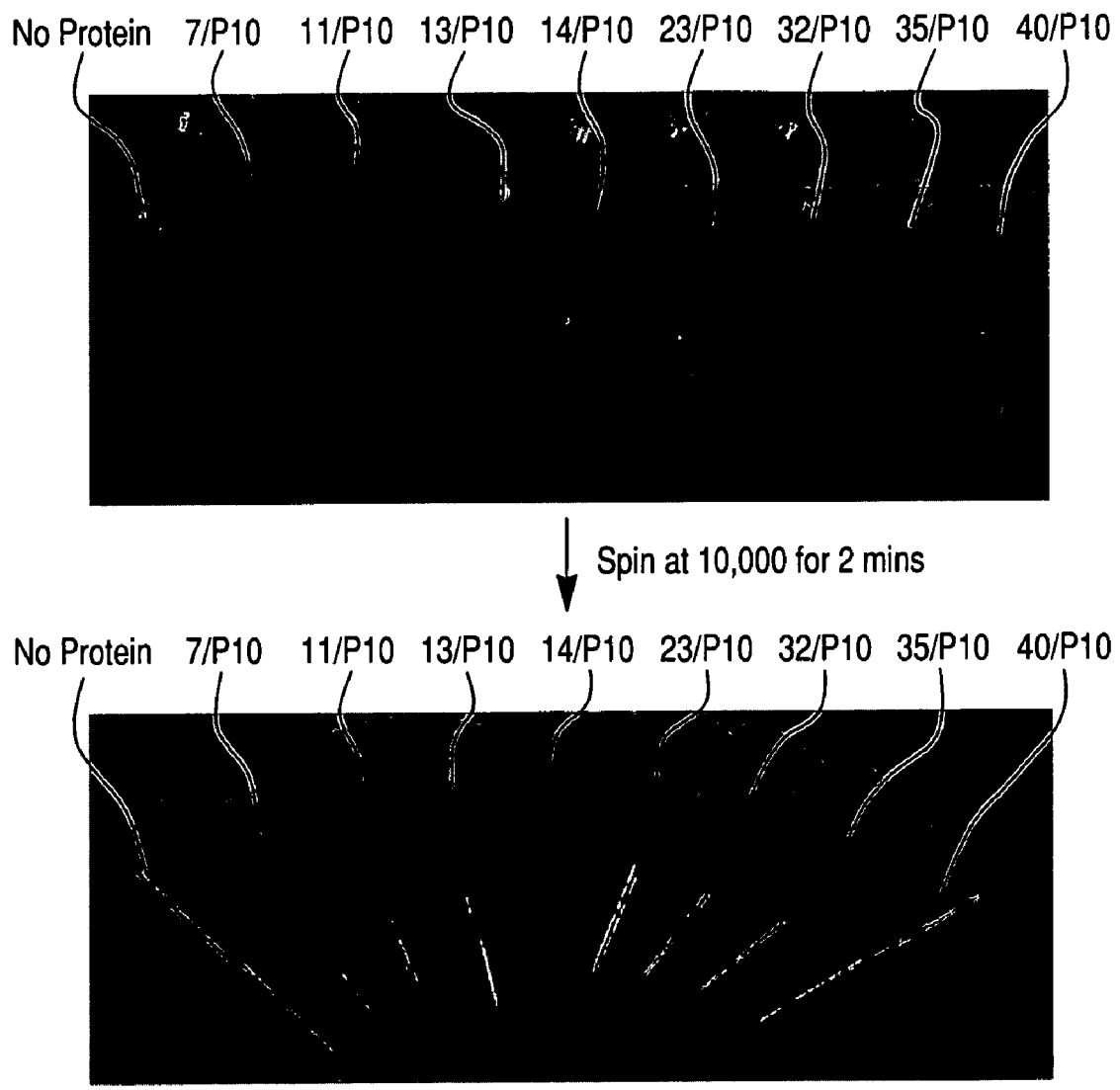
Figure 30B:
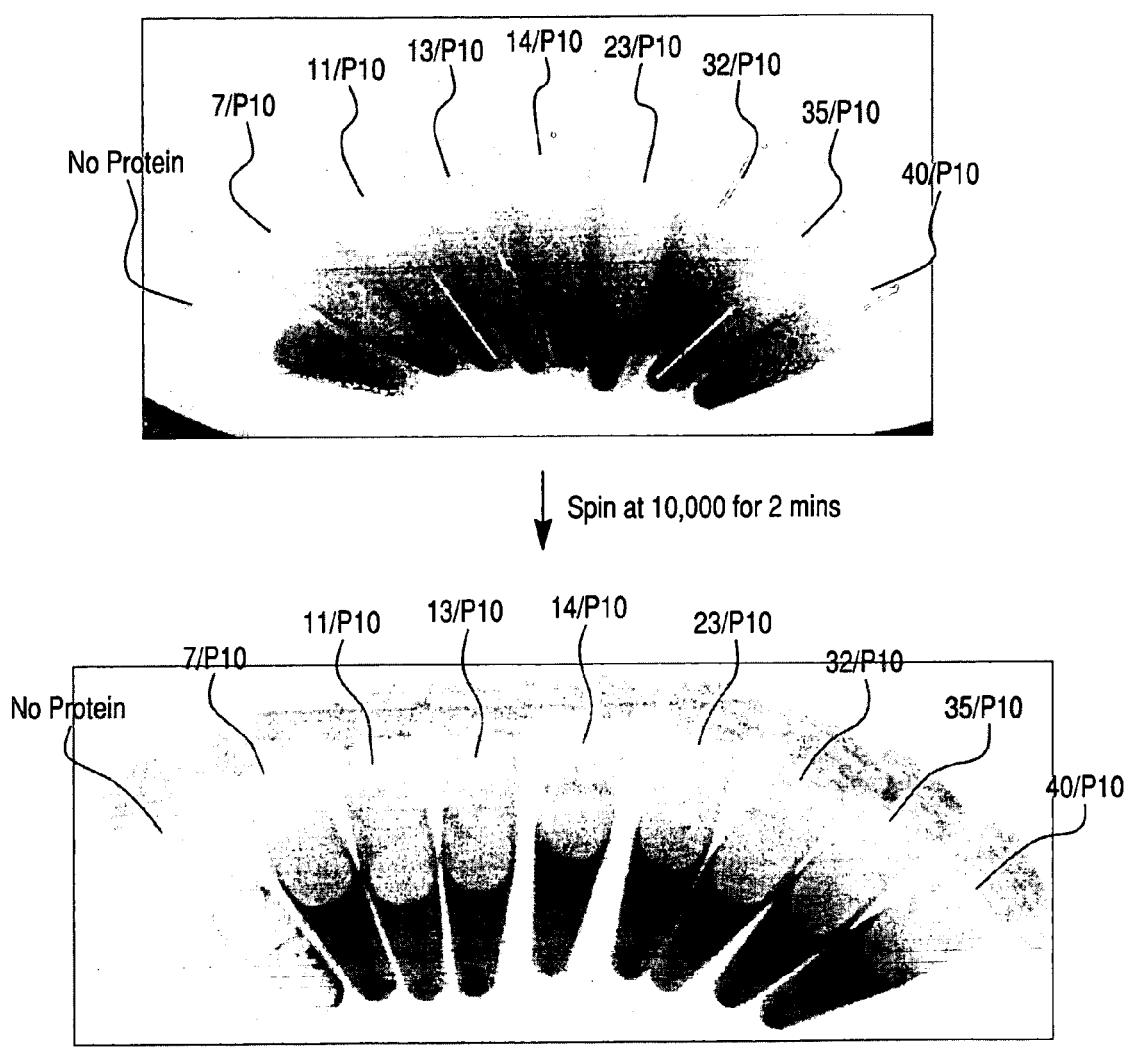

FIGS. 30A and 30B show photographs of nine 1 mL eppendorf tubes to illustrate how the bifunctional proteins selectively stabilize cobalt (FIG. 30A) and a cobalt alloy (CoPt, FIG. 30B) nanoparticles. These nanoparticles can be used as the seed for selective metal plating, such as CoWB or CoWP cap layer plating for example. The left most tube in both Figures contained no bifunctional protein. The other eight tubes contained one of the Trx bifunctional proteins. Each of the eight tubes is labeled X/P10, where the number X represents the clone number of one of the copper binding sequences in table I above, and P10 represents the HYPTLPLGSSTYGGGS-amide (SEQ ID NO: 38) cobalt binding sequence from table II above. Thus, the 7/P10 protein in tube number two represents the CRDQAGLKVSGAPC-thioredoxin-HYPTLPLGSSTYGGGS-amide bifunctional protein (SEQ ID NOS: 5 and 38, respectively).

As shown in the Figures, when the protein is not added to Co and CoPt nanoparticles (tube #1), Co and CoPt nanoparticles precipitate after centrifuging at 10,000 rpm for 2 minutes (clear solution is visible in the lower portion of the Figures). When the X/P10 Trx bifunctional proteins are added, Co and CoPt nanoparticles remain in the solution (brown color in tubes #2-#9 in the lower portion of the Figures) after centrifuging at 10,000 rpm for 2 minutes. Thus, the bifunctional proteins can stabilize/nucleate Co and Co alloy nanoparticles which can be used as a seed for subsequent selective cap layer, copper electrode layer and/or barrier layer plating.

The experimental conditions in FIG. 30A (Co nanoparticles) were as follows:
Precursors: 2 mM $CoSO_4$, 3 mM $(NH_4)_3C_6H_5O_7$, pH=9.0
100 μM Protein: X/P10 Trx bifunctional proteins
Reduction: 150 μl of 1M $NaBH_4$ added to 500 μl of the above precursor, 231 mM final concentration of $NaBH_4$.

The experimental conditions in FIG. 30B (CoPt nanoparticles) were as follows:
Precursors: 1 mM Co(acetate)$_2$, 1 mM $K_2PtCl_4$, 100 mM HEPES, pH=7.5
100 μM Protein: X/P10 Trx bifunctional proteins
Reduction: 10 μl of 1M $NaBH_4$ added to 500 μl of above precursors, 20 mM final concentration of $NaBH_4$.

In total, 198 Co—Cu Bifunctional thioredoxin scaffolds were synthesized as bifunctional proteins to use as seed layer initiators.

Figure 31A:
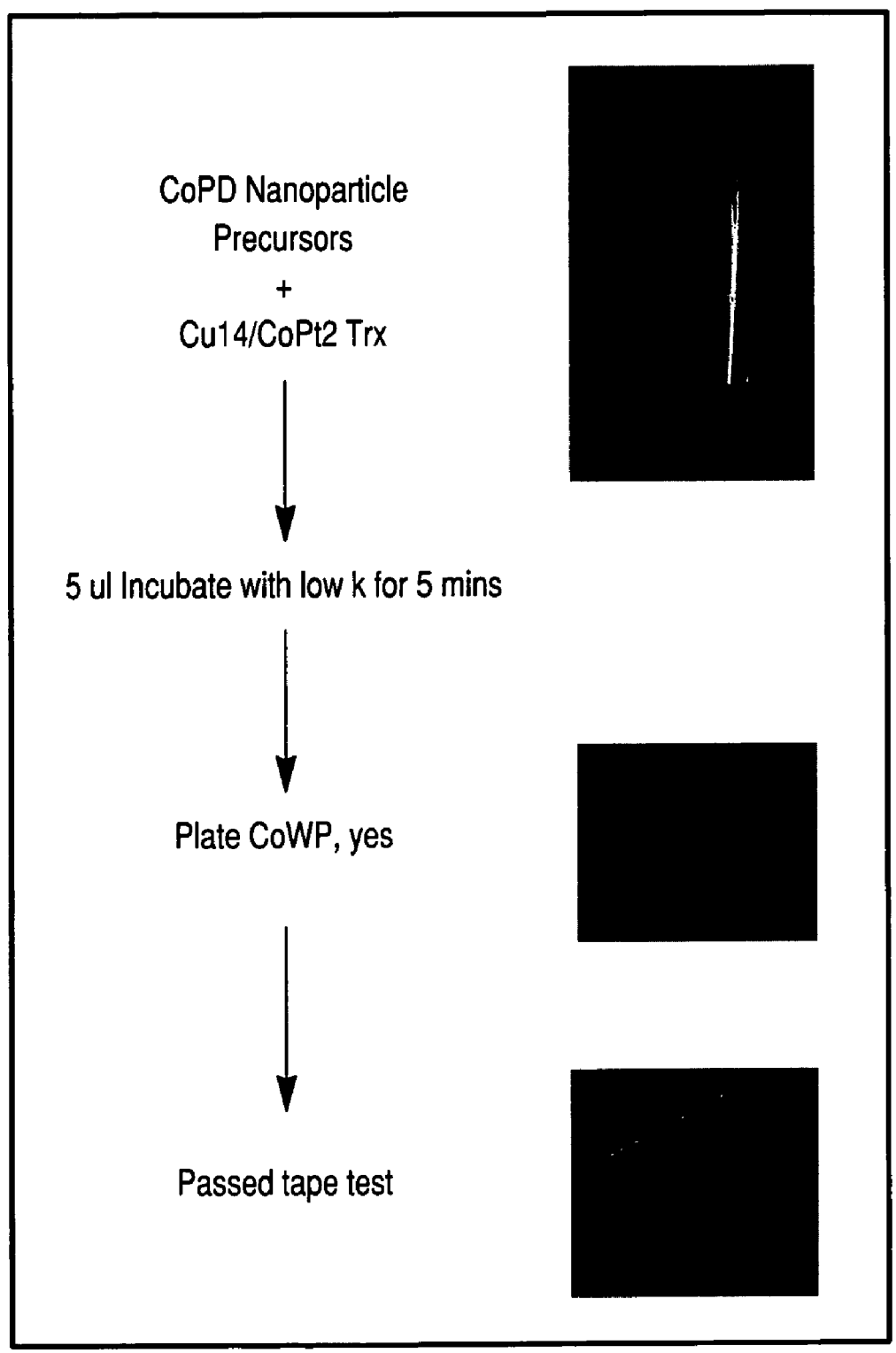
Figure 31B:
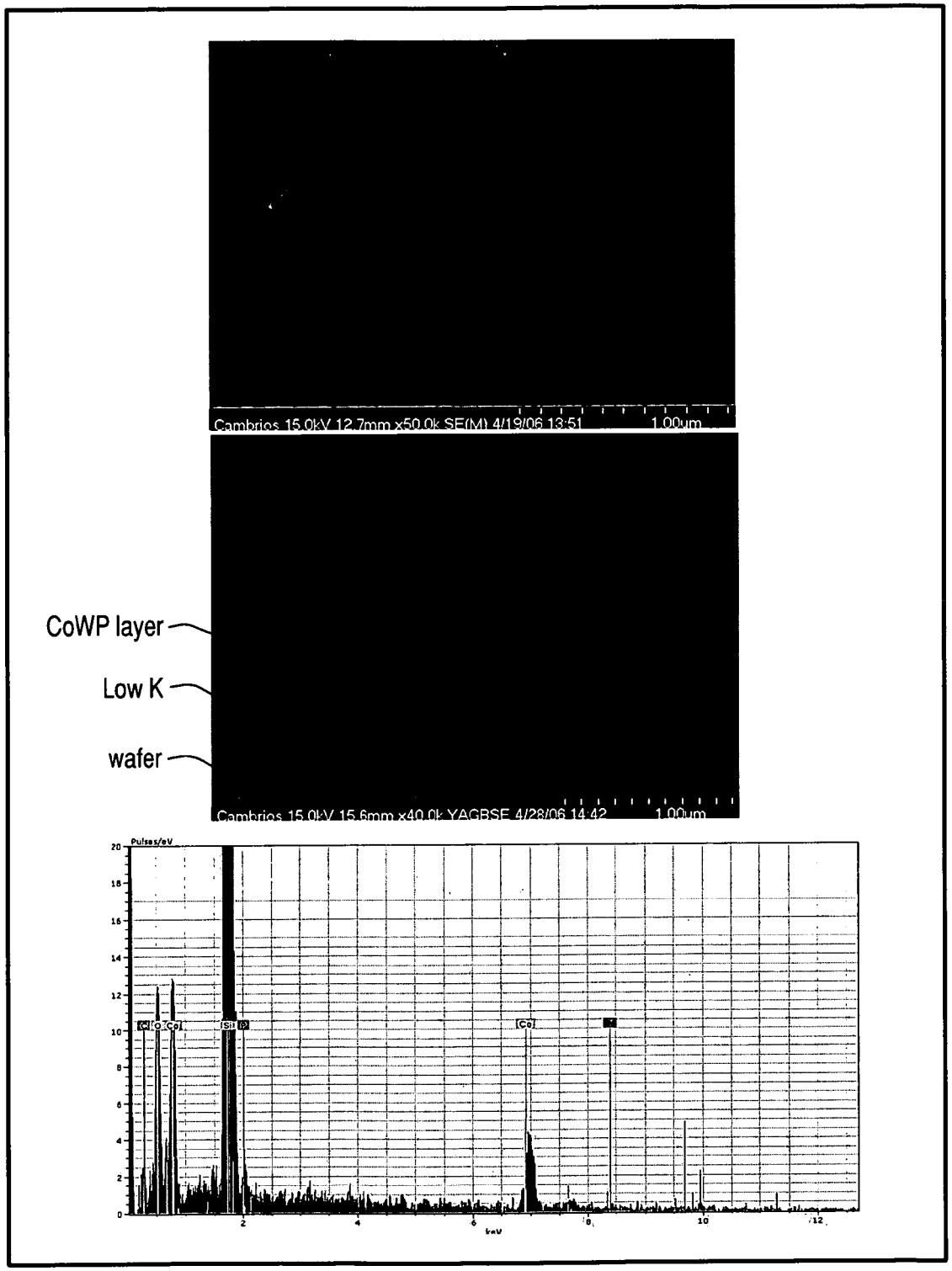

The Cu14/CoPt2 scaffold enables the plating of a Co alloy onto a low-k substrate. As shown in FIG. 31A, 5 μL of the CoPd precursor formulation ($CoSO_4$ 2 mM, 100 μl), $K_2PdCl_4$ (20 mM, 10 μl), Cu14/CoPt2 (1.4 mM, 4 μl), and $NaBH_4$ (1M, 5 μl) were incubated on a low-k substrate for 5 minutes to form the seed layer. The seed layer/substrate was then exposed to a CoWP plating solution, and a CoWP film was formed successfully as shown in FIG. 31B, which illustrates an SEM image of the CoWP film (top), a side cross sectional view of the CoWP film over the low-k dielectric on a wafer (middle) and an EDX spectra of the CoWP film (bottom). This film also passed a standard tape test, as shown in the bottom of FIG. 31A.

Example 10

Combining Cysteine Adsorption Step with Acid Cleaning Step

In example 8, a process was described for seed layer deposition and subsequent plating using a biological molecule, such as the following process:
1. Clean Cu surface
   a. 60 s ultrasonic clean, 1:30 dilution ESC-797, DI rinse
   b. 10 s dip in 2% $H_2SO_4$, DI rinse.
2. Biomolecule adsorption (60 s): incubation with 10 mM cysteine, 0.5 M $H_2SO_4$
3. DI rinse
4. Pd activation (60 s): incubation with 5 ppm $PdCl_2$, 0.5 M $H_2SO_4$
5. DI rinse
6. Plate CoWP (60 s) in plating bath comprising of 0.062 M $Co(OH)_2$, 0.25 M $H_3PO_2$, 0.5 M $Na_3C_6H_5O_7$, 0.4 M $H_3BO_3$, 0.05 M $Na_2WO_4$, and $NH_4OH$ adjusting pH to 9.0~9.5 at 70~75° C.

If desired, step 1b can be eliminated.

Figure 32:
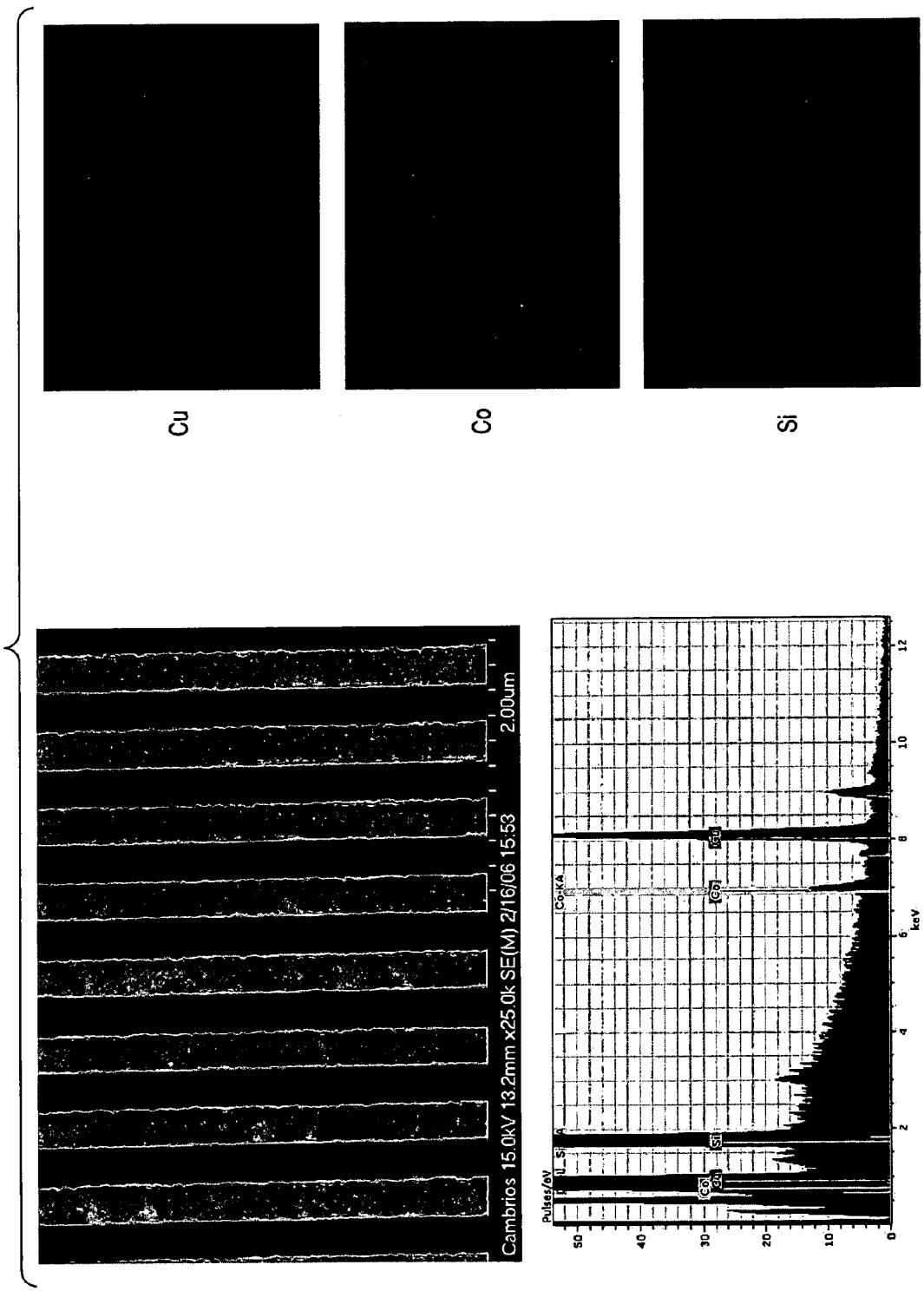
FIG. 32 illustrates various aspects of the tenth example of the invention.

Alternatively, step 1b is eliminated and step 2 is conducted by incubating the substrate for 60 s in 2% $H_2SO_4$ (instead of 0.5M $H_2SO_4$) which contains 10 mM cysteine. It has been demonstrated that the addition of cysteine in the acid cleaning step is beneficial for several reasons. The cleaning step with added cysteine serves the dual purpose of stripping the copper oxide layer while depositing cysteine on the exposed copper, effectively eliminating a process step. In addition, cysteine acts as an effective corrosion inhibitor during the acid cleaning process, limiting the line resistance increase that would occur when using acid alone. The results after the CoWP plating step in this alternative process are shown in FIG. 32, where film formation occurs selectively on the 300 nm Cu lines, not on the low-k spaces. Specifically, FIG. 32 shows the SEM image of the CoWP plating (top left), the Cu, Co and Si maps (right) and an EDX spectra (bottom).

In general, the seed layer solution preferably comprises cysteine and an acidic solution having a pH of about 7 or less, such that the composition enables a selective deposition of a metal ion sensitizer and a subsequent selective plating of a metallic cap layer. The composition preferably contains 1 to 100 mM cysteine.

Preferably, the acidic solution having a pH at or less than about 7.0 is a 0.1 to 5 M $H_2SO_4$ solution. However, other pH 7 or less solutions may also be used, such as nitric ($HNO_3$), hydrochloric (HCl), phosphoric (H3PO4), sulfuric ($H_2SO_4$) or acetic acid ($CH_3COOH$) (or any carboxylic acid derivative) solutions. In general, any chemical species in which a proton is ionized in solution may be used. These acidic solutions may be buffered or unbuffered. Common buffers used to maintain the pH below 7 include (salts or free acids of the following):
Maleate (buffers at pH=2.0);
Phosphate (buffers at pH=2.15);
Citrate (buffers at pH=3.14);
Formate (buffers at pH=3.75);
Succinate (buffers at pH=4.19);

Benzoate (buffers at pH=4.2) or
Acetate (buffers at pH=4.76).

Example 11

Bath Composition Variations

As described above, an alkali free CoWP bath may be used to form the CoWP cap layer. One example of the alkali free bath solution is:

0.062 M $Co(OH)_2$,
0.25 M $H_3PO_2$,
0.5 M $(NH_4)_3C_6H_5O_7$,
0.4 M $H_3BO_3$,
0.03 M $H_2WO_4$,
$NH_4OH$ adjusting pH to 9.0~9.5 at 80~85° C.

Thus, the bath contains $NH^{4+}$ instead of $Na^+$ ions. One hour plating on copper surfaces shows a typical composition of Co(91%)W(2%)P(7%) and a good plating selectivity on a 300 nm copper line.

The typical process for preparing a film with this bath is:
1. Clean Cu surface, cysteine adsorption (10 mM, 30 s-60 s),
2. DI rinse,
3. Pd activation (10 ppm $PdCl_2$, 30-60 s),
4. DI rinse,
5. Plate CoWP (30-60 s),
6. DI rinse,
7. Dry with $N_2$ gas.

Figure 33:
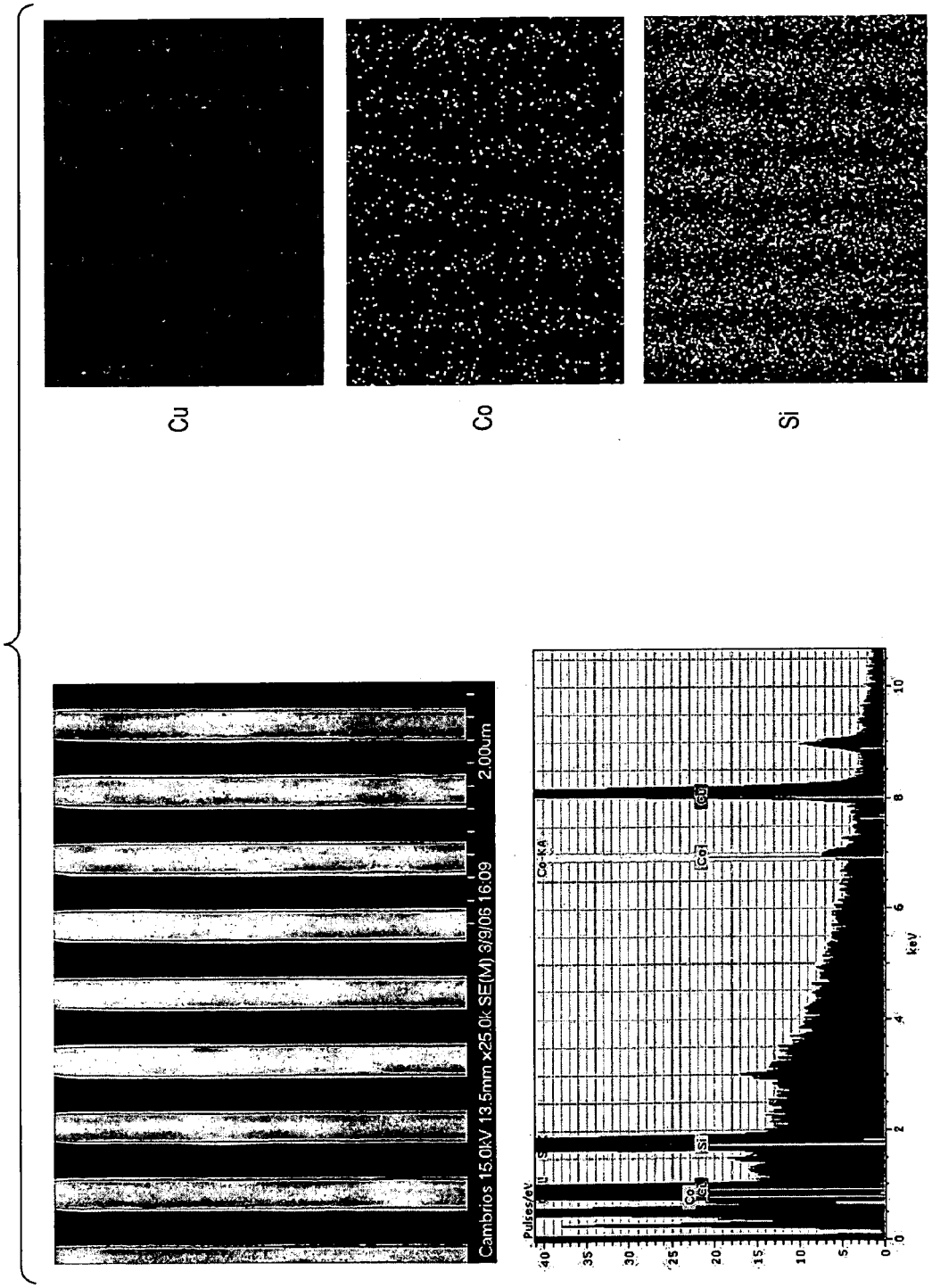
FIG. 33 illustrates various aspects of the eleventh example of the invention.

As seen previously, the cysteine-Pd seed layer selectively bound to 300 nm Cu lines on a Cu and low-k patterned substrate, and as a result, the CoWP plated only on the area where the seed layer was deposited. As shown in FIG. 33 by both SEM (top), mapping (right) and EDX (bottom) spectroscopy, CoWP was not plated on the low-k (Si) lines, but only on the Cu lines, even after extensive plating times of one hour, with a typical composition of Co(91%)W(2%)P(7%).

The foregoing description of the invention has been presented for purposes of illustration and description. It is not intended to be exhaustive or to limit the invention to the precise form disclosed, and modifications and variations are possible in light of the above teachings or may be acquired from practice of the invention. The description was chosen in order to explain the principles of the invention and its practical application. It is intended that the scope of the invention be defined by the claims appended hereto, and their equivalents.

---

What is claimed is:

1. A device, comprising:
   a substrate;
   a seed layer comprising a biological agent residue located on the substrate; and
   a metal layer located on the seed layer,
   wherein at least a portion of the biological agent residue is formed from at least one of peptide, virus, protein, amino acid, nucleic acid, or lipid; and
   wherein:
   the substrate comprises at least one of a trench or via;
   the seed layer is located in the at least one of the trench or via; and
   the metal layer is located at least in the trench;
   wherein the biological agent selectively binds to at least one of the substrate and the metal layer; and
   wherein the metal layer comprises a barrier layer which is located below an interconnect layer.

2. The device of claim 1, wherein the biological agent comprises cysteine.

3. The device of claim 1, wherein the biological agent selectively binds to the metal layer and non-selectively binds to the substrate.

4. A device, comprising:
   a substrate;
   a seed layer comprising a biological agent residue located on the substrate; and
   a metal layer located on the seed layer,
   wherein at least a portion of the biological agent residue is formed from at least one of peptide, virus, protein, amino acid, nucleic acid, or lipid;
   wherein:
   the metal layer comprises a metal layer which is selectively deposited on the seed layer; and
   the biological agent selectively binds to at least one of the substrate and the metal layer;
   wherein:
   the seed layer comprises metal ions or nanoparticles which catalyze selective deposition of the metal layer from a solution; and
   the biological agent residue is located between the substrate and the seed layer; and
   wherein:
   the substrate comprises an interlayer insulating layer containing a via connected to a trench;
   the metal layer comprises at least one of a barrier layer and an interconnect layer located at least in the trench; and
   the seed layer is located between the interlayer insulating layer and the metal layer.

5. The device of claim 4, further comprising at least one semiconductor device located below the interlayer insulating layer.

6. The device of claim 4, wherein the biological agent comprises cysteine.

7. The device of claim 4, wherein the biological agent selectively binds to the metal layer and non-selectively binds to the substrate.

8. The device of claim 4, further comprising:
   an electromigration lifetime enhancing cap layer located on the interconnect; and
   a second seed layer comprising cysteine located between the cap layer and the interconnect.

9. The device of claim 5, further comprising:
   an electromigration lifetime enhancing cap layer located on the interconnect layer; and
   a second seed layer comprising a second biological agent residue located between the cap layer and the interconnect layer.

10. A device, comprising:
    a substrate;
    a seed layer comprising a biological agent residue located on the substrate; and
    a metal layer located on the seed layer,
    wherein at least a portion of the biological agent residue is formed from at least one of peptide, virus, protein, amino acid, nucleic acid, or lipid, wherein the biological agent selectively binds to at least one of the substrate and the metal layer, and wherein the metal layer comprises a bus line of a display device.

11. The device of claim 10, wherein the biological agent comprises cysteine.

12. The device of claim 10, wherein the biological agent selectively binds to the metal layer and non-selectively binds to the substrate.

13. A method of forming a metal layer, comprising:
providing a substrate;
forming a biological agent and a seed layer on the substrate; and
selectively forming a metal layer on the seed layer,
wherein the biological agent comprises at least one of peptide, virus, protein, amino acid, nucleic acid, or lipid, wherein the biological agent selectively binds to at least one of the substrate and the metal layer, and wherein:
the seed layer comprises a layer of metal nanoparticles connected to the substrate by the biological agent;
the biological agent comprises a first binding moiety for selectively binding to the substrate and a second binding moiety for selectively binding to the nanoparticles; and
the seed layer is selectively deposited on predetermined portions of the substrate.

14. The method of claim 13, wherein at least the biological agent is formed through a mask on predetermined portions of the substrate.

15. A method of forming a metal layer, comprising:
providing a substrate;
forming a biological agent and a seed layer on the substrate; and
selectively forming a metal layer on the seed layer,
wherein the biological agent comprises at least one of peptide, virus, protein, amino acid, nucleic acid, or lipid, wherein the biological agent selectively binds to at least one of the substrate and the metal layer, and wherein the biological agent and the seed layer are formed non-selectively over the entire substrate followed by patterning the seed layer.

16. A method of forming a metal layer, comprising:
providing a substrate;
forming a biological agent and a seed layer on the substrate; and
selectively forming a metal layer on the seed layer,
wherein the biological agent comprises at least one of peptide, virus, protein, amino acid, nucleic acid, or lipid, and wherein the biological agent selectively binds to at least one of the substrate and the metal layer; and
forming the seed layer on a first portion of the substrate and forming a contrast agent on a second portion of the substrate such that the metal layer is selectively formed on the seed layer but not on the contrast agent.

17. A method of forming a metal layer, comprising:
providing a substrate;
forming a biological agent and a seed layer on the substrate;
selectively forming a metal layer on the seed layer; and
removing the biological agent before or after the step of selectively depositing the metal layer;
wherein the biological agent comprises at least one of peptide, virus, protein, amino acid, nucleic acid, or lipid, and wherein the biological agent selectively binds to at least one of the substrate and the metal layer.

18. The method of claim 17, wherein at least the biological agent is formed through a mask on predetermined portions of the substrate.

19. A method of forming a metal layer, comprising:
providing a substrate;
forming a biological agent and a seed layer on the substrate; and
selectively forming a metal layer on the seed layer,
wherein the biological agent comprises at least one of peptide, virus, protein, amino acid, nucleic acid, or lipid, wherein the biological agent selectively binds to at least one of the substrate and the metal layer, and wherein the step of selectively depositing the metal layer comprises selectively depositing the metal layer on the seed layer using electroless plating.

20. A method of forming a metal layer, comprising:
providing a substrate;
forming a biological agent and a seed layer on the substrate; and
selectively forming a metal layer on the seed layer,
wherein the biological agent comprises at least one of peptide, virus, protein, amino acid, nucleic acid, or lipid, wherein the biological agent selectively binds to at least one of the substrate and the metal layer, and
wherein:
the substrate comprises an interlayer insulating layer containing a via connected to a trench; and
the metal layer comprises at least one of a barrier layer and an interconnect layer located at least in the trench.

21. The method of claim 20, further comprising:
forming a second biological agent and a second seed layer on the interconnect layer; and
selectively forming an electromigration lifetime enhancing cap layer on the second seed layer.

22. The method of claim 20, wherein the metal layer comprises an interconnect layer for a semiconductor device made by a dual damascene process.

23. A method of forming a metal layer, comprising:
providing a substrate;
forming a biological agent and a seed layer on the substrate; and
selectively forming a metal layer on the seed layer,
wherein the biological agent comprises at least one of peptide, virus, protein, amino acid, nucleic acid, or lipid, wherein the biological agent selectively binds to at least one of the substrate and the metal layer, and wherein the metal layer comprises a bus line for a display device.

24. The method of claim 23, wherein at least the biological agent is formed through a mask on predetermined portions of the substrate.

25. A method of forming a metal layer, comprising:
providing a substrate;
forming a biological agent and a seed layer on the substrate; and
selectively forming a metal layer on the seed layer,
wherein the biological agent comprises at least one of peptide, virus, protein, amino acid, nucleic acid, or lipid, wherein the biological agent selectively binds to at least one of the substrate and the metal layer, and, wherein the step of forming the biological agent and the seed layer comprises forming a plurality of proteins bound to metal nanoparticles or to metal ions.

26. A method of forming a metal layer, comprising:
providing a substrate;
forming a biological agent and a seed layer on the substrate; and
selectively forming a metal layer on the seed layer,
wherein the biological agent comprises at least one of peptide, virus, protein, amino acid, nucleic acid, or lipid, wherein the biological agent selectively binds to at least one of the substrate and the metal layer, and wherein the step of forming the biological agent and the seed layer comprises forming a plurality of amino acids bound to metal nanoparticles or to metal ions.

27. A method of forming a metal layer, comprising:

providing a substrate;

forming a biological agent and a seed layer on the substrate; and selectively forming a metal layer on the seed layer, wherein the biological agent comprises at least one of peptide, virus, protein, amino acid, nucleic acid, or lipid, wherein the biological agent selectively binds to at least one of the substrate and the metal layer, and wherein the step of forming the biological agent and the seed layer comprises forming a plurality of peptides bound to metal nanoparticles or to metal ions.

28. A method of forming a metal layer, comprising:

providing a substrate;

forming a biological agent and a seed layer on the substrate; and selectively forming a metal layer on the seed layer, wherein the biological agent comprises at least one of peptide, virus, protein, amino acid, nucleic acid, or lipid, wherein the biological agent selectively binds to at least one of the substrate and the metal layer, and wherein the step of forming the biological agent and the seed layer comprises first binding the biological agent to metal nanoparticles followed by binding the biological agent and the nanoparticles to the substrate.

29. A method of forming a metal layer, comprising:

providing a substrate;

forming a biological agent and a seed layer on the substrate; and selectively forming a metal layer on the seed layer, wherein the biological agent comprises at least one of peptide, virus, protein, amino acid, nucleic acid, or lipid, wherein the biological agent selectively binds to at least one of the substrate and the metal layer, and wherein the step of forming the biological agent and the seed layer comprises first binding the biological agent to the substrate followed by either selectively forming metal ions or metal nanoparticles on the biological agent from a solution or binding pre-formed metal nanoparticles to the biological agent.

30. A method of forming a metal layer, comprising:

providing a substrate;

forming a biological agent and a seed layer on the substrate; and selectively forming a metal layer on the seed layer, wherein the biological agent comprises at least one of peptide, virus, protein, amino acid, nucleic acid, or lipid and wherein:

the step of providing a substrate comprises providing a substrate comprising a semiconductor device and a copper interconnect exposed in an interlayer insulating layer;

the step of forming a biological agent and a seed layer on the substrate comprises selectively forming a cysteine biological agent on the copper interconnect and selectively forming a metal nanoparticle seed layer on the biological agent; and the step of selectively forming a metal layer on the seed layer comprises selectively plating a CoWB or CoWP layer on the seed layer.

31. A device, comprising:

a substrate;

a seed layer comprising a biological agent residue located on the substrate; and a metal layer located on the seed layer, wherein the biological agent selectively binds to at least one of the substrate and the metal layer; and wherein the metal layer comprises a bus line of a display device.

32. The device of claim 31, wherein the biological agent comprises cysteine.

33. The device of claim 31, wherein the biological agent selectively binds to the metal layer and non-selectively binds to the substrate.

34. A method of forming a metal layer, comprising:

providing a substrate;

forming a biological agent and a seed layer on the substrate; and selectively forming a metal layer on the seed layer, wherein the biological agent comprises cysteine selectively bound to the substrate and to the seed layer.

\* \* \* \* \*